(12) United States Patent
Yamazaki et al.

(10) Patent No.: US 12,136,674 B2
(45) Date of Patent: Nov. 5, 2024

(54) SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Toshimitsu Obonai, Tochigi (JP); Junichi Koezuka, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 417 days.

(21) Appl. No.: 17/433,728

(22) PCT Filed: Feb. 17, 2020

(86) PCT No.: PCT/IB2020/051294
§ 371 (c)(1),
(2) Date: Aug. 25, 2021

(87) PCT Pub. No.: WO2020/178651
PCT Pub. Date: Sep. 10, 2020

(65) Prior Publication Data
US 2022/0140144 A1    May 5, 2022

(30) Foreign Application Priority Data

Mar. 1, 2019    (JP) .................... 2019-037921

(51) Int. Cl.
*H01L 29/786*    (2006.01)
(52) U.S. Cl.
CPC .... *H01L 29/7869* (2013.01); *H01L 29/78696* (2013.01)
(58) Field of Classification Search
CPC ................ H01L 29/7869; H01L 29/78696
See application file for complete search history.

(56) References Cited

U.S. PATENT DOCUMENTS 9,406,760 B2    8/2016 Shimomura et al.
9,559,174 B2 *    1/2017 Shimomura ........ H01L 27/1225
(Continued)

FOREIGN PATENT DOCUMENTS

CN    104867981 A    8/2015
JP    2014-007399 A    1/2014
(Continued)

OTHER PUBLICATIONS

International Search Report (Application No. PCT/IB2020/051294) Dated May 26, 2020.

(Continued)

*Primary Examiner* — Eugene Lee
(74) *Attorney, Agent, or Firm* — NIXON PEABODY LLP; Jeffrey L. Costellia

(57) ABSTRACT

A semiconductor device with favorable electrical characteristics is provided. A semiconductor device with stable electrical characteristics is provided. A highly reliable display device is provided. The semiconductor device includes a first conductive layer, a first insulating layer, a semiconductor layer, and a pair of second conductive layers. The first insulating layer is in contact with a top surface of the first conductive layer. The semiconductor layer is in contact with a top surface of the first insulating layer. The pair of second conductive layers are in contact with a top surface of the semiconductor layer. The pair of second conductive layers are apart from each other in a region overlapping with the first conductive layer. The semiconductor layer contains indium and oxygen and has a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight line in a ternary diagram showing atomic ratios of (Continued)

indium to an element M and zinc. In addition, the element M is one or more of gallium, aluminum, yttrium, and tin.

11 Claims, 36 Drawing Sheets

(56) References Cited

U.S. PATENT DOCUMENTS

| | | | |
|---|---|---|---|
| 10,032,928 B2 | 7/2018 | Shimomura et al. | |
| 10,043,659 B2 | 8/2018 | Yamazaki et al. | |
| 10,692,452 B2 | 6/2020 | Kobayashi et al. | |
| 2010/0295042 A1* | 11/2010 | Yano | H01L 29/7869 257/E21.409 |
| 2011/0090204 A1* | 4/2011 | Yamazaki | G09G 3/3611 345/87 |
| 2015/0243738 A1 | 8/2015 | Shimomura et al. | |
| 2015/0318359 A1* | 11/2015 | Shimomura | H01B 1/08 257/43 |
| 2016/0190346 A1* | 6/2016 | Kawata | H01J 37/3447 257/43 |
| 2016/0197193 A1* | 7/2016 | Shimomura | H01L 29/045 257/43 |
| 2017/0005203 A1* | 1/2017 | Endo | H01L 29/78696 |
| 2017/0040424 A1* | 2/2017 | Tanaka | H01L 29/78696 |
| 2017/0270882 A1* | 9/2017 | Mori | G06F 3/0412 |
| 2017/0338107 A1 | 11/2017 | Yamazaki et al. | |
| 2017/0350002 A1* | 12/2017 | Yamazaki | C01G 19/02 |
| 2018/0013005 A1* | 1/2018 | Yamazaki | H01L 29/78648 |
| 2018/0204532 A1 | 7/2018 | Kobayashi et al. | |
| 2021/0065640 A1 | 3/2021 | Kobayashi et al. | |

FOREIGN PATENT DOCUMENTS

| | | | |
|---|---|---|---|
| JP | 2016-189479 A | 11/2016 |
| JP | 2017-212442 A | 11/2017 |
| JP | 2018-116274 A | 7/2018 |
| KR | 2015-0099467 A | 8/2015 |

OTHER PUBLICATIONS

Written Opinion (Application No. PCT/IB2020/051294) Dated May 26, 2020.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

* cited by examiner

FIG. 5A
| Amorphous | Crystalline | Crystal |
|---|---|---|
| completely amorphous | ·CAAC<br>·nc<br>·CAC<br><br>excluding single crystal and poly crystal | ·single crystal<br>·poly crystal |
FIG. 5B
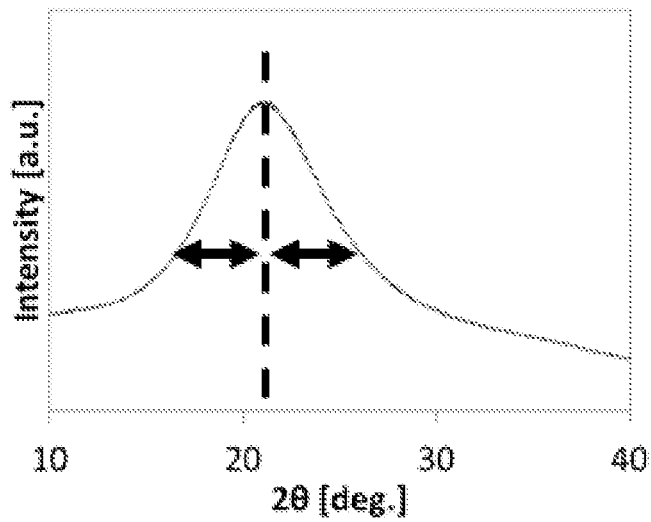
FIG. 5C
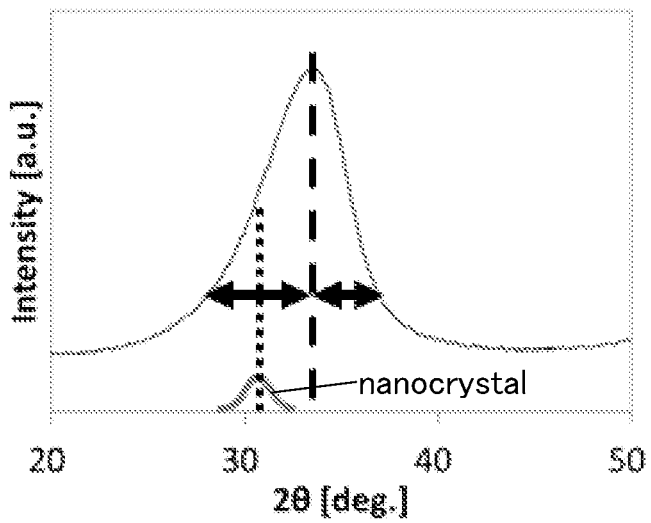

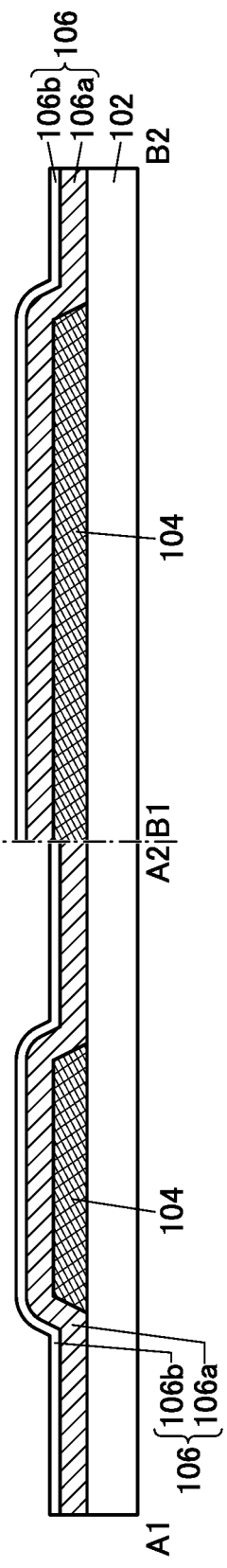
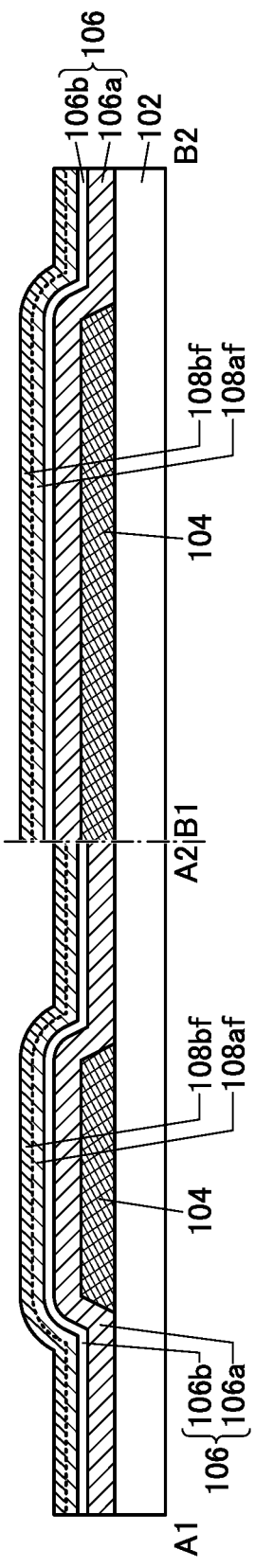
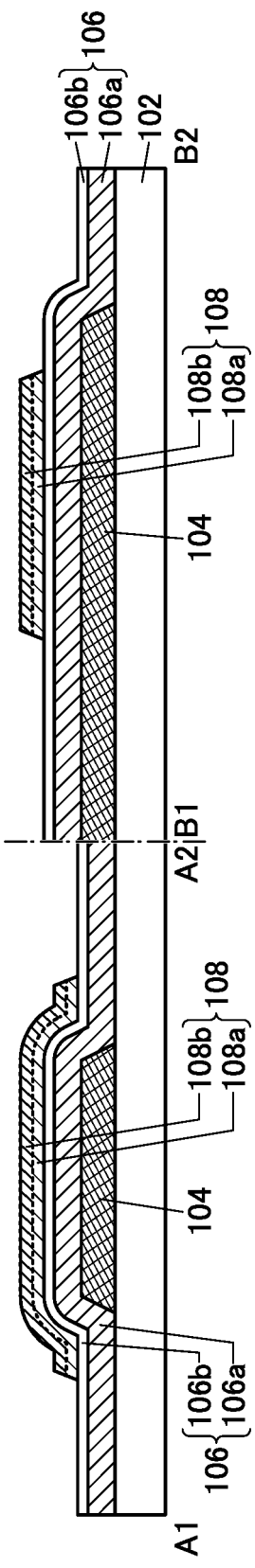

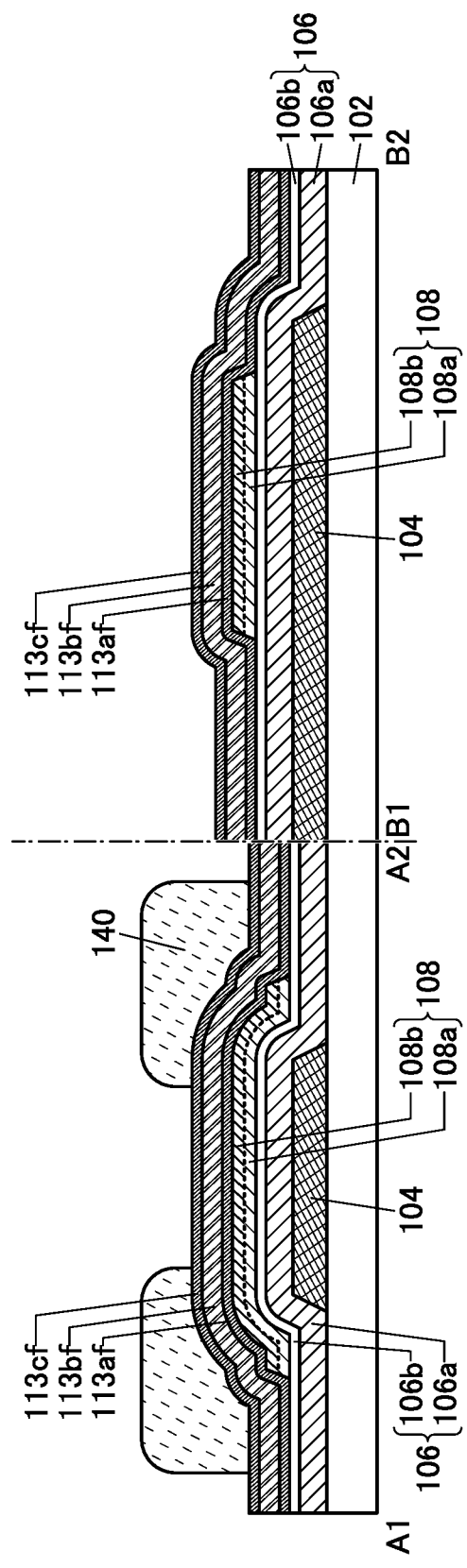
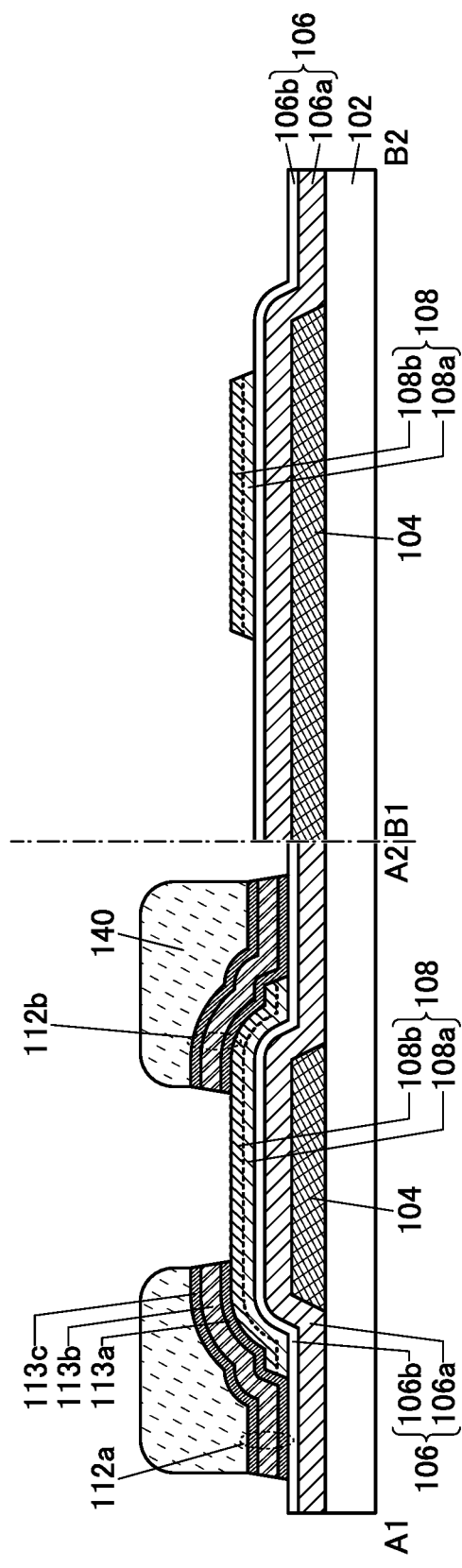

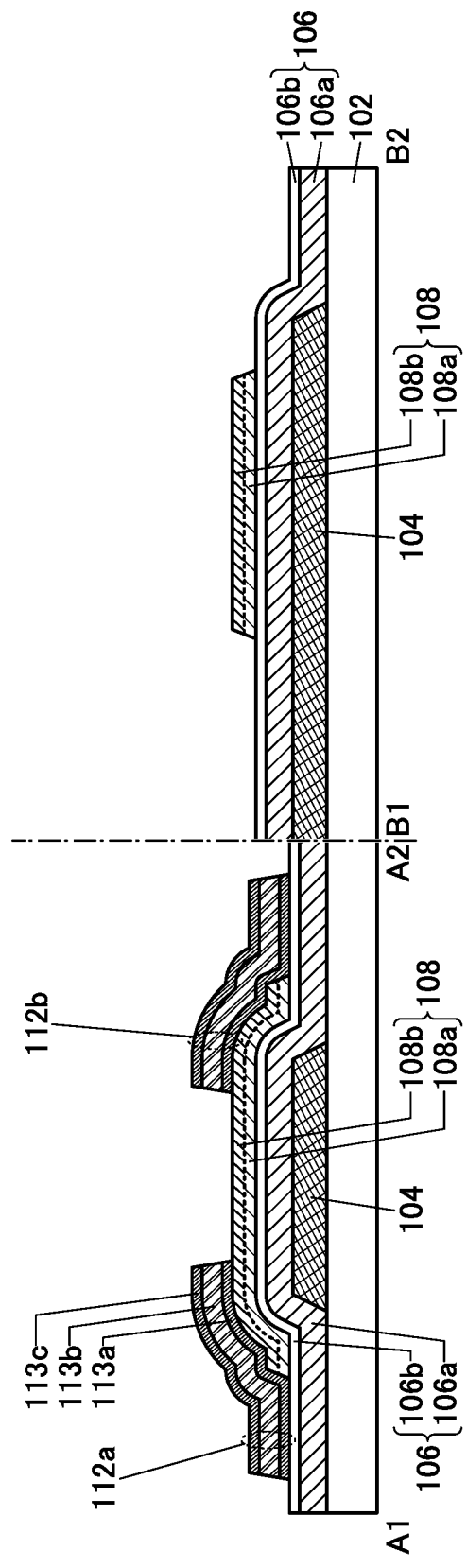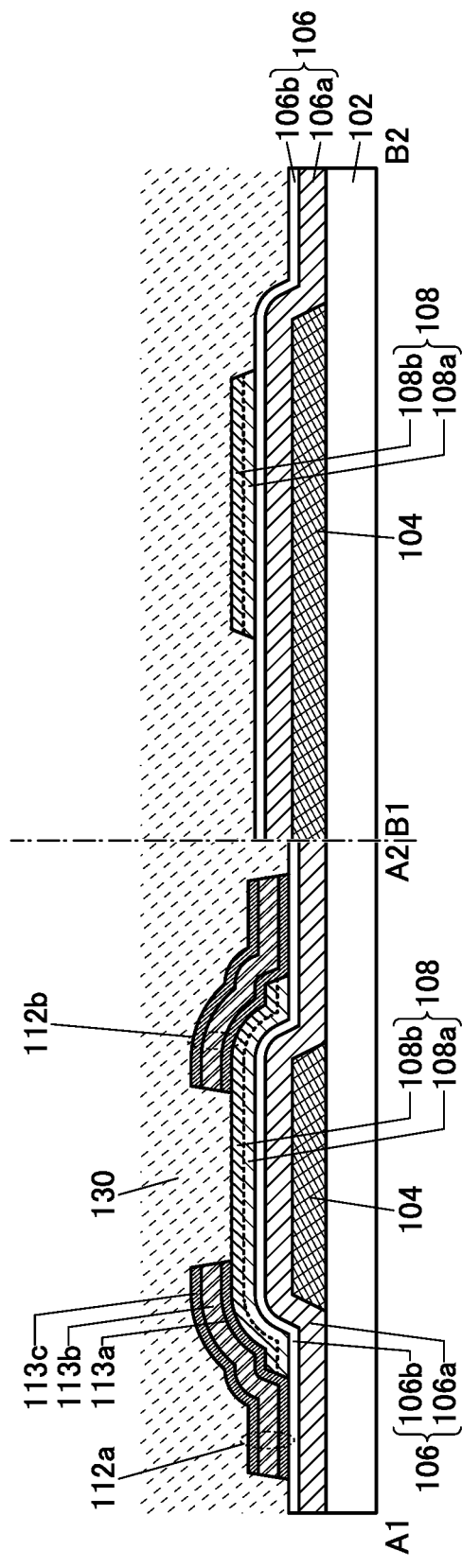

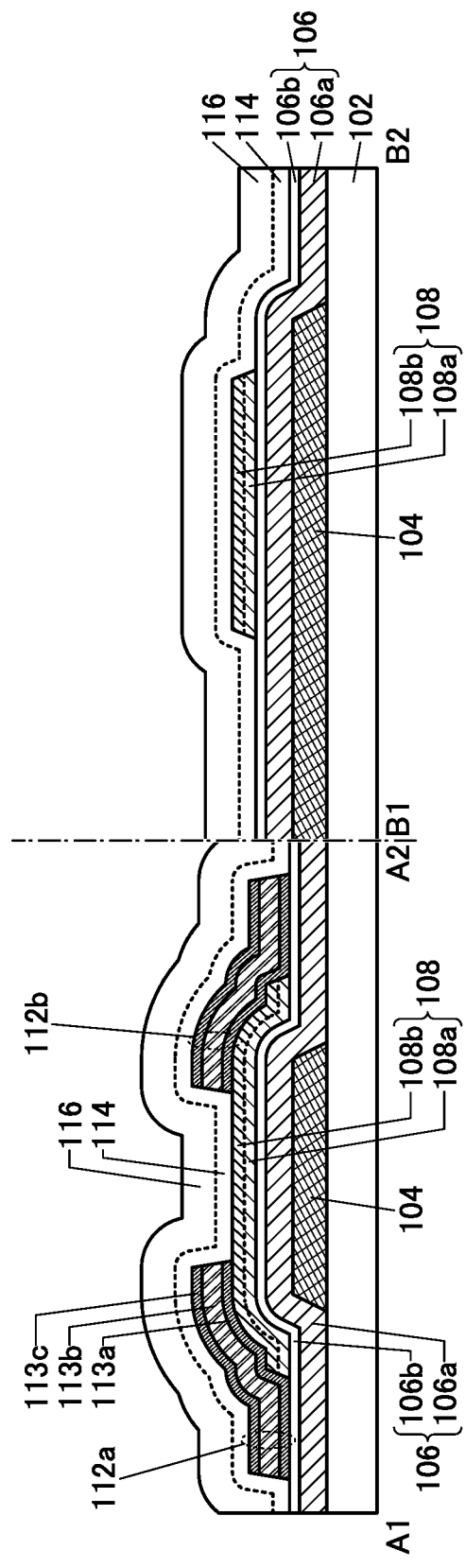
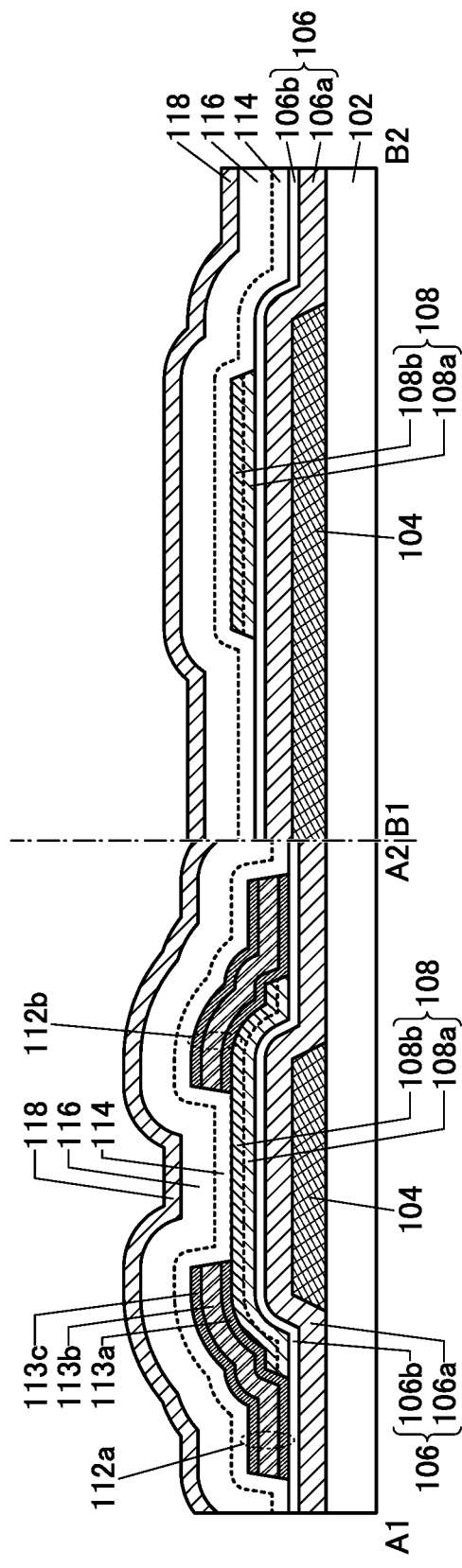
FIG. 16A
FIG. 16B

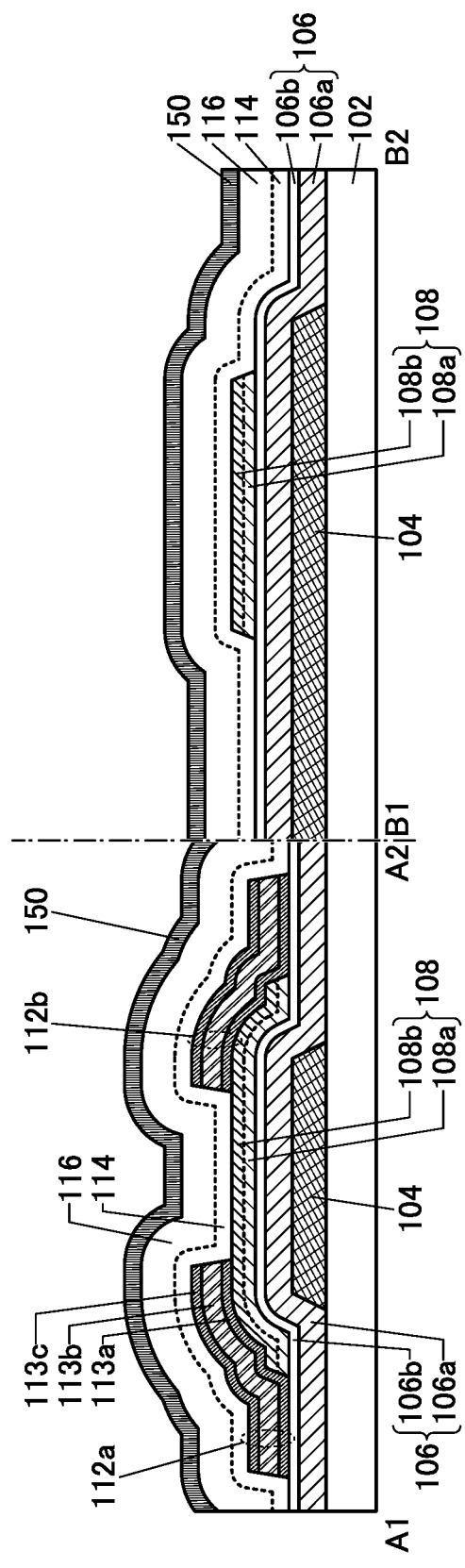
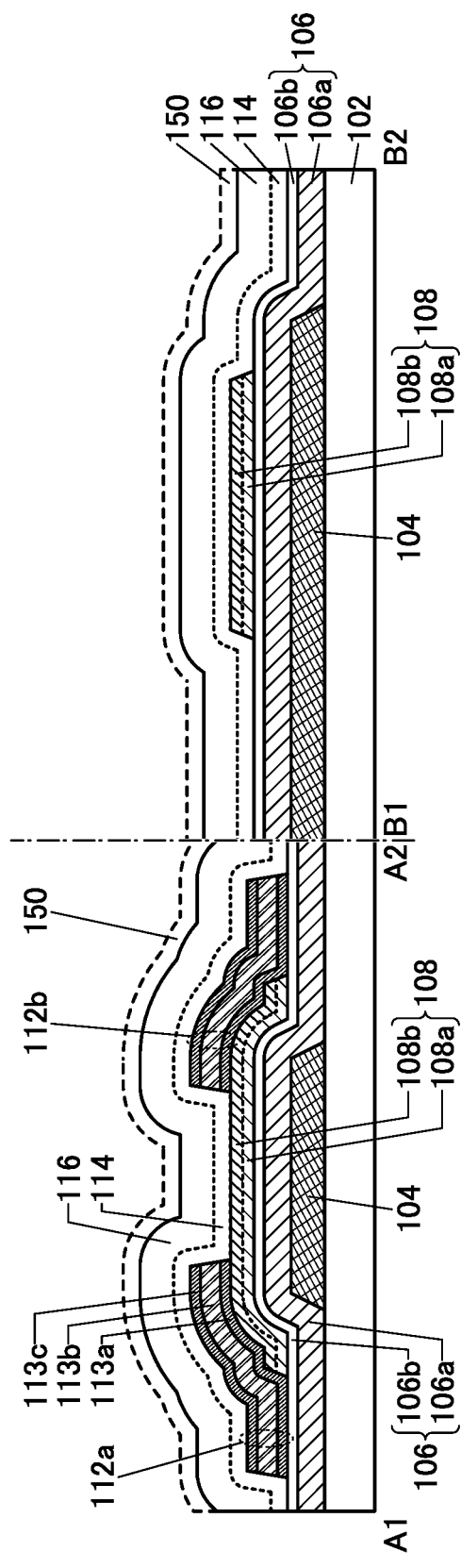

SEMICONDUCTOR DEVICE

TECHNICAL FIELD

One embodiment of the present invention relates to a semiconductor device and a fabrication method thereof. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a fabrication method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device in which the field-effect mobility (simply referred to as mobility or µFE in some cases) is increased by stacking a plurality of oxide semiconductor layers, containing indium and gallium in an oxide semiconductor layer serving as a channel in the plurality of oxide semiconductor layers, and making the proportion of indium higher than the proportion of gallium.

Non-Patent Document 1 and Non-Patent Document 2 disclose an oxide semiconductor material of $InGaO_3(ZnO)m$ (m: natural number).

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

REFERENCE

Patent Document

[Patent Document 1] Japanese Published Patent Application No. 2014-7399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", J. Solid State Chem., Vol. 93, 1991, pp. 298-315. [Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," J. Solid State Chem., 1995, Vol. 116, pp. 170-178.

SUMMARY OF THE INVENTION

Problems to be Solved by the Invention

An object of one embodiment of the present invention is to provide a semiconductor device having favorable electrical characteristics. An object of one embodiment of the present invention is to provide a highly reliable semiconductor device. An object of one embodiment of the present invention is to provide a semiconductor device having stable electrical characteristics. An object of one embodiment of the present invention is to provide a highly reliable display device.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including a first conductive layer, a first insulating layer, a semiconductor layer, and a pair of second conductive layers. The first insulating layer is in contact with a top surface of the first conductive layer. The semiconductor layer is in contact with a top surface of the first insulating layer. The pair of second conductive layers are in contact with a top surface of the semiconductor layer. The pair of second conductive layers are apart from each other in a region overlapping with the first conductive layer. The semiconductor layer contains indium and oxygen and has a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight line in a ternary diagram showing atomic ratios of indium to an element M and zinc. In addition, the element M is one or more of gallium, aluminum, yttrium, and tin.

One embodiment of the present invention is a semiconductor device including a first conductive layer, a first insulating layer, a semiconductor layer, and a pair of second conductive layers. The first insulating layer is in contact with a top surface of the first conductive layer. The semiconductor layer is in contact with a top surface of the first insulating layer. The pair of second conductive layers are in contact with a top surface of the semiconductor layer. The pair of second conductive layers are apart from each other in a region overlapping with the first conductive layer. The semiconductor layer contains indium and oxygen and has a composition falling within a range obtained by connecting first coordinates (7:1:0), second coordinates (2:1:0), third coordinates (14:7:1), fourth coordinates (7:2:2), fifth coordinates (14:4:21), sixth coordinates (2:0:3), seventh coordinates (7:0:1), and the first coordinates in this order with a straight line in a ternary diagram showing atomic ratios of indium to an element M and zinc. In addition, the element M is one or more of gallium, aluminum, yttrium, and tin.

One embodiment of the present invention is a semiconductor device including a first conductive layer, a first insulating layer, a semiconductor layer, and a pair of second conductive layers. The first insulating layer is in contact with a top surface of the first conductive layer. The semiconductor layer is in contact with a top surface of the first insulating layer. The pair of second conductive layers are in contact with a top surface of the semiconductor layer. The pair of second conductive layers are apart from each other in a region overlapping with the first conductive layer. The semiconductor layer contains indium, zinc, and oxygen and has a composition falling within a range obtained by connecting first coordinates (44:11:10), second coordinates (4:1:6), third coordinates (2:0:3), fourth coordinates (11:0:2), and the first coordinates in this order with a straight line in a ternary diagram showing atomic ratios of indium to an element M and zinc. In addition, the element M is one or more of gallium, aluminum, yttrium, and tin.

One embodiment of the present invention is a semiconductor device including a first conductive layer, a first insulating layer, a semiconductor layer, and a pair of second conductive layers. The first insulating layer is in contact with a top surface of the first conductive layer. The semiconductor layer is in contact with a top surface of the first insulating layer. The pair of second conductive layers are in contact with a top surface of the semiconductor layer. The pair of second conductive layers are apart from each other in a region overlapping with the first conductive layer. The semiconductor layer contains indium, zinc, and oxygen and has a composition falling within a range obtained by connecting first coordinates (44:11:10), second coordinates (4:1:4), third coordinates (1:0:1), fourth coordinates (11:0:2), and the first coordinates in this order with a straight line in a ternary diagram showing atomic ratios of indium to an element M and zinc. In addition, the element M is one or more of gallium, aluminum, yttrium, and tin.

In the above semiconductor device, it is preferable that the semiconductor layer have a stacked-layer structure of a first metal oxide film and a second metal oxide film over the first metal oxide film and that the first metal oxide film have lower crystallinity than the second metal oxide film.

In the above semiconductor device, the second conductive layer preferably has a stacked-layer structure of a first conductive film, a second conductive film over the first conductive film, and a third conductive film over the second conductive film. The second conductive film preferably contains copper, silver, gold, or aluminum. It is preferable that the first conductive film and the third conductive film each contain an element different from an element in the second conductive film, and independently contain any of titanium, tungsten, molybdenum, chromium, tantalum, zinc, indium, platinum, and ruthenium.

It is preferable that the above semiconductor device further include a second insulating layer and that the second insulating layer be in contact with the top surface of the semiconductor layer and a top surface and a side surface of the second conductive layer. The second insulating layer preferably contains oxygen.

It is preferable that the above semiconductor device further include a third insulating layer and that the third insulating layer be in contact with a top surface of the second insulating layer. The third insulating layer preferably contains nitrogen.

In the above semiconductor device, it is preferable that the second insulating layer contain silicon oxide and that the third insulating layer contain silicon nitride.

Effect of the Invention

According to one embodiment of the present invention, a semiconductor device having favorable electrical characteristics can be provided. A highly reliable semiconductor device can be provided. A semiconductor device with stable electrical characteristics can be provided. A highly reliable display device can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 5A is a diagram showing classification of a crystal structure of IGZO. FIG. 5B is a graph showing an XRD spectrum of quartz glass. FIG. 5C is a graph showing an XRD spectrum of crystalline IGZO.

FIG. 13A, FIG. 13B, and FIG. 13C are cross-sectional views showing a method for fabricating a transistor.

FIG. 14A and FIG. 14B are cross-sectional views showing a method for fabricating a transistor.

FIG. 15A and FIG. 15B are cross-sectional views showing a method for fabricating a transistor.

FIG. 16A and FIG. 16B are cross-sectional views showing a method for fabricating a transistor.

FIG. 18A and FIG. 18B are cross-sectional views showing a method for fabricating a transistor.

MODE FOR CARRYING OUT THE INVENTION

Figure 1A:
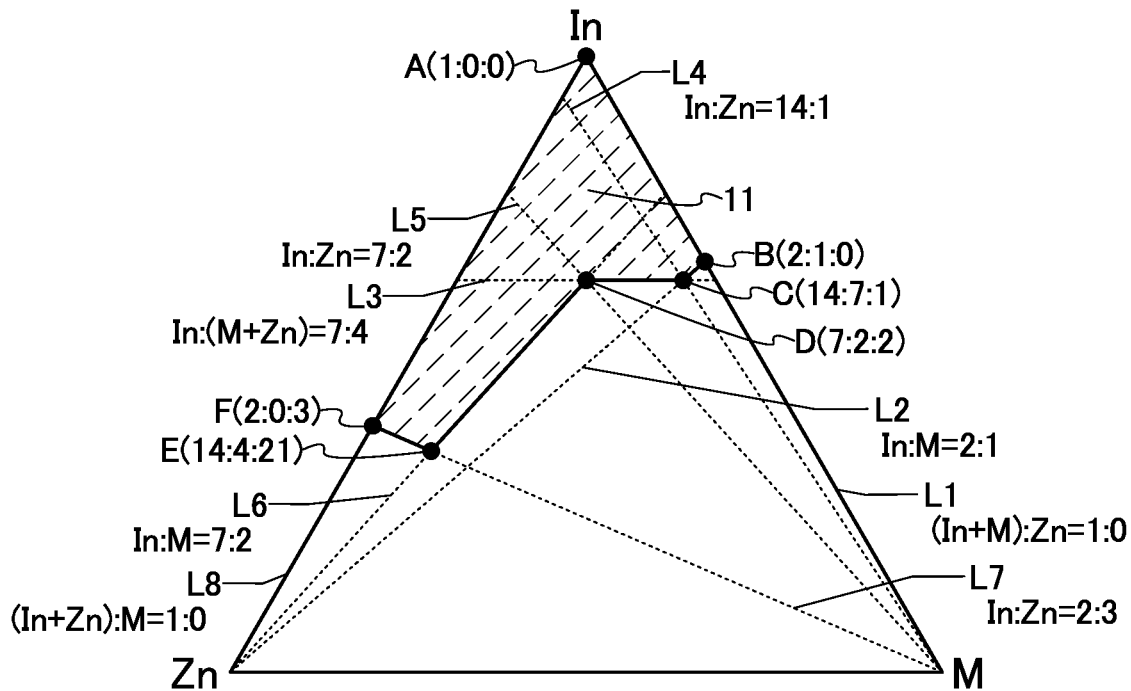
FIG. 1A and FIG. 1B are diagrams each showing the composition of a metal oxide.

Hereinafter, embodiments are described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first," "second," and "third" used in this specification and the like are used in order to avoid confusion among components, and the terms do not limit the components numerically.

In this specification and the like, terms for describing arrangement, such as "over" and "under," are used for convenience to describe the positional relation between components with reference to drawings. The positional relation between components is changed as appropriate in accordance with a direction in which each component is described. Thus, terms for the description are not limited to those used in this specification, and the description can be rephrased appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

In this specification and the like, the channel length direction of a transistor refers to one of directions parallel to the straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to a drain current of a transistor in an off state (also referred to as a non-conducting state or a cutoff state). Unless otherwise specified, an off state refers to a state where the voltage $V_{gs}$ between its gate and source is lower than the threshold voltage Vth in an n-channel transistor (higher than Vth in a p-channel transistor).

In this specification and the like, a display panel that is one embodiment of a display device has a function of displaying (outputting) an image or the like on (to) a display surface. Therefore, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can also be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a structure in which a connector and an IC are mounted on a substrate of a touch panel is referred to as a touch panel module or a display module, or simply as a touch panel or the like in some cases.

Embodiment 1

In this embodiment, a metal oxide that can be favorably used for a semiconductor device of one embodiment of the present invention is described.

The semiconductor device which is one embodiment of the present invention includes a metal oxide (hereinafter also referred to as an oxide semiconductor) functioning as a semiconductor in a channel formation region. Use of the metal oxide is preferable because a transistor using the metal oxide has more favorable switching characteristics and extremely lower off-state current than a transistor using a semiconductor including silicon or the like.

Here, the composition of the metal oxide greatly affects the electrical characteristics and reliability of a transistor. Note that the metal oxide preferably contains indium. Furthermore, the metal oxide preferably has a high content of indium. When the metal oxide has a higher content of indium, the carrier mobility (electron mobility) of the metal oxide can be increased. Therefore, a transistor in which a metal oxide having a high content of indium is used in a channel formation region has high field-effect mobility and accordingly makes a large amount of current to be flow. Moreover, a semiconductor device using the transistor can be driven at high speed. Accordingly, in a display device including such a semiconductor device, a transistor in a pixel portion and a transistor used in a driver circuit portion can be formed over the same substrate. In addition, by using such a transistor in the pixel portion, a high-quality image can be provided.

The metal oxide preferably contains an element M in addition to indium. The element M preferably has a high bonding energy with oxygen. It is particularly preferable that the element M have a higher bonding energy with oxygen than indium. When the metal oxide contains the element M having a higher bonding energy with oxygen than indium, oxygen vacancies are less likely to be formed in the metal oxide. As the element M, one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium can be used. In particular, one or more of gallium, aluminum, yttrium, and tin can be used as the element M. The element M has a function of increasing the energy gap of the metal oxide.

In particular, gallium can be favorably used as the element M. When the metal oxide contains gallium having a higher bonding energy with oxygen than indium, oxygen vacancies are less likely to be formed in the metal oxide. Many oxygen vacancies existing in the metal oxide used in a channel formation region leads to a reduction in the electrical characteristics and the reliability of a transistor. Accordingly, use of a metal oxide containing indium and gallium can achieve a highly reliable transistor having high field-effect mobility.

The metal oxide preferably contains zinc in addition to indium. Alternatively, the metal oxide preferably contains indium, the element M, and zinc. Zinc has a function of increasing the crystallinity of the metal oxide. The metal oxide having crystallinity can be favorably used in a channel formation region. For example, a metal oxide having a CAAC (c-axis aligned crystal) structure, which is described later, a polycrystalline structure, a microcrystalline (nc: nanocrystal) structure, or the like can be used in a channel formation region. Use of the metal oxide having crystallinity in a channel formation region can reduce the density of defect states in the channel formation region and achieve a highly reliable transistor.

As the crystallinity of the metal oxide becomes higher, the density of defect states in a film can be reduced. In contrast, use of a metal oxide having low crystallinity in a channel formation region can achieve a transistor in which a large amount of current can flow.

<Composition of Metal Oxide>

The composition of the metal oxide is specifically described. The atomic ratio of indium to the element M and zinc in the metal oxide is shown as a composition below.

FIG. 1A, FIG. 1B, FIG. 2A, and FIG. 2B each show a preferable range of the atomic ratio of indium to the element M and zinc contained in the metal oxide. FIG. 1A, FIG. 1B, FIG. 2A, and FIG. 2B each show a regular triangle with vertices of indium, the element M, and zinc to show atomic ratios of indium to the element M and zinc, and are each also referred to as a ternary diagram, a triangular coordinate view, or a triangular diagram. Note that FIG. 1A, FIG. 1B, FIG. 2A, and FIG. 2B do not show the oxygen atomic ratio.

Figure 3A:
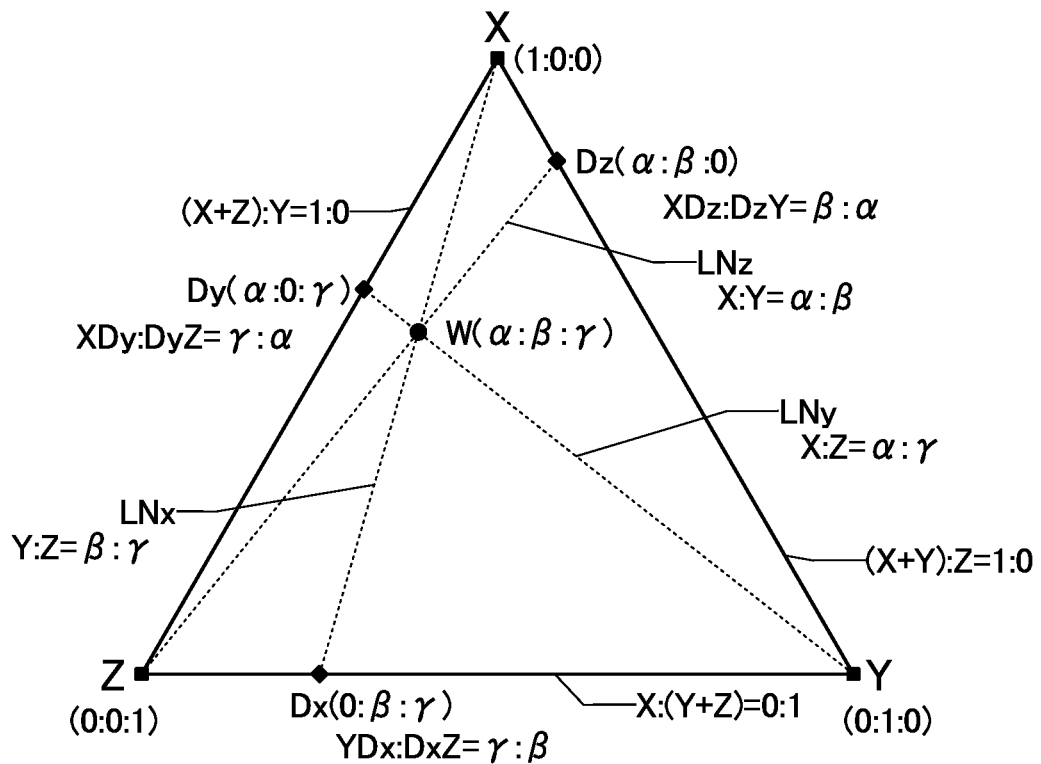
FIG. 3A and FIG. 3B are diagrams each showing the composition of a metal oxide.
Figure 3B:
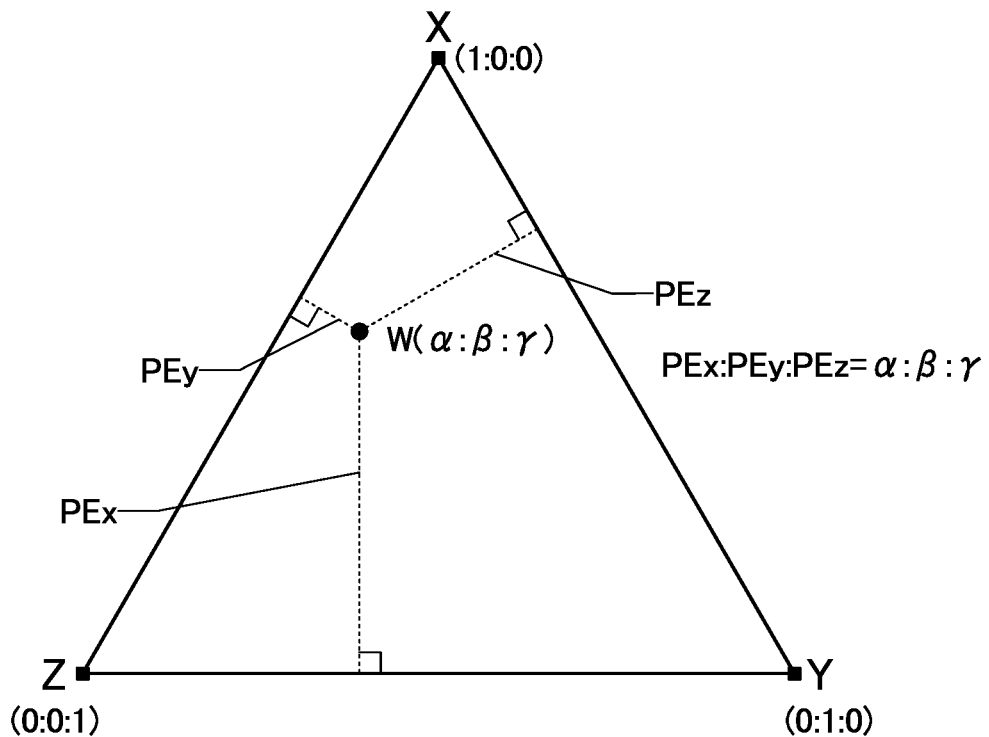
Figure 4:
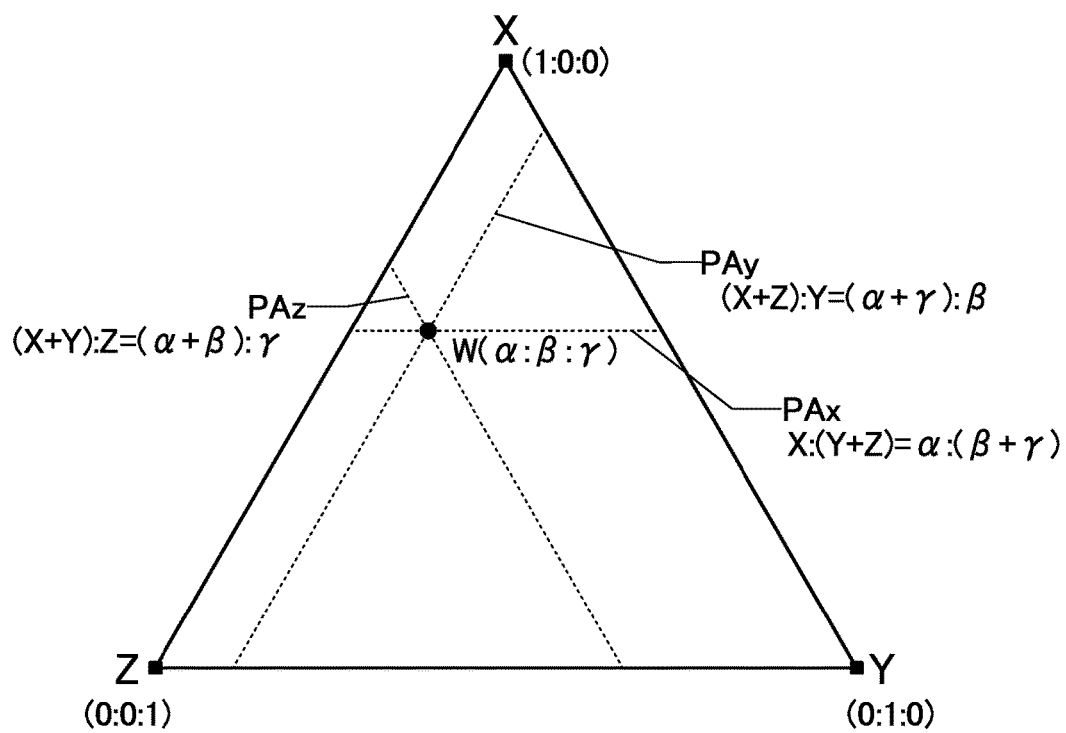
FIG. 4 is a diagram showing the composition of a metal oxide.

First, atomic ratios of the elements are described with reference to FIG. 3A, FIG. 3B, and FIG. 4. Each of FIG. 3A, FIG. 3B, and FIG. 4 shows an example of a metal oxide containing an element X, an element Y, and an element Z. Each of ternary diagrams shown in FIG. 3A, FIG. 3B, and FIG. 4 shows a regular triangle with vertices of a point X, a point Y, and a point Z, and a coordinate point W ($\alpha$:$\beta$:$\gamma$) as an example of a composition of the metal oxide.

The coordinate point W ($\alpha$:$\beta$:$\gamma$) indicates that the atomic ratio of the element X to the element Y and the element Z is X:Y:Z=$\alpha$:$\beta$:$\gamma$. As the position of the coordinate point is close to the vertex of one element, a value of the element in the atomic ratio increases, whereas as the position of the coordinate point is far from the vertex of the element, the value of the element in the atomic ratio decreases. Here, the coordinates of the point X are (1:0:0), which indicates that the atomic ratio of the element X to the element Y and the element Z is X:Y:Z=1:0:0, that is, the metal oxide contains the element X and contains neither the element Y nor the element Z. The coordinates of the point Y are (0:1:0), which indicates that the atomic ratio of the element X to the element Y and the element Z is X:Y:Z=0:1:0, that is, the metal oxide contains the element Y and contains neither the element X nor the element Z. The coordinates of the point Z are (0:0:1), which indicates that the atomic ratio of the element X to the element Y and the element Z is X:Y:Z=0: 0:1, that is, the metal oxide contains the element Z and contains neither the element X nor the element Y.

Note that in this specification and the like, the atomic ratio of the element X to the element Y and the element Z is represented by X:Y:Z in some cases. Furthermore, the atomic ratio of the sum of the element X and the element Y to the element Z is represented by (X+Y):Z in some cases. Other combinations of the elements may also be represented in a similar manner.

FIG. 3A shows a line LNx, a line LNy, and a line LNz. The line LNx is a straight line that connects the point X and a point Dx (0:$\beta$:$\gamma$) dividing the length of a side YZ into $\gamma$:$\beta$. The line LNx can also be referred to as an aggregate of points where the atomic ratio of the element Y and the element Z satisfies Y:Z=$\beta$:$\gamma$. The line LNy is a straight line that connects the point Y and a point Dy ($\alpha$:0:$\gamma$) dividing the length of a side XZ into $\gamma$:$\alpha$. The line LNy can also be referred to as an aggregate of points where the atomic ratio of the element X and the element Z satisfies X:Z=$\alpha$:$\gamma$. The line LNz is a straight line that connects the point Z and a point Dz ($\alpha$:$\beta$:0) dividing the length of a side XY into $\beta$:$\alpha$. The line LNz can also be referred to as an aggregate of points where the atomic ratio of the element X and the element Y satisfies X:Z=$\alpha$:$\beta$. Each of the line LNx, the line LNy, and the line LNz intersects with the coordinate point W ($\alpha$:$\beta$:$\gamma$).

Note that in this specification and the like, a "straight line that connects Point A and Point B" can be replaced with a "line segment that connects Point A and Point B".

Here, the coordinate point W ($\alpha$:$\beta$:$\gamma$) can also be referred to as an intersection of the line LNx and the line LNy. The coordinate point W ($\alpha$:$\beta$:$\gamma$) can also be referred to as an intersection of the line LNy and the line LNz. The coordinate point W ($\alpha$:$\beta$:$\gamma$) can also be referred to as an intersection of the line LNx and the line LNz.

Note that the side XY is an aggregate of points where the atomic ratio of the sum of the element X and the element Y to the element Z satisfies (X+Y):Z=1:0. That is, the side XY indicates that the metal oxide contains one or more of the element X and the element Y and does not contain the element Z. The side YZ is an aggregate of points where the atomic ratio of the element X to the sum of the element Y and the element Z satisfies X:(Y+Z)=0:1. That is, the side YZ indicates that the metal oxide contains one or more of the element Y and the element Z and does not contain the element X. The side XZ is an aggregate of points where the atomic ratio of the sum of the element X and the element Z to the element Y satisfies (X+Z):Y=1:0. That is, the side XZ indicates that the metal oxide contains one or more of the element X and the element Z and does not contain the element Y.

As a specific example, a case of the coordinate point W (5:1:3) is described. In the case of the coordinate point W (5:1:3), the ratio of the length of a line segment XDz and the length of a line segment DzY is 1:5. The ratio of the length of a line segment YDx and the length of a line segment DxZ is 3:1. The ratio of the length of a line segment XDy and the length of a line segment DyZ is 3:5. The line LNx is a point where satisfying the atomic ratio of the element Y to the element Z satisfies Y:Z=1:3. The line LNy is an aggregate of points where the atomic ratio of the element X and the element Z satisfies X:Z=5:3. The line LNz is an aggregate of points where the atomic ratio of the element X and the element Y satisfies X:Y=5:1.

FIG. 3B shows a line PEx, a line PEy, and a line PEz. The line PEx is a perpendicular line drawn from the coordinate point W ($\alpha$:$\beta$:$\gamma$) to the side YZ. The line PEy is a perpendicular line drawn from the coordinate point W ($\alpha$:$\beta$:$\gamma$) to the side XZ. The line PEz is a perpendicular line drawn from the coordinate point W ($\alpha$:$\beta$:$\gamma$) to the side XY. Here, the ratio of the length of the line PEx to the length of the line PEy and the length of the line PEz is $\alpha$:$\beta$:$\gamma$.

As a specific example, the case of the coordinate point W (5:1:3) is described. In the case of the coordinate point W (5:1:3), the ratio of the length of the line PEx to the length of the line PEy and the length of the line PEz is 5:1:3.

FIG. 4A shows a line PAx, a line PAy, and a line PAz. The line PAx is a straight line parallel to the side YZ and intersects with the coordinate point W ($\alpha$:$\beta$:$\gamma$). The line PAy is a straight line parallel to the side XZ and intersects with the coordinate point W ($\alpha$:$\beta$:$\gamma$). The line PAz is a straight line parallel to the side XY and intersects with the coordinate point W ($\alpha$:$\beta$:$\gamma$). Furthermore, the line PAx can also be referred to as an aggregate of points where the atomic ratio of the element X to the sum of the element Y and the element Z satisfies X:(Y+Z)=$\alpha$:($\beta$+$\gamma$). The line PAy can also be referred to as an aggregate of points where the atomic ratio of the sum of the element X and the element Z to the element Y satisfies (X+Z):Y=($\alpha$+$\gamma$):$\beta$. The line PAz can also be referred to as an aggregate of points where the atomic ratio of the sum of the element X and the element Y to the element Z satisfies (X+Y):Z=($\alpha$+$\beta$):$\gamma$.

As a specific example, a case of the coordinate point W (5:1:3) is described. In the case of the coordinate point W (5:1:3), the line PAx is an aggregate of points where the atomic ratio of the element X to the sum of the element Y and the element Z satisfies X:(Y+Z)=5:4. The line PAy is an aggregate of points where the atomic ratio of the sum of the element X and the element Z to the element Y satisfies (X+Z):Y=8:1. The line PAz is an aggregate of points where the atomic ratio of the sum of the element X and the element Y to the element Z satisfies (X+Y):Z=2:1.

Hereinafter, the composition of a metal oxide that can be favorably used in a channel formation region of a transistor is specifically described.

[Composition 1 of Metal Oxide]

The metal oxide preferably contains indium and oxygen. The metal oxide may further contain one or more of the element M and zinc. FIG. 1A shows the composition of the metal oxide that can be favorably used in a channel formation region of a transistor. The atomic ratio of indium to the element M and zinc in the metal oxide is preferably in a range 11 in the ternary diagram shown in FIG. 1A. The range 11 is an inside of a polygon obtained by connecting a coordinate point A (1:0:0), a coordinate point B (2:1:0), a coordinate point C (14:7:1), a coordinate point D (7:2:2), a coordinate point E (14:4:21), a coordinate point F (2:0:3), and the coordinate point A in this order by a straight line. Note that the range 11 also includes each coordinate point and each side. The use of a metal oxide having a composition in the range 11 in a channel formation region can allow a transistor to have high reliability and high field-effect mobility.

Note that in the case where a plurality of elements are contained as the element M, the atomic ratio of the sum of the elements is used as the atomic ratio of the element M. In the case where gallium and tin are contained as the element M, for example, the atomic ratio of the sum of gallium and tin is used as the atomic ratio of the element M.

Here, the coordinate point B (2:1:0) is an intersection of a line L1 that is an aggregate of points satisfying (In+M):Zn=1:0 and a line L2 that is an aggregate of points satisfying In:M=2:1. The coordinate point C (14:7:1) is an intersection of the line L2 and a line L3 that is an aggregate of points satisfying In:(M+Zn)=7:4. The coordinate point C is also an intersection of the line L2 and a line L4 that is an aggregate of points satisfying In:Zn=14:1. The coordinate point D (7:2:2) is an intersection of the line L3 and a line L5 that is an aggregate of points satisfying In:Zn=7:2. The coordinate point D is also an intersection of the line L3 and a line L6 that is an aggregate of points satisfying In:M=7:2. The coordinate point E (14:4:21) is an intersection of the line L6 and a line L7 that is an aggregate of points satisfying In:Zn=2:3. The coordinate point F (2:0:3) is an intersection of the line L7 and a line L8 that is an aggregate of points satisfying (In+Zn):M=1:0.

Note that in this specification and the like, the atomic ratio of indium, the element M, and zinc is denoted by In:M:Zn in some cases. The atomic ratio of the sum of indium and the element M and zinc is denoted by (In+M):Zn in some cases. The same applies to other combinations of the elements.

A side AB is on the line L1, a side BC is on the line L2, a side CD is on the line L3, a side DE is on the line L6, a side EF is on the line L7, and a side FA is on the line L8. That is, the range 11 can also be referred to as an inside of a polygon surrounded by the line L1, the line L2, the line L3, the line L6, the line L7, and the line L8.

For the composition of the metal oxide, as shown in the range 11, it is preferable to satisfy In:M=2:1 corresponding to the line L2 or to have the content of indium higher than In:M=2:1. That is, the atomic ratio of indium to the element M, In/M, is preferably higher than or equal to 2. The metal oxide having a high content of indium has high carrier mobility (electron mobility), a transistor using the metal oxide having a high content of indium in a channel formation region has high field-effect mobility, and thus a large amount of current can flow in the transistor.

Note that a high content of the element M may increase defect states, and the amount of change in the threshold voltage in a reliability test may become large. One of indicators of evaluating the reliability of a transistor is a GBT (Gate Bias Temperature) stress test in which a state of applying an electric field to a gate is maintained. Among the GBT stress tests, a test in which a state where a positive potential relative to a source potential and a drain potential is supplied to a gate is maintained at high temperatures is referred to as PBTS (Positive Bias Temperature stress) test, and a test in which a state where a negative potential is supplied to a gate is maintained at high temperatures is referred to as a NBTS (Negative Bias Temperature stress) test. The PBTS test and the NBTS test conducted in a state where irradiation with light such as white LED light is performed are respectively referred to as a PBTIS (positive bias temperature illumination stress test) and an NBTIS (Negative Bias Temperature Illumination Stress) test.

In particular, in an n-channel transistor using a metal oxide, a positive potential is applied to a gate in a state where the transistor is in an on state (a state where current flows). Accordingly, the amount of change in the threshold voltage in the PBTS test is one of important items to be focused on as an indicator of the reliability of the transistor.

Here, the use of a metal oxide not containing the element M or having a low content of the element M can reduce the amount of change in the threshold voltage in the PBTS test. In the case where the element M is contained, as the composition of the metal oxide, the content of the element M is preferably lower than the content of indium. Furthermore, it is preferable that the atomic ratio of indium to the element M, In/M, be 2 or more. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. However, generation of the defect states can be inhibited by reducing the content of the element M in a portion of the semiconductor layer in contact with the gate insulating layer.

The following can be given, for example, as the reason why degradation in the PBTS test can be inhibited when the element M is not contained, or the content of the element M is made small. The element M contained in the semiconductor layer has a property of attracting oxygen more easily than another metal element (e.g., indium or zinc) does. Therefore, when, at the interface between a metal oxide film containing a large amount of the element M and the insulating layer containing an oxide, the element M is bonded to excess oxygen in the insulating layer, trap sites of carriers (here, electrons) are probably likely to be generated easily. This might cause the change in the threshold voltage when carriers are trapped at the interface between the semiconductor layer and the gate insulating layer in a state where a positive potential is applied to a gate.

Accordingly, the use of a metal oxide in which the atomic ratio of indium to the element M, In/M, is 2 or more in a channel formation region can inhibit generation of defect states, and thus a transistor can have high reliability and high field-effect mobility.

For the composition of the metal oxide, as shown in the range 11, it is preferable to satisfy In:(M+Zn)=7:4 corresponding to the line L3 or to have the content of indium higher than In:(M+Zn)=7:4. That is, the atomic ratio of the indium to the sum of the element M and zinc, In/(M+Zn), is preferably higher than or equal to 7/4. The metal oxide having a high content of indium has high carrier mobility (electron mobility), a transistor using the metal oxide having a high content of indium in a channel formation region has high field-effect mobility, and thus a large amount of current can flow in the transistor. Thus, the use of a metal oxide with the atomic ratio in the above range in a channel formation region can achieve a transistor having high field-effect mobility.

For the composition of the metal oxide, as shown in the range 11, it is preferable to satisfy In:M=7:2 corresponding to the line L6 or to have the content of indium higher than In:M=7:2. That is, the atomic ratio of indium to the element M, In/M, is preferably higher than or equal to 7/2. The use of a metal oxide with the atomic ratio in the above range in a channel formation region can inhibit generation of defect states and can allow a transistor to have high reliability and high field-effect mobility.

For the composition of the metal oxide, as shown in the range 11, it is preferable to satisfy In:Zn=2:3 corresponding to the line L7 or to have the content of indium higher than In:Zn=2:3. That is, the atomic ratio of indium to zinc, In/Zn, is preferably higher than or equal to 2/3. When the content of zinc is high, the metal oxide becomes polycrystal in some cases. A crystal grain boundary of polycrystal becomes a defect state, which serves as a carrier trap or a carrier generation source; thus, a transistor using a metal oxide of polycrystal has a large change in electrical characteristics, leading to a reduction in reliability in some cases. Accordingly, with the atomic ratio in the above range, the metal oxide can be inhibited from being polycrystal. Furthermore, the use of the metal oxide in a channel formation region can allow a transistor to have high reliability.

As the metal oxide, an In-M-Zn oxide having a composition in the range 11 can be used. As an In-M-Zn oxide, for example, In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, In:M:Zn=10:1:15, or a neighborhood thereof can be favorably used. Indium oxide can be used as the metal oxide. Moreover, as the metal oxide, an In-M oxide can be used. As an In-M oxide, for example, In:M=2:1, In:M=7:2, In:M=5:1, In:M=7:1, In:M=10:1, or a neighborhood thereof can be favorably used. Furthermore, as the metal oxide, an In—Zn oxide can be used. As an In—Zn oxide, for example, In:Zn=2:3, In:Zn=3:2, In:Zn=7:2, In:Zn=4:1, In:Zn=11:2, In:Zn=7:1, In:Zn=14:1, or a neighborhood thereof can be favorably used.

As an analysis method of the composition of a metal oxide, for example, energy dispersive X-ray spectroscopy (EDX), X-ray photoelectron spectroscopy (XPS), inductively coupled plasma-mass spectrometry (ICP-MS), inductively coupled plasma-atomic emission spectroscopy (ICP-AES), or the like can be used. Note that as for an element whose content is low, the actual content may be different from the content obtained by analysis because of the influence of the analysis accuracy. In the case where the content of the element M is low, for example, the content of the element M obtained by analysis may be lower than the actual content.

Note that in the case where the metal oxide is formed by a sputtering method, the atomic ratio of a target may be different from the atomic ratio of the metal oxide. In particular, the atomic ratio of zinc in the metal oxide is lower than the atomic ratio of zinc in the target in some cases. Specifically, the atomic ratio of zinc contained in the metal oxide may be approximately 40% to 90% of the atomic ratio of zinc contained in the target. The target used here is preferably polycrystalline.

[Composition 2 of Metal Oxide]

Figure 1B:
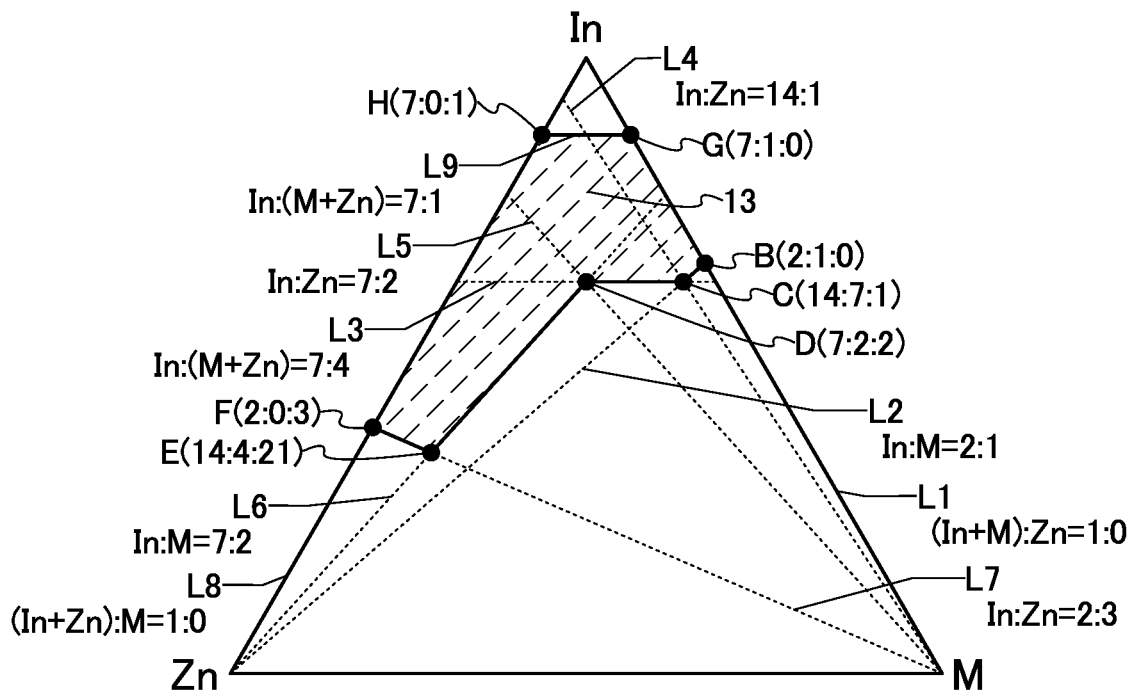

The metal oxide preferably contains indium, oxygen, and one or more of the element M and zinc. FIG. 1B shows the composition of the metal oxide that can be favorably used in a channel formation region of a transistor. The atomic ratio of indium to the element M and zinc in the metal oxide is preferably in a range 13 in the ternary diagram shown in FIG. 1B. The range 13 is an inside of a polygon obtained by connecting a coordinate point G (7:1:0), the coordinate point B (2:1:0), the coordinate point C (14:7:1), the coordinate point D (7:2:2), the coordinate point E (14:4:21), the coordinate point F (2:0:3), a coordinate point H (7:0:1), and the coordinate point G in this order with a straight line. Note that the range 13 also includes each coordinate point and each side. The use of a metal oxide having a composition in the range 13 in a channel formation region can achieve a highly reliable transistor having high field-effect mobility.

Here, the coordinate point G (7:1:0) is an intersection of the line L1 that is an aggregate of points satisfying (In+M):Zn=1:0 and a line L9 that is an aggregate of points satisfying In:(M+Zn)=7:1. The coordinate point H (7:0:1) is an intersection of the line L9 and the line L8 that is an aggregate of points satisfying (In+Zn):M=1:0. The above description can be referred to for the coordinate point B to the coordinate point F; therefore, a detailed description thereof is omitted.

A side GB is on the line L1, the side BC is on the line L2, the side CD is on the line L3, the side DE is on the line L6, the side EF is on the line L7, a side FH is on the line L8, and a side HG is on the line L9. That is, the range 13 can also be referred to as an inside of a polygon surrounded by the line L1, the line L2, the line L3, the line L6, the line L7, the line L8, and the line L9.

For the composition of the metal oxide, as shown in the range 13, it is preferable to satisfy In:(M+Zn)=7:1 corresponding to the line L9 or to have the content of In lower than In:(M+Zn)=7:1. That is, the atomic ratio of indium to the sum of the element M and zinc, In/(M+Zn), is preferably lower than or equal to 7. When the content of indium is high, the metal oxide has a bixbyite crystal structure in some cases. Alternatively, the metal oxide has a crystal structure in which a bixbyite crystal structure and a layered crystal structure coexist, in some cases. In the case where a plurality of crystal structures coexist, a crystal grain boundary might be formed between different crystal structures. A crystal grain boundary becomes a defect state, which serves as a carrier trap or a carrier generation source; thus, a transistor using a metal oxide having a crystal grain boundary has a large change in electrical characteristics, leading to a reduction in reliability in some cases. Accordingly, with the atomic ratio in the above range, the metal oxide can be inhibited from having a bixbyite crystal structure and thus is likely to have a layered crystal structure. Furthermore, the use of the metal oxide in a channel formation region can allow a transistor to have high reliability.

For the composition of the metal oxide, as shown in the range 13, it is preferable to satisfy In:M=2:1 corresponding to the line L2 or to have the content of indium higher than In:M=2:1. That is, the atomic ratio of indium to the element M, In/M, is preferably higher than or equal to 2. The use of a metal oxide with the atomic ratio in the above range in a channel formation region can inhibit generation of defect states and can allow a transistor to have high reliability and high field-effect mobility.

For the composition of the metal oxide, as shown in the range 13, it is preferable to satisfy In:(M+Zn)=7:4 corresponding to the line L3 or to have the content of indium higher than In:(M+Zn)=7:4. That is, the atomic ratio of indium to the sum of the element M and zinc, In/(M+Zn), is preferably higher than or equal to 7/4. The use of a metal oxide with the atomic ratio in the above range in a channel formation region can allow a transistor to have high field-effect mobility.

For the composition of the metal oxide, as shown in the range 13, it is preferable to satisfy In:M=7:2 corresponding to the line L6 or to have the content of indium higher than In:M=7:2. That is, the atomic ratio of indium to the element M, In/M, is preferably higher than or equal to 7/2. The use of a metal oxide with the atomic ratio in the above range in a channel formation region can inhibit generation of defect states and can allow a transistor to have high reliability and high field-effect mobility.

For the composition of the metal oxide, as shown in the range 13, it is preferable to satisfy In:Zn=2:3 corresponding to the line L7 or to have the content of indium higher than In:Zn=2:3. That is, the atomic ratio of indium to zinc, In/Zn, is preferably higher than or equal to 2/3. With the atomic ratio in the above range, the metal oxide can be inhibited from being polycrystal. Furthermore, the use of the metal oxide in a channel formation region can allow a transistor to have high reliability.

As the metal oxide, an In-M-Zn oxide having a composition in the range 13 can be used. As an In-M-Zn oxide, for example, In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, In:M:Zn=10:1:15, or a neighborhood thereof can be favorably used. Moreover, as the metal oxide, an In-M oxide can be used. As an In-M oxide, for example, In:M=2:1, In:M=7:2, In:M=5:1, In:M=7:1, or a neighborhood thereof can be favorably used. Furthermore, as the metal oxide, an In—Zn oxide can be used. As an In—Zn oxide, for example, In:Zn=2:3, In:Zn=3:2, In:Zn=7:2, In:Zn=4:1, In:Zn=11:2, In:Zn=7:1, or a neighborhood thereof can be favorably used.

[Composition of Metal Oxide]

Figure 2A:
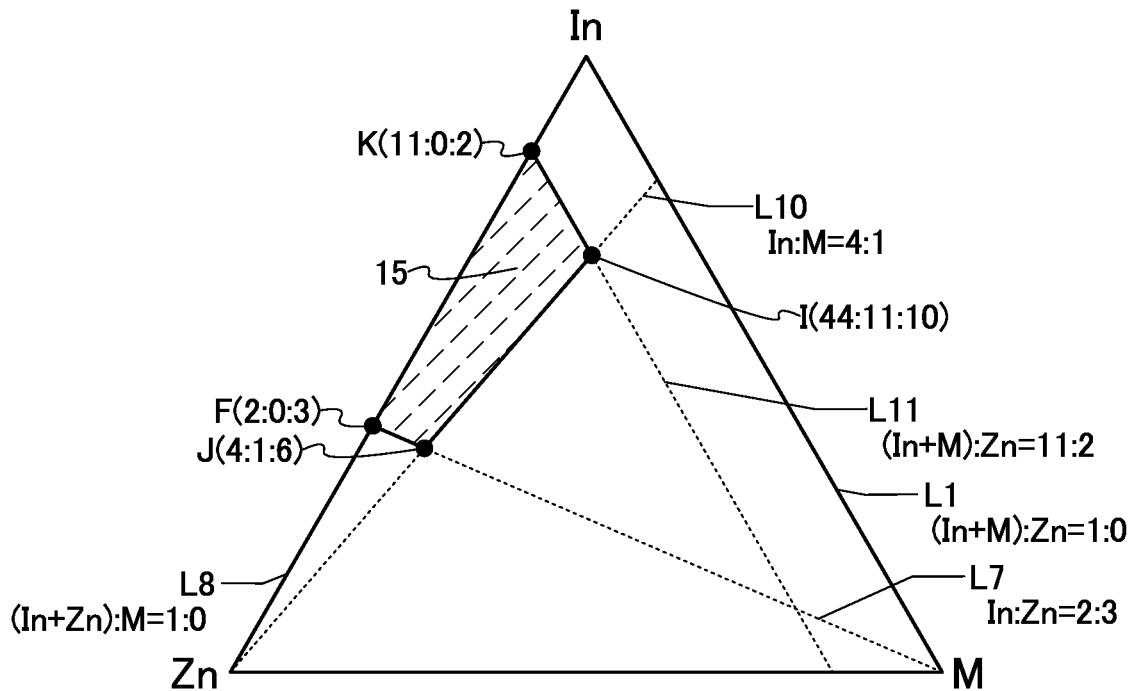
FIG. 2A and FIG. 2B are diagrams each showing the composition of a metal oxide.

The metal oxide preferably contains indium, zinc, and oxygen. The metal oxide may further contain the element M. FIG. 2A shows the composition of the metal oxide that can be favorably used in a channel formation region of a transistor. The atomic ratio of indium to the element M and zinc in the metal oxide is preferably in a range 15 in the ternary diagram shown in FIG. 2A. The range 15 is an inside of a polygon obtained by connecting a coordinate point I (44:11:10), a coordinate point J (4:1:6), a coordinate point F (2:0:3), a coordinate point K (11:0:2), and the coordinate point I in this order with a straight line. Note that the range 15 also includes each coordinate point and each side. The use of a metal oxide having a composition in the range 15 in a channel formation region can allow a transistor to have high reliability and high field-effect mobility.

Here, the coordinate point I (44:11:10) is an intersection of a line L10 that is an aggregate of points satisfying In:M=4:1 and a line L11 that is an aggregate of points satisfying (In+M):Zn=11:2. The coordinate point J (4:1:6) is an intersection of the line L7 and the line L10. The coordinate point K (11:0:2) is an intersection of the line L11 and the line L8. The above description can be referred to for the coordinate point F; therefore, a detailed description thereof is omitted.

A side IJ is on the line L10, a side JF is on the line L7, a side FK is on the line L8, and a side KI is on the line L11.

That is, the range 15 can also be referred to as an inside of a polygon surrounded by the line L10, the line L7, the line L8, and the line L11.

For the composition of the metal oxide, as shown in the range 15, it is preferable to satisfy In:M=4:1 corresponding to the line L10 or to have the content of In higher than In:M=4:1. That is, the atomic ratio of indium to the element M, In/M, is preferably higher than or equal to 4. The use of a metal oxide with the atomic ratio in the above range in a channel formation region can inhibit generation of defect states and can allow a transistor to have high reliability and high field-effect mobility.

For the composition of the metal oxide, as shown in the range 15, it is preferable to satisfy In:Zn=2:3 corresponding to the line L7 or to have the content of indium higher than In:Zn=2:3. That is, the atomic ratio of indium to zinc, In/Zn, is preferably higher than or equal to 2/3. With the atomic ratio in the above range, the metal oxide can be inhibited from being polycrystal. Furthermore, the use of the metal oxide in a channel formation region can allow a transistor to have high reliability.

For the composition of the metal oxide, as shown in the range 15, it is preferable to satisfy (In+M):Zn=11:2 corresponding to the line L11 or to have the content of zinc higher than (In+M):Zn=11:2. That is, the atomic ratio of the sum of indium and the element M to zinc, (In+M)/Zn, is preferably lower than or equal to 11/2. The metal oxide containing zinc tends to have a layered crystal structure. Furthermore, as the content of zinc is higher, the metal oxide has higher crystallinity.

As the metal oxide, an In-M-Zn oxide having a composition in the range 15 can be used. As an In-M-Zn oxide, for example, In:M:Zn=5:1:2, In:M:Zn=5:1:3, In:M:Zn=5:1:4, In:M:Zn=5:1:5, In:M:Zn=5:1:6, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, In:M:Zn=10:1:15, or a neighborhood thereof can be favorably used. Furthermore, as the metal oxide, an In—Zn oxide can be used. As an In—Zn oxide, for example, In:Zn=2:3, In:Zn=3:2, In:Zn=7:2, In:Zn=4:1, In:Zn=11:2, In:Zn=7:1, or a neighborhood thereof can be favorably used.

It is preferable that the metal oxide have a composition in the above range and be a CAAC-OS (c-axis Aligned Crystalline Oxide Semiconductor), an nc-OS (nanocrystalline oxide semiconductor), or a CAC-OS (Cloud-Aligned Composite Oxide Semiconductor).

Here, a CAC-OS and a CAAC-OS that are metal oxides that can be used for a transistor are described.

[Composition of Metal Oxide]

A CAC-OS has a conducting function in part of the material and has an insulating function in another part of the material; as a whole, the CAC-OS has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor is explained with FIG. 5A. FIG. 5A is a diagram showing the classification of crystal structures of an oxide semiconductor, typically IGZO (a metal oxide containing In, Ga, and Zn).

As shown in FIG. 5A, IGZO is roughly classified into Amorphous, Crystalline, and Crystal. Amorphous includes completely amorphous structure. Crystalline includes CAAC (c-axis-aligned crystalline), nc (nanocrystalline), and CAC (Cloud-Aligned Composite). Note that Crystalline excludes single crystal and poly crystal described later. Crystal includes single crystal and poly crystal.

Note that the structure shown in the thick frame in FIG. 5A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with an X-ray diffraction (XRD) pattern. Here, XRD spectra of quartz glass and IGZO, which has a crystal structure classified into crystalline (also referred to as crystalline IGZO), are shown in FIG. 5B and FIG. 5C. FIG. 5B shows an XRD spectrum of quartz glass and FIG. 5C shows an XRD spectrum of crystalline IGZO. Note that the crystalline IGZO shown in FIG. 5C has a composition of In:Ga:Zn=4:2:3 [atomic ratio]. Furthermore, the crystalline IGZO shown in FIG. 5C has a thickness of 500 nm.

As indicated by arrows in FIG. 5B, the XRD spectrum of the quartz glass shows a substantially bilaterally symmetrical peak. In contrast, as indicated by arrows in FIG. 5C, the XRD spectrum of the crystalline IGZO shows a bilaterally asymmetrical peak. The bilaterally asymmetrical peak of the XRD spectrum clearly shows the existence of crystal. In other words, the structure cannot be regarded as Amorphous unless it has a bilaterally symmetrical peak in the XRD spectrum. Note that in FIG. 5C, a microcrystal (nanocrystal) is explicitly shown at 2θ of 31° or in the vicinity thereof. The bilaterally asymmetrical peak in the XRD spectrum is probably due to the microcrystal.

Specifically, in the XRD spectrum shown in FIG. 5C, the crystalline IGZO has a peak at 2θ=34° or in the vicinity thereof. Furthermore, the nanocrystal has a peak at 2θ=31° or in the vicinity thereof. In the case where an oxide semiconductor film is evaluated using an X-ray diffraction pattern, as shown in FIG. 5C, the width of the spectrum on the lower angle side than 2θ=34° of the peak or in the vicinity thereof becomes larger. This indicates that the oxide semiconductor film includes a microcrystal having a peak at 2θ=31° or in the vicinity thereof.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like.

A crystal structure in which a clear grain boundary is observed is what is called a polycrystal structure. It is highly probable that the grain boundary becomes a recombination center and traps carriers and thus decreases the on-state current or field-effect mobility of a transistor. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor having a low carrier concentration is preferably used in a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and may behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, alkali metal, alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set to lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set to lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set to lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

[Composition 4 of Metal Oxide]

Figure 2B:
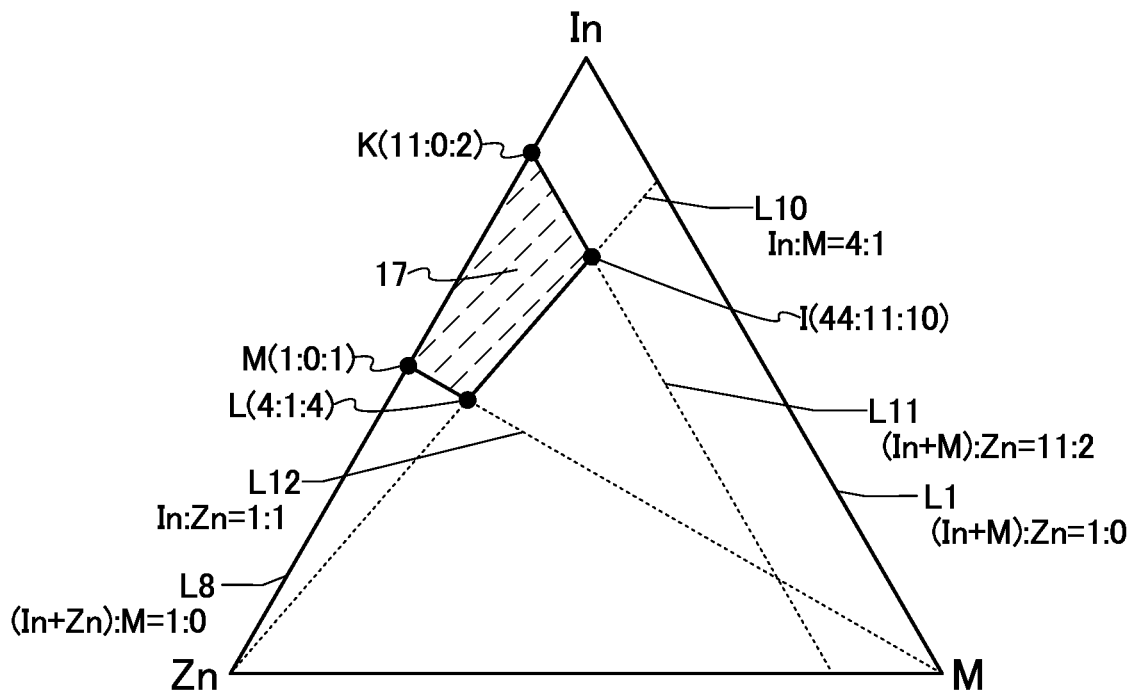

The metal oxide preferably contains indium, zinc, and oxygen. The metal oxide may further contain the element M. FIG. 2B shows the composition of the metal oxide that can be favorably used in a channel formation region of a transistor. The atomic ratio of indium to the element M and zinc in the metal oxide is preferably in a range 17 in the ternary diagram shown in FIG. 2B. The range 17 is an inside of a polygon obtained by connecting the coordinate point I (44:11:10), a coordinate point L (4:1:4), a coordinate point M (1:0:1), the coordinate point K (11:0:2), and the coordinate point I in this order with a straight line. Note that the range 17 also includes each coordinate point and each side. The use of a metal oxide having a composition in the range 17 in a channel formation region can allow a transistor to have high reliability and high field-effect mobility.

Here, the coordinate point L (4:1:4) is an intersection of the line L10 and a line L12 that is an aggregate of points satisfying In:Zn=1:1. The coordinate point M (1:0:1) is an intersection of the line L12 and the line L8. The above description can be referred to for the coordinate point I and the coordinate point K; therefore, a detailed description thereof is omitted.

A side IL is on the line L10, a side LM is on the line L12, a side MK is on the line L8, and the side KI is on the line L11. That is, the range 17 can also be referred to as an inside of a polygon surrounded by the line L10, the line L12, the line L8, and the line L11.

For the composition of the metal oxide, as shown in the range 17, it is preferable to satisfy In:M=4:1 corresponding to the line L10 or to have the content of In higher than In:M=4:1. That is, the atomic ratio of indium to the element M, In/M, is preferably higher than or equal to 4. The use of a metal oxide with the atomic ratio in the above range in a channel formation region can inhibit generation of defect states and can allow a transistor to have high reliability and high field-effect mobility.

For the composition of the metal oxide, as shown in the range 17, it is preferable to satisfy In:Zn=1:1 corresponding to the line L12 or to have the content of indium higher than In:Zn=1:1. That is, the atomic ratio of indium to zinc, In/Zn, is preferably higher than or equal to 1. With the atomic ratio in the above range, the metal oxide can be inhibited from being polycrystal. Since the metal oxide is less likely to be polycrystal, a margin of conditions for forming the metal oxide can be enlarged. Furthermore, the use of the metal oxide in a channel formation region can allow a transistor to have high reliability.

For the composition of the metal oxide, as shown in the range 17, it is preferable to satisfy (In+M):Zn=11:2 corresponding to the line L11 or to have the content of zinc higher than (In+M):Zn=11:2. That is, the atomic ratio of the sum of indium and the element M to zinc, (In+M)/Zn, is preferably lower than or equal to 11/2. A metal oxide having the atomic ratio in the above range has high crystallinity. Furthermore, the use of the metal oxide in a channel formation region can allow a transistor to have high reliability.

As the metal oxide, an In-M-Zn oxide having a composition in the range 17 can be used. As an In-M-Zn oxide, for example, In:M:Zn=5:1:2, In:M:Zn=5:1:3, In:M:Zn=5:1:4, In:M:Zn=5:1:5, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, or a neighborhood thereof can be favorably used. Furthermore, as the metal oxide, an In—Zn oxide can be used. As an In—Zn oxide, for example, In:Zn=2:3, In:Zn=3:2, In:Zn=7:2, In:Zn=4:1, In:Zn=11:2, In:Zn=7:1, or a neighborhood thereof can be favorably used.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, structure examples of a semiconductor device using the metal oxide described in Embodiment 1 are described. A transistor is described below as an example.

Structure Example 1

Structure Example 1-1

Figure 6A:
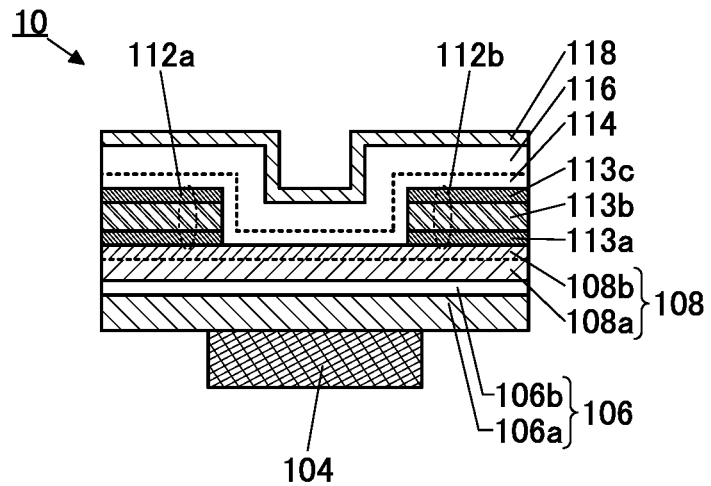
FIG. 6A and FIG. 6B are cross-sectional views showing structure examples of transistors.

FIG. 6A shows a schematic cross-sectional view of a transistor 10 of one embodiment of the present invention in the channel length direction.

The transistor 10 includes a conductive layer 104, an insulating layer 106, a semiconductor layer 108, a conductive layer 112a, and a conductive layer 112b. The conductive layer 104 functions as a gate electrode. Part of the insulating layer 106 functions as a gate insulating layer. The conductive layer 112a functions as one of a source electrode and a drain electrode, and the conductive layer 112b functions as the other. A region of the semiconductor layer 108 that overlaps with the conductive layer 104 functions as a channel formation region. The transistor 10 is what is called a bottom-gate transistor including a gate electrode below the semiconductor layer 108.

An insulating layer 114, an insulating layer 116, and an insulating layer 118 are provided to cover the conductive layer 112a, the conductive layer 112b, and the semiconductor layer 108. The insulating layer 114, the insulating layer 116, and the insulating layer 118 each function as a protective layer.

The conductive layer 104 is preferably formed using a conductive film containing a metal or an alloy, in which case the electric resistance can be reduced. The use of a conductive material containing copper for the conductive layer 104 is particularly preferable. Note that an oxide film may be used as the conductive layer 104.

It is preferable to use an oxide film as the insulating layer 106. It is particularly preferable to use an oxide film for a portion in contact with the semiconductor layer 108.

The insulating layer 106 preferably has high withstand voltage. The high withstand voltage of the insulating layer 106 allows a transistor to have high reliability.

The stress of the insulating layer 106 is preferably low. The low stress of the insulating layer 106 can inhibit occurrence of problems during the process caused by stress such as warpage of the substrate.

The insulating layer 106 preferably functions as a barrier film that inhibits diffusion of impurities such as water, hydrogen, and sodium into the transistor 10 from a member (e.g., a substrate) on the formation surface side of the insulating layer 106. In addition, the insulating layer 106 preferably functions as a barrier film that inhibits diffusion of a component of the conductive layer 104 into the transistor 10. The insulating layer 106 functions as a barrier film that inhibits diffusion of impurities and the like; thus, the transistor can have favorable electrical characteristics and high reliability.

Moreover, the amount of impurities such as water and hydrogen released from the insulating layer 106 itself is preferably small. With the insulating layer 106 from which a small amount of impurities is released, diffusion of impurities to the transistor 10 side is inhibited, and the transistor can have favorable electrical characteristics and high reliability.

Furthermore, the insulating layer 106 preferably functions as a barrier film that inhibits diffusion of oxygen. The insulating layer 106 having a function of inhibiting diffusion of oxygen inhibits diffusion of oxygen into the conductive layer 104 from above the insulating layer 106 and thus can inhibit oxidation of the conductive layer 104. Consequently, the transistor can have favorable electrical characteristics and high reliability.

FIG. 6A shows a structure in which the insulating layer 106 has a stacked-layer structure of an insulating layer 106a and an insulating layer 106b over the insulating layer 106a. For example, a nitride film can be used as the insulating layer 106a positioned on the formation surface side of the insulating layer 106, and an oxide film can be used as the insulating layer 106b in contact with the semiconductor layer 108.

The insulating layer 106a preferably has high withstand voltage. The high withstand voltage of the insulating layer 106 allows a transistor to have high reliability.

The stress of the insulating layer 106a is preferably low. The small stress of the insulating layer 106 can inhibit occurrence of problems during the process caused by stress such as warpage of the substrate.

The insulating layer 106a preferably functions as a barrier film that inhibits diffusion of impurities such as water, hydrogen, and sodium into the transistor 10 from a member (e.g., a substrate) on the formation surface side of the insulating layer 106. In addition, the insulating layer 106 preferably functions as a barrier film that inhibits diffusion of a component of the conductive layer 104 into the transistor 10. When the insulating layer 106 has a function of inhibiting diffusion of impurities and the like, the transistor can have favorable electrical characteristics and high reliability.

Moreover, the amount of impurities such as water and hydrogen released from the insulating layer 106a itself is preferably small. With the insulating layer 106a from which a small amount of impurities is released, diffusion of impurities to the transistor 10 side is inhibited, and the transistor can have favorable electrical characteristics and high reliability.

Furthermore, the insulating layer 106a preferably functions as a barrier film that inhibits diffusion of oxygen. The insulating layer 106a having a function of inhibiting diffusion of oxygen inhibits diffusion of oxygen into the conductive layer 104 from above the insulating layer 106a and thus can inhibit oxidation of the conductive layer 104. Consequently, the transistor can have favorable electrical characteristics and high reliability.

As the insulating layer 106a, for example, an oxide film of aluminum oxide, aluminum oxynitride, hafnium oxide, hafnium oxynitride, gallium oxide, gallium oxynitride, yttrium oxide, yttrium oxynitride, or the like or a nitride film of silicon nitride, silicon nitride oxide, aluminum nitride, aluminum nitride oxide, or the like can be used. It is particularly suitable to use silicon nitride for the insulating layer 106a.

The insulating layer 106b includes a region in contact with the channel formation region of the semiconductor layer 108. The insulating layer 106b preferably has a low defect density. Moreover, the amount of impurities including hydrogen, such as water and hydrogen, released from the insulating layer 106*b* itself is preferably small. An oxide film of silicon oxide, silicon oxynitride, or the like can be suitably used as the insulating layer 106*b*.

The insulating layer 106 having the stacked-layer structure as shown in FIG. 6A allows the transistor to have favorable electrical characteristics and high reliability.

A nitride film may be formed as the insulating layer 106*a*, and then oxygen may be added to an upper portion of the insulating layer 106*a* to form an oxygen-containing region; the oxygen-containing region may be regarded as the insulating layer 106*b*. Examples of treatment for adding oxygen include heat treatment or plasma treatment in an oxygen-containing atmosphere, and ion doping treatment.

Note that in this specification and the like, oxynitride refers to a substance that contains more oxygen than nitrogen in its composition, and oxynitride is included in oxide. Nitride oxide refers to a substance that contains more nitrogen than oxygen in its composition, and nitride oxide is included in nitride.

Although the insulating layer 106 has a two-layer structure of the insulating layer 106*a* and the insulating layer 106*b* in FIG. 6A, one embodiment of the present invention is not limited thereto. The insulating layer 106 may have a single-layer structure or a stacked-layer structure of three or more layers. Each of the insulating layer 106*a* and the insulating layer 106*b* may have a stacked-layer structure of two or more layers.

The semiconductor layer 108 contains a metal oxide exhibiting semiconductor characteristics (hereinafter also referred to as an oxide semiconductor). The metal oxide having a composition described in Embodiment 1 is preferably used for the semiconductor layer 108. The use of the metal oxide in a channel formation region allows the transistor to have high reliability and high field-effect mobility.

It is preferable to use a metal oxide film having crystallinity as the semiconductor layer 108. For example, a metal oxide film having a CAAC (c-axis aligned crystal) structure, which is described later, a polycrystalline structure, a nanocrystal (nc) structure, or the like can be used. By using a metal oxide film having crystallinity as the semiconductor layer 108, the density of defect states in the semiconductor layer 108 can be reduced, which enables the semiconductor device to have high reliability.

As the semiconductor layer 108 has higher crystallinity, the density of defect states in the film can be lower. By contrast, the use of a metal oxide film with low crystallinity enables a transistor to flow a large amount of current.

In the case where the metal oxide film is formed by a sputtering method, the crystallinity of the formed metal oxide film can be increased as the substrate temperature (the stage temperature) at the time of formation is higher. The crystallinity of the formed metal oxide film can be increased as the proportion of a flow rate of an oxygen gas in the whole deposition gas (also referred to as oxygen flow rate ratio) used at the time of formation is higher.

The semiconductor layer 108 preferably has a stacked-layer structure of a semiconductor layer 108*a* and a semiconductor layer 108*b* over the semiconductor layer 108*a*. Each of the semiconductor layer 108*a* and the semiconductor layer 108*b* preferably includes a metal oxide. Note that a boundary (interface) between the semiconductor layer 108*a* and the semiconductor layer 108*b* cannot be clearly observed in some cases. Then, in the drawings illustrating one embodiment of the present invention, the boundary is denoted by a dashed line. The metal oxide film described in Embodiment 1 is preferably used as each of the semiconductor layer 108*a* and the semiconductor layer 108*b*.

The semiconductor layer 108*b*, which is positioned on the back channel side, preferably includes a region having higher crystallinity than the semiconductor layer 108*a*, which is positioned on the conductive layer 104 side. With the semiconductor layer 108*b* including a region having high crystallinity, the semiconductor layer 108 can be inhibited from being partly etched and lost at the time of forming the conductive layer 112*a* and the conductive layer 112*b*. In addition, damage to the semiconductor layer 108 at the time of performing cleaning treatment on the surface of the semiconductor layer 108 can be inhibited.

The semiconductor layer 108*a* and the semiconductor layer 108*b* can be formed separately in different formation conditions, for example. The flow rate of oxygen gas in the deposition gas can be made different between the semiconductor layer 108*a* and the semiconductor layer 108*b*, for example.

In this case, as the formation conditions of the semiconductor layer 108*a*, the proportion of oxygen gas flow rate (also referred to as oxygen flow rate ratio or oxygen partial pressure) in the whole gas flow rate is preferably higher than or equal to 0% and lower than 50%, further preferably higher than or equal to 5% and lower than or equal to 30%, still further preferably higher than or equal to 5% and lower than or equal to 20%. With the above oxygen flow rate ratio, the semiconductor layer 108*a* can have low crystallinity.

As the formation conditions of the semiconductor layer 108*b*, the oxygen flow rate ratio is preferably higher than or equal to 50% and lower than or equal to 100%, further preferably higher than or equal to 60% and lower than or equal to 100%, still further preferably higher than or equal to 70% and lower than or equal to 100%, yet still further preferably higher than or equal to 80% and lower than or equal to 100%. With the above oxygen flow rate ratio, the semiconductor layer 108*b* can have high crystallinity.

In the case where the semiconductor layer 108 has a stacked-layer structure, successive formation is preferably performed using the same sputtering target in the same treatment chamber because the interface can be favorable. Although the formation conditions such as pressure, temperature, and power at the time of the formation may vary between the metal oxide films, it is particularly preferable to employ the same conditions except for the oxygen flow rate ratio because the time required for formation steps can be shortened. The semiconductor layer 108 may have a stacked-layer structure of metal oxide films with different compositions. In the case where metal oxide films with different compositions are stacked, successive formation without exposure to the air is preferably performed.

The substrate temperature at the time of forming the semiconductor layer 108 is preferably higher than or equal to room temperature (25° C.) and lower than or equal to 200° C., further preferably higher than or equal to room temperature and lower than or equal to 130° C. With the substrate temperature in the above range, the bending or warpage of the substrate can be inhibited in the case where a large-area glass substrate is used. When the semiconductor layer 108 has a stacked-layer structure and the semiconductor layer 108*a* and the semiconductor layer 108*b* are formed at the same substrate temperature, the productivity can be increased. In the case where the semiconductor layer 108*a* and the semiconductor layer 108*b* are formed at different substrate temperatures, the substrate temperature at the time of forming the semiconductor layer 108*b* is preferably higher than the substrate temperature at the time of forming the semiconductor layer 108a. The high substrate temperature at the time of forming the semiconductor layer 108b enables the semiconductor layer 108b to have higher crystallinity than the semiconductor layer 108a. Note that in this specification and the like, room temperature also refers to a temperature of a substrate which is not subjected to heating.

For example, it is preferable that a CAC-OS (Cloud-Aligned Composite oxide semiconductor) film be used for the semiconductor layer 108a and a CAAC-OS (c-axis-aligned crystalline oxide semiconductor) film be used for the semiconductor layer 108b.

The crystallinity of the semiconductor layer 108a and the semiconductor layer 108b can be analyzed with X-ray diffraction (XRD), a transmission electron microscope (TEM), electron diffraction (ED), or the like, for example.

The thickness of the semiconductor layer 108a is preferably greater than or equal to 1 nm and less than or equal to 50 nm, further preferably greater than or equal to 5 nm and less than or equal to 30 nm, still further preferably greater than or equal to 5 nm and less than or equal to 20 nm. The thickness of the semiconductor layer 108b is preferably greater than or equal to 1 nm and less than or equal to 50 nm, further preferably greater than or equal to 5 nm and less than or equal to 30 nm, still further preferably greater than or equal to 5 nm and less than or equal to 20 nm.

Here, oxygen vacancies that might be formed in the semiconductor layer 108 are described.

In the case where the semiconductor layer 108 includes an oxide semiconductor, hydrogen contained in the oxide semiconductor reacts with oxygen bonded to a metal atom to be water, and thus sometimes forms an oxygen vacancy ($V_O$) in the oxide semiconductor. In some cases, a defect where hydrogen enters an oxygen vacancy (hereinafter, referred to as $V_OH$) functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

$V_OH$ can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the semiconductor layer 108, the amount of $V_OH$ in the semiconductor layer 108 is preferably reduced as much as possible so that the semiconductor layer 108 becomes a highly purified intrinsic or substantially highly purified intrinsic semiconductor layer. In order to obtain such an oxide semiconductor with sufficiently reduced $V_OH$, it is important to remove impurities such as water and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as $V_OH$ is used for a channel formation region of a transistor, stable electrical characteristics can be given.

When an oxide semiconductor is used for the semiconductor layer 108, the carrier concentration of the oxide semiconductor in a region functioning as a channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^3$, yet still further preferably lower than $1 \times 10^{13}$ cm$^3$, yet still further preferably lower than $1 \times 10^{12}$ cm$^3$. Note that the lower limit of the carrier concentration of the oxide semiconductor in the region functioning as the channel formation region is not particularly limited and can be, for example, $1 \times 10^{-9}$ cm$^3$.

The insulating layer 114 and the insulating layer 116 have a function of protective films for the transistor 10. Furthermore, the insulating layer 114 and the insulating layer 116 each have a function of supplying oxygen to the semiconductor layer 108.

Supplying oxygen from the insulating layer 114 and the insulating layer 116 to the semiconductor layer 108, particularly to the back channel side of the semiconductor layer 108, can reduce $V_O$ and $V_OH$ in the semiconductor layer 108, so that a highly reliable transistor can be obtained. Examples of treatment for supplying oxygen to the semiconductor layer 108 include heat treatment in an oxygen-containing atmosphere and plasma treatment in an oxygen-containing atmosphere.

The conductive layer 112a and the conductive layer 112b are preferably formed using a conductive film containing a metal or an alloy, in which case the electric resistance can be reduced. The use of a conductive material containing copper for the conductive layer 112a and the conductive layer 112b is particularly preferable. Note that an oxide film may be used as the conductive layer 112a and the conductive layer 112b.

FIG. 6A shows an example in which the conductive layer 112a and the conductive layer 112b each have a stacked-layer structure in which a conductive layer 113a, a conductive layer 113b, and a conductive layer 113c are stacked in this order from the formation surface side.

A low-resistance conductive material is preferably used for the conductive layer 113b. The conductive layer 113a and the conductive layer 113c can be each independently formed using a conductive material different from that of the conductive layer 113b. When the conductive layer 113b is sandwiched between the conductive layer 113a and the conductive layer 113c, it is possible to inhibit oxidation of a surface of the conductive layer 113b and diffusion of the components of the conductive layer 113b into neighboring layers. With such a structure, the conductive layer 112a and the conductive layer 112b can have extremely low resistance.

In each of the conductive layer 112a and the conductive layer 112b, the topmost conductive layer 113c preferably contains a material that is less likely to be bonded to oxygen than a conductive film containing copper, aluminum, or the like, or a material that is less likely to be deprived of its conductivity even when being oxidized. In addition, a material into which oxygen in the semiconductor layer 108 is less likely to diffuse is preferably used for the conductive layer 113a that is in contact with the semiconductor layer 108. For the topmost conductive layer 113c and the conductive layer 113a that is in contact with the semiconductor layer, a conductive material containing titanium, tungsten, molybdenum, chromium, tantalum, zinc, indium, platinum, ruthenium, or the like can be used, for example. The conductive layer 113a and the conductive layer 113c can be formed using the same conductive material. Alternatively, the conductive layer 113a and the conductive layer 113c may be formed using different conductive materials.

Cleaning treatment is preferably performed before the insulating layer 114 is formed over the semiconductor layer 108. The cleaning treatment can remove water, hydrogen, a component of an organic substance, and the like adsorbed on the surface of the semiconductor layer 108. Examples of a cleaning method include wet cleaning using a cleaning solution or the like, heat treatment, and cleaning by plasma treatment using plasma. Alternatively, the above cleaning methods may be performed in combination as appropriate.

The heat treatment is preferably performed in an atmosphere containing an oxidizing gas or a reduced pressure atmosphere. An oxidizing gas refers to a gas having oxidizability. As the oxidizing gas, for example, a gas containing oxygen, such as oxygen ($O_2$), ozone ($O_3$), dinitrogen monoxide ($N_2O$), nitrogen monoxide (NO), and nitrogen dioxide ($NO_2$) can be used. The heat treatment can be performed in an oxygen gas atmosphere at a temperature higher than or equal to 70° C. and lower than or equal to 200° C., for example.

The plasma treatment is preferably performed in an atmosphere containing an oxidizing gas. When the plasma treatment is performed in an atmosphere containing an oxidizing gas, an organic substance on the surface of the semiconductor layer 108 can be suitably removed. After the plasma treatment, the insulating layer 114 is preferably formed successively without exposure of the surface of the semiconductor layer 108 to the air. When the insulating layer 114 is formed successively after the plasma treatment, it is possible to inhibit attachment of impurities to the interface between the semiconductor layer 108 and the insulating layer 114.

In some cases, the conductive layer 112a and the conductive layer 112b are oxidized by the cleaning treatment and thus have increased resistance, which adversely affects the electrical characteristics and reliability of the transistor. Hence, it is particularly preferable that the plasma treatment using a mixed gas including an oxidizing gas and a reducing gas be performed as the cleaning treatment. As the oxidizing gas, the above-described gas can be used. A reducing gas refers to a gas having reducing ability. As the reducing gas, a gas containing hydrogen, such as ammonia ($NH_3$) or hydrogen ($H_2$), and carbon monoxide (CO) can be used, for example. For example, the plasma treatment is performed in an atmosphere of a mixed gas including an oxidizing gas of dinitrogen monoxide and a reducing gas of ammonia, whereby oxidation of the conductive layer 112a and the conductive layer 112b can be inhibited and water, hydrogen, a component of an organic substance, and the like adsorbed on the surface of the semiconductor layer 108 can be removed effectively.

In the plasma treatment, the flow rate of the reducing gas is preferably 0.005 times or more and 1 time or less, further preferably 0.01 times or more and 0.9 times or less, still further preferably 0.02 times or more and 0.8 times or less, yet further preferably 0.03 times or more and 0.6 times or less, yet still further preferably 0.03 times or more and 0.5 times or less as high as the flow rate of the oxidizing gas.

As the mixed gas used for the plasma treatment, a mixed gas including a rare gas such as argon in addition to the oxidizing gas and the reducing gas may be used.

It is preferable that the amount of a nitrogen oxide ($NO_x$, x is greater than 0 and less than or equal to 2) released from the insulating layer 114 in contact with the semiconductor layer 108 by heat application be small. Examples of nitrogen oxide include $NO_2$ and NO.

Nitrogen oxide forms a state in the insulating layer 114 and the like. The state is positioned in the energy gap of the semiconductor layer 108. Thus, when nitrogen oxide is diffused to the interface between the insulating layer 114 and the semiconductor layer 108, an electron may be trapped by the state on the insulating layer 114 side. As a result, the trapped electron remains in the vicinity of the interface between the insulating layer 114 and the semiconductor layer 108; hence, the threshold voltage of the transistor is shifted in the positive direction.

Note that the amount of ammonia released from the insulating layer 114 is preferably large. Nitrogen oxide reacts with ammonia and oxygen by application of heat, and then is decomposed. Since nitrogen oxide included in the insulating layer 114 reacts with ammonia included in the insulating layer 114 and the insulating layer 116 by application of heat, the amount of nitrogen oxide included in the insulating layer 114 is reduced. Thus, electrons are hardly trapped at the interface between the insulating layer 114 and the semiconductor layer 108.

When a film from which a large amount of ammonia is released and a small amount of nitrogen oxide is released is used as the insulating layer 114, a change in the threshold voltage of the transistor can be inhibited, which can reduce a change in the electrical characteristics of the transistor.

As the insulating layer 114, for example, an oxide film such as a silicon oxide film or a silicon oxynitride film is preferably formed with a plasma-enhanced chemical vapor deposition apparatus (a PECVD apparatus or simply referred to as a plasma CVD apparatus). In that case, a mixed gas including a deposition gas containing silicon, an oxidizing gas, and an ammonia gas is preferably used as a source gas. The insulating layer 114 formed using the mixed gas including the ammonia gas can be the insulating layer 114 from which a large amount of ammonia is released. As the deposition gas containing silicon, for example, silane, disilane, trisilane, and silane fluoride can be used. As the oxidizing gas, the above-described gas can be used.

The proportions of the gases in the mixed gas can be controlled by controlling the flow rates of the gases supplied to a treatment chamber of the plasma-enhanced chemical vapor deposition apparatus. Note that the ratio of the gases in the mixed gas can be expressed in, for example, the volume ratio, the partial pressure ratio, or the weight ratio. Here, the flow rate ratio of the gases supplied to the treatment chamber is substantially the same as the volume ratio and the partial pressure ratio of the gases.

In the case where plasma treatment is performed as cleaning treatment before the formation of the insulating layer 114, the same gas can be used as a gas used for the plasma treatment and a gas used for the formation of the insulating layer 114. In the plasma treatment, a mixed gas containing a first oxidizing gas and a reducing gas is used, and in the formation of the insulating layer 114, a first deposition gas a mixed gas containing a second oxidizing gas, an ammonia gas, and a first deposition gas including silicon is used. Here, when the same kind of gas is used as the first oxidizing gas and the second oxidizing gas and an ammonia gas is used as the reducing gas, the same oxidizing gas and the same ammonia gas can be used in the first plasma treatment and the formation of the insulating layer 114. Using the same gases can reduce the kinds of gas used for fabricating the transistor.

A case where the plasma treatment and the formation of the insulating layer 114 are performed using a plasma-enhanced chemical vapor deposition apparatus is described as an example. Here, the insulating layer 114 is silicon oxynitride.

In the plasma treatment, a mixed gas including an oxidizing gas of dinitrogen monoxide ($N_2O$) and a reducing gas of ammonia can be used, and in the formation of the insulating layer 114, a mixed gas including a deposition gas of monosilane, an oxidizing gas of dinitrogen monoxide ($N_2O$), and ammonia can be used. Here, in the plasma treatment and the formation of the insulating layer 114, dinitrogen monoxide ($N_2O$) and ammonia can be used in common. That is, the plasma treatment is performed using dinitrogen monoxide ($N_2O$) and ammonia; and then, a monosilane gas is supplied, whereby the insulating layer 114 can be formed. Since the plasma treatment and the formation of the insulating layer 114 can be performed successively in the same treatment chamber in this manner, impurities at the interface between the semiconductor layer 108 and the insulating layer 114 can be reduced; thus, the interface can be favorable.

In the formation of the insulating layer 114, the flow rate of the oxidizing gas is preferably more than 20 times and 200 times or less, further preferably 30 times or more and 150 times or less, still further preferably 40 times or more and 100 times or less, yet still further preferably 40 times or more and 80 times or less as high as the flow rate of the deposition gas.

In the formation of the insulating layer 114, the flow rate of the ammonia gas is preferably lower than or equal to the flow rate of the oxidizing gas. The flow rate of the ammonia gas is preferably 0.01 times or more and 1 time or less, further preferably 0.02 times or more and 0.9 times or less, still further preferably 0.03 times or more and 0.8 times or less, yet further preferably 0.04 times or more and 0.6 times or less, yet still further preferably 0.05 times or more and 0.5 times or less as high as the flow rate of the oxidizing gas. With the above-described flow rates of the gases, the insulating layer 114 from which a large amount of ammonia is released can be obtained. Since the amount of nitrogen oxide released from the insulating layer 114 is reduced, a transistor with a small change in the threshold voltage can be obtained. In addition, with the above-described flow rates of the gases, the insulating layer 114 with few defects can be formed even when the pressure in the treatment chamber is relatively high. Note that the preferred flow rate of the ammonia gas with respect to the flow rate of the oxidizing gas may vary depending on the conditions such as pressure and power at the time of forming the insulating layer 114.

The pressure in the treatment chamber at the time of forming the insulating layer 114 is preferably 200 Pa or lower, further preferably 150 Pa or lower, still further preferably 120 Pa or lower, yet still further preferably 100 Pa or lower. With the pressure in the above range, the insulating layer 114 from which a small amount of nitrogen oxide is released and in which the amount of defects is small can be formed.

Note that an insulating layer from which a large amount of ammonia is released and a small amount of nitrogen oxide is released is a film which releases ammonia more than nitrogen oxide in thermal desorption spectroscopy (TDS) analysis; the released amount of ammonia is typically greater than or equal to $1\times10^{18}/cm^3$ and less than or equal to $5\times10^{19}/cm^3$. Note that the released amount of ammonia is the released amount in the range of the surface temperature of a film from 50° C. to 650° C., preferably from 50° C. to 550° C.

The insulating layer 114 preferably has a low defect density. When the defect density of the insulating layer 114 is high, oxygen is bonded to the defects and the oxygen permeability of the insulating layer 114 decreases. With the use of the insulating layer 114 having a low defect density, the transistor with a small change in the threshold voltage and excellent electrical characteristics can be obtained. In the case where an insulating film containing silicon is used as the insulating layer 114, for example, the spin density of a signal that appears at g=2.001 due to a dangling bond of silicon is preferably lower than or equal to $3\times10^{17}$ spins/cm³ in ESR measurement.

The insulating layer 114 is formed over the semiconductor layer 108, and thus is preferably a film formed under conditions where damage to the semiconductor layer 108 is small. For example, the insulating layer 114 can be formed at a sufficiently low deposition rate. For example, when the insulating layer 114 is formed by a plasma CVD method under a low-power condition, damage to the semiconductor layer 108 can be extremely small.

The insulating layer 116 is preferably formed using an oxide film and further preferably includes a region containing oxygen in excess of that in the stoichiometric composition. In other words, the insulating layer 116 includes an insulating film capable of releasing oxygen. It is also possible to supply oxygen into the insulating layer 116 by forming the insulating layer 116 in an oxygen atmosphere, performing heat treatment or the plasma treatment on the formed insulating layer 116 in an oxygen atmosphere, or forming an oxide film over the insulating layer 116 in an oxygen atmosphere, for example. Note that the insulating layer 116 includes a region where the released amount of oxygen molecules in TDS is greater than or equal to $1.0\times10^{19}$ molecules/cm³, preferably greater than or equal to $3.0\times10^{20}$ molecules/cm³. The released amount of oxygen is the total amount in the range of the heat treatment temperature in TDS from 50° C. to 650° C. or from 50° C. to 550° C.

The defect density of the insulating layer 116 is preferably low, and typically, the spin density of a signal that appears at g=2.001 due to a dangling bond of silicon is preferably lower than $1.5\times10^{18}$ spins/cm³, further preferably lower than or equal to $1\times10^{18}$ spins/cm³ by ESR measurement. Note that the insulating layer 116 is more apart from the semiconductor layer 108 than the insulating layer 114 is, and thus may have higher defect density than the insulating layer 114.

As the insulating layer 114 and the insulating layer 116, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used, for example.

Insulating films formed of the same kind of material can be used as the insulating layer 114 and the insulating layer 116; thus, an interface between the insulating layer 114 and the insulating layer 116 cannot be clearly observed in some cases. Then, in this embodiment, the boundary (interface) between the insulating layer 114 and the insulating layer 116 cannot be clearly observed in some cases. Accordingly, in a diagram illustrating one embodiment of the present invention, the boundary is denoted by a dashed line. Although the two-layer structure of the insulating layer 114 and the insulating layer 116 is described in this embodiment, one embodiment of the present invention is not limited thereto. For example, a single-layer structure of the insulating layer 114 or a stacked-layer structure of three or more layers may be employed.

After the insulating layer 114 is formed, the insulating layer 116 is preferably formed successively without exposure of the surface of the insulating layer 114 to the air. The insulating layer 116 is formed successively after the formation of the insulating layer 114, so that attachment of impurities to the interface between the insulating layer 114 and the insulating layer 116 can be inhibited.

The same gas can be used as the gas used for the formation of the insulating layer 114 and the gas used for the formation of the insulating layer 116.

In the formation of the insulating layer 114, a mixed gas including a second oxidizing gas, an ammonia gas, and a first deposition gas containing silicon is used, and in the formation of the insulating layer 116, a mixed gas including a third oxidizing gas and a second deposition gas containing silicon is used. Here, when the same kind of gas is used as the second oxidizing gas and the third oxidizing gas and the same kind of gas is used as the first deposition gas containing silicon and the second deposition gas containing silicon, the same oxidizing gas and the same deposition gas containing silicon can be used in the formation of the insulating layer 114 and the formation of the insulating layer 116. Using the same gases can reduce the kinds of gas used for fabricating the transistor.

A case where the formation of the insulating layer 114 and the insulating layer 116 is performed using a plasma-enhanced chemical vapor deposition apparatus is described as an example.

Here, the insulating layer 114 and the insulating layer 116 are both silicon oxynitride. In the formation of the insulating layer 114, a mixed gas including a deposition gas of monosilane, an oxidizing gas of dinitrogen monoxide ($N_2O$), and ammonia can be used, and in the formation of the insulating layer 116, a mixed gas including a deposition gas of mono silane and an oxidizing gas of dinitrogen monoxide ($N_2O$) can be used. Here, in the formation of the insulating layer 114 and the insulating layer 116, monosilane and dinitrogen monoxide ($N_2O$) can be used in common. That is, the insulating layer 114 is formed using monosilane, dinitrogen monoxide ($N_2O$), and ammonia; and then, supply of the ammonia gas is stopped, whereby the insulating layer 116 can be formed. Since the formation of the insulating layer 114 and the insulating layer 116 can be performed successively in the same treatment chamber in this manner, impurities at the interface between the insulating layer 114 and the insulating layer 116 can be reduced; thus, the interface can be favorable.

Moreover, in the case where the plasma treatment is performed as the cleaning treatment before the formation of the insulating layer 114, the same gas is preferably used as the gas used for the plasma treatment, the gas used for the formation of the insulating layer 114, and the gas used for the formation of the insulating layer 116. Using the same gases can reduce the kinds of gas used for fabricating the transistor.

A case where the plasma treatment, the formation of the insulating layer 114, and the formation of the insulating layer 116 are performed using a plasma-enhanced chemical vapor deposition apparatus is described as an example. Here, the insulating layer 114 and the insulating layer 116 are silicon oxynitride.

In the plasma treatment, a mixed gas including an oxidizing gas of dinitrogen monoxide ($N_2O$) and a reducing gas of ammonia is used. In the formation of the insulating layer 114, a mixed gas including a deposition gas of mono silane, an oxidizing gas of dinitrogen monoxide ($N_2O$), and ammonia is used. In the formation of the insulating layer 116, a mixed gas including a deposition gas of monosilane and an oxidizing gas of dinitrogen monoxide ($N_2O$) is used. Here, in the plasma treatment, the formation of the insulating layer 114, and the formation of the insulating layer 116, an oxidizing gas of dinitrogen monoxide ($N_2O$) can be used in common. In the plasma treatment and the formation of the insulating layer 114, ammonia can be used in common. In the formation of the insulating layer 114 and the formation of the insulating layer 116, a deposition gas of monosilane can be used in common. That is, the plasma treatment is performed using dinitrogen monoxide ($N_2O$) and ammonia; and then, a monosilane gas is supplied, whereby the insulating layer 114 can be formed. After that, supply of the ammonia gas is stopped, whereby the insulating layer 116 can be formed. Since the plasma treatment, the formation of the insulating layer 114, and the formation of the insulating layer 116 can be performed successively in the same treatment chamber in this manner, impurities at the interface between the semiconductor layer 108 and the insulating layer 114 and the interface between the insulating layer 114 and the insulating layer 116 can be reduced; thus, the interfaces can be favorable.

After the formation of the insulating layer 116, a surface of the insulating layer 116 may be subjected to plasma treatment. Impurities such as water adsorbed on the surface of the insulating layer 116 can be reduced by the plasma treatment. In the case where impurities such as water are adsorbed on the surface of the insulating layer 116, the impurities may reach the semiconductor layer 108, and Vo, VoH, or the like may be formed in the semiconductor layer 108. When the surface of the insulating layer 116 is subjected to the plasma treatment and impurities such as water are inhibited from being adsorbed on the surface of the insulating layer 116, the transistor can have high reliability. The plasma treatment is particularly suitable in the case where the surface of the insulating layer 116 is exposed to the air after the formation of the insulating layer 116 before the formation of the insulating layer 118. For example, the plasma treatment can be performed in an atmosphere of oxygen, ozone, nitrogen, dinitrogen monoxide, argon, or the like. The formation of the insulating layer 116 and the plasma treatment are preferably performed successively without exposure to the air.

The insulating layer 118 has a function of a protective film of the transistor 10. The insulating layer 118 inhibits diffusion of impurities such as water and hydrogen into the transistor 10 from the outside of the transistor 10. That is, the reliability and moisture resistance of the transistor 10 can be improved, so that a semiconductor device can have increased reliability.

The insulating layer 118 preferably functions as a barrier film that inhibits diffusion of impurities such as water and hydrogen into the transistor 10 from the outside of the transistor 10. The amount of impurities including hydrogen, such as water and hydrogen, released from the insulating layer 118 itself is preferably small. In addition, the insulating layer 118 preferably functions as a barrier film that inhibits diffusion of oxygen. As the insulating layer 118, for example, an oxide film of aluminum oxide, aluminum oxynitride, hafnium oxide, hafnium oxynitride, gallium oxide, gallium oxynitride, yttrium oxide, yttrium oxynitride, or the like or a nitride film of silicon nitride, silicon nitride oxide, aluminum nitride, aluminum nitride oxide, or the like can be used. It is particularly suitable to use silicon nitride for the insulating layer 118.

Here, when heat is applied in the state where the insulating layer 116 is exposed, oxygen contained in the insulating layer 114 and the insulating layer 116 might be released to the outside. Release of oxygen contained in the insulating layer 114 and the insulating layer 116 to the outside reduces the amount of oxygen contained in the insulating layer 114 and the insulating layer 116, which may reduce the amount of oxygen to be supplied to the semiconductor layer 108. Thus, a temperature at which the formation of at least the insulating layer 118 is started is preferably a temperature at which oxygen contained in the insulating layer 114 and the insulating layer 116 is not released to the outside. When the insulating layer 118 has a function of inhibiting diffusion of oxygen and the insulating layer 118 is formed at a temperature at which oxygen contained in the insulating layer 114 and the insulating layer 116 is not released to the outside, oxygen can be supplied to the semiconductor layer 108 and oxygen vacancies in the semiconductor layer 108 can be filled efficiently.

The insulating layer 118 having a function of inhibiting diffusion of impurities such as water and hydrogen and a function of inhibiting diffusion of oxygen is preferably a dense film. For example, a dense film can be obtained when a substrate temperature at the time of forming the insulating layer 118 is increased.

The substrate temperature at the time of forming the insulating layer 118 is preferably higher than or equal to 180° C. and lower than or equal to 400° C., further preferably higher than or equal to 200° C. and lower than or equal to 380° C., still further preferably higher than or equal to 220° C. and lower than or equal to 360° C., yet still further preferably higher than or equal to 240° C. and lower than or equal to 350° C. With the above substrate temperature, release of oxygen contained in the insulating layer 114 and the insulating layer 116 to the outside can be inhibited and the insulating layer 118 can be a dense film.

With such a structure, a transistor that has favorable electrical characteristics and extremely high reliability can be provided.

The above is the description of Structure example 1-1.

A structure example of a transistor whose structure is partly different from that of Structure example 1-1 shown above is described below. Note that description of the same portions as those in Structure example 1-1 shown above is omitted below in some cases. Furthermore, in drawings that are referred to later, the same hatching pattern is applied to portions having functions similar to those in Structure example 1-1 shown above, and the portions are not denoted by reference numerals in some cases.

Structure Example 1-2

Figure 6B:
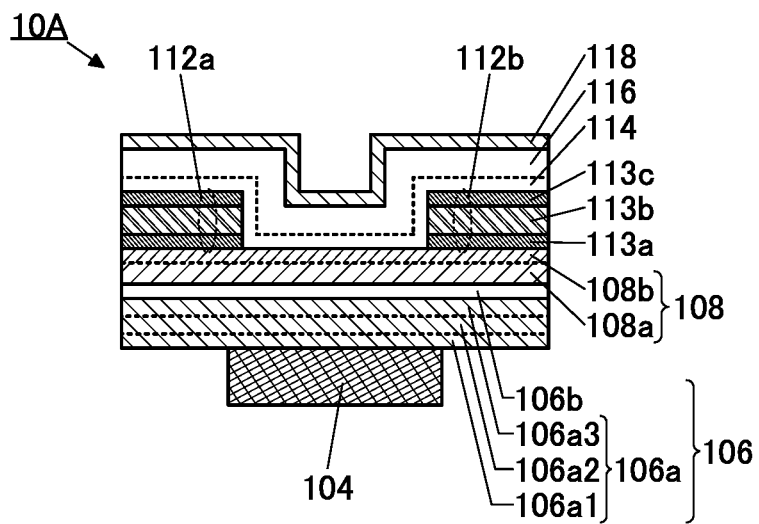

FIG. 6B shows a schematic cross-sectional view of a transistor 10A of one embodiment of the present invention in the channel length direction. The transistor 10A is different from the above-described transistor 10 mainly in the structure of the insulating layer 106a. In the transistor 10A, the insulating layer 106a has a stacked-layer structure of an insulating layer 106a1, an insulating layer 106a2 over the insulating layer 106a1, and an insulating layer 106a3 over the insulating layer 106a2.

FIG. 6B shows an example where the insulating layer 106 has a structure in which the insulating layer 106a1, the insulating layer 106a2, the insulating layer 106a3, and the insulating layer 106b are stacked in this order from the conductive layer 104 side. The insulating layer 106a1 is in contact with the conductive layer 104. The insulating layer 106b is in contact with the semiconductor layer 108.

The insulating layer 106a preferably satisfies at least one of the following characteristics, most preferably satisfies all of the following characteristics: inhibition of diffusion of impurities such as water, hydrogen, and sodium, inhibition of diffusion of the component of the conductive layer 104, low stress, high withstand voltage, and a small released amount of impurities such as water and hydrogen.

As each of the insulating layer 106a1, the insulating layer 106a2, and the insulating layer 106a3 positioned on the conductive layer 104 side, the insulating film that can be used as the insulating layer 106a can be used. The four insulating films included in the insulating layer 106 are preferably formed successively without exposure to the air with a plasma CVD apparatus.

The insulating layer 106a1 preferably functions as a barrier film that inhibits diffusion of impurities such as water, hydrogen, and sodium into the transistor 10 from a member (e.g., a substrate) on the formation surface side of the insulating layer 106a1. In addition, the insulating layer 106a1 preferably functions as a barrier film that inhibits diffusion of the component of the conductive layer 104 into the transistor 10. The insulating layer 106a2 preferably has low stress and high withstand voltage. The amount of impurities such as water and hydrogen released from the insulating layer 106a3 itself is preferably small. The insulating layer 106a3 preferably functions as a barrier film that inhibits diffusion of impurities such as water and hydrogen from below the insulating layer 106a2 into the transistor 10.

The insulating layer 106a1 and the insulating layer 106a3 are preferably dense films that can prevent diffusion of impurities from below them. An insulating film that is formed at a lower deposition rate than the insulating layer 106a2 can be used as each of the insulating layer 106a1 and the insulating layer 106a3. Meanwhile, an insulating film that has low stress and is formed at a high deposition rate is preferably used as the insulating layer 106a2. The insulating layer 106a2 preferably has a larger thickness than the insulating layer 106a1 and the insulating layer 106a3.

Even when the same kind of film, e.g., a silicon nitride film formed by a plasma CVD method, is used as the insulating layer 106a1, the insulating layer 106a2, and the insulating layer 106a3, the insulating layer 106a2 becomes a film whose film density is lower than that of the insulating layer 106a1 and the insulating layer 106a3. Thus, in a transmission electron microscope (TEM) image or the like of a cross section of the insulating layer 106, a difference in contrast can be observed in some cases. Note that a boundary between the insulating layer 106a1 and the insulating layer 106a2 and a boundary (interface) between the insulating layer 106a2 and the insulating layer 106a3 cannot be clearly observed in some cases. Then, in the drawings illustrating one embodiment of the present invention, the boundaries are denoted by dashed lines.

With such a structure, a transistor that has favorable electrical characteristics and extremely high reliability can be provided.

Structure Example 1-3

Figure 7A:
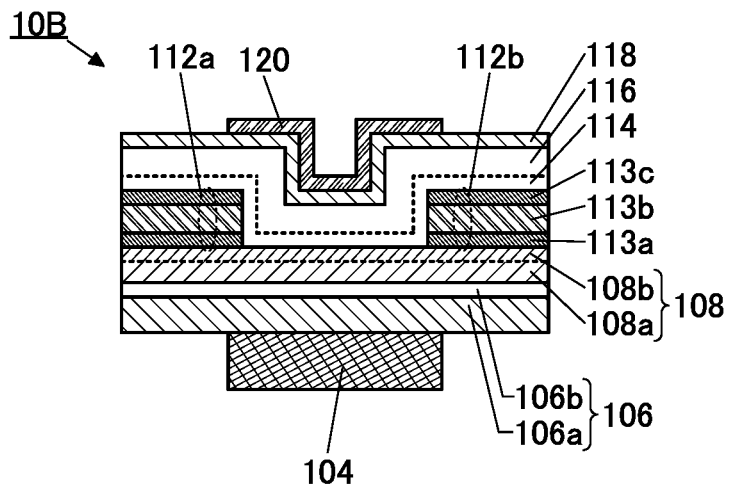
FIG. 7A and FIG. 7B are cross-sectional views showing structure examples of transistors.

FIG. 7A shows a schematic cross-sectional view of a transistor 10B of one embodiment of the present invention in the channel length direction. The transistor 10B is different from the above-described transistor 10 mainly in that a conductive layer 120 is provided over the insulating layer 118.

The semiconductor layer 108 is positioned between the conductive layer 104 and the conductive layer 120, and the conductive layer 104, the semiconductor layer 108, and the conductive layer 120 include a region where they overlap with one another. The transistor 10B is a dual-gate transistor including the conductive layer 104 functioning as a gate electrode and the conductive layer 120 functioning as a back gate electrode over and under the semiconductor layer 108. In the transistor 10B, part of the insulating layer 106 functions as a first gate insulating layer, and part of each of the insulating layer 114, the insulating layer 116, and the insulating layer 118 functions as a second gate insulating layer.

For example, when the same potential is supplied to the conductive layer 104 and the conductive layer 120, the amount of current that can flow in the transistor 10B in an on state can be increased. In the transistor 10B, a potential for controlling the threshold voltage can be supplied to one of the conductive layer 104 and the conductive layer 120, and a potential for controlling an on/off state of the transistor 10B can be supplied to the other.

With such a structure, a transistor that has favorable electrical characteristics and extremely high reliability can be provided.

Structure Example 1-4

Figure 7B:
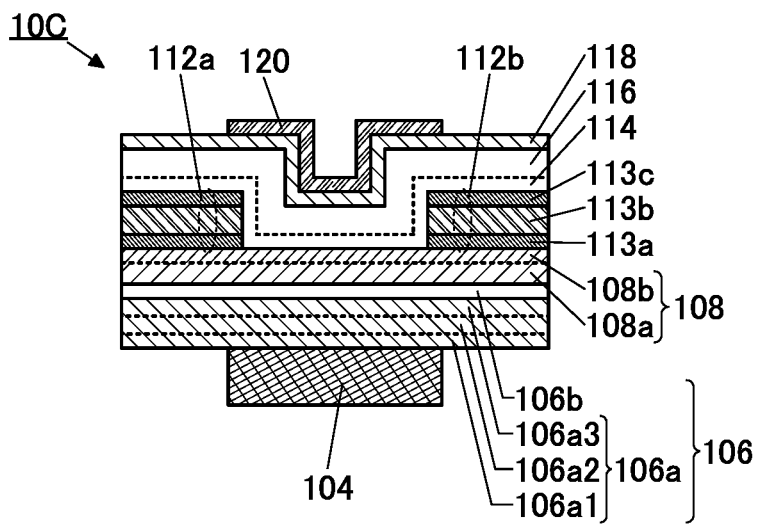

FIG. 7B shows a schematic cross-sectional view of a transistor 10C of one embodiment of the present invention in the channel length direction. The transistor 10C is different from the above-described transistor 10 mainly in the structure of the insulating layer 106 and in including the conductive layer 120. The transistor 10C is an example of the case where the conductive layer 120 in the transistor 10B described in Structure example 1-3 above is used in the transistor 10A described in Structure example 1-2 above.

With such a structure, a transistor that has favorable electrical characteristics and extremely high reliability can be provided.

Structure Example 2

A more specific structure example of a transistor is described below.

Structure Example 2-1

Figure 8A:
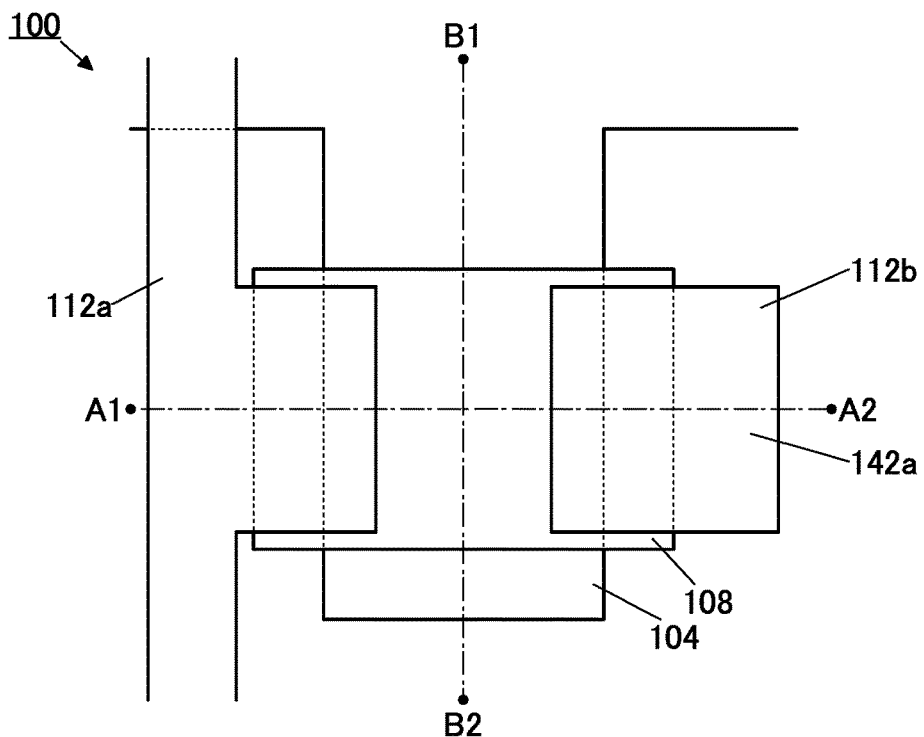
FIG. 8A is a top view showing a structure example of a transistor.
Figure 8B:
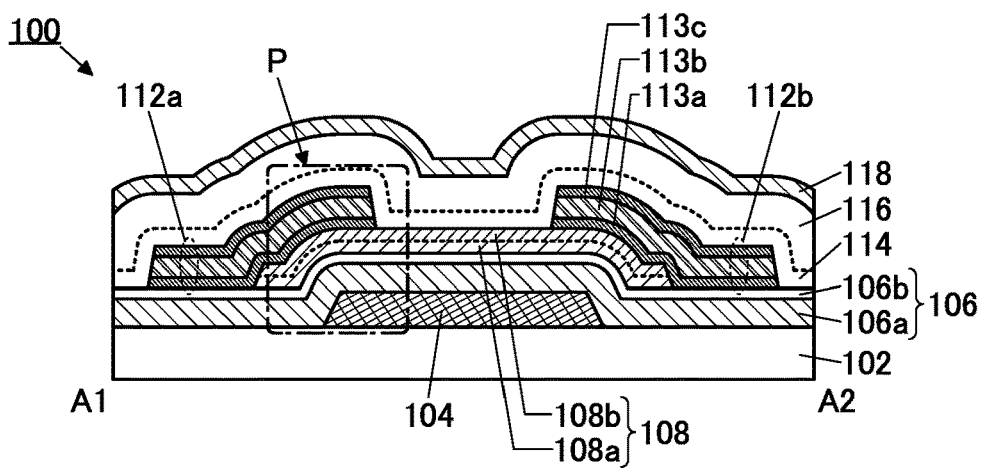
FIG. 8B and FIG. 8C are cross-sectional views showing the structure example of the transistor.
Figure 8C:
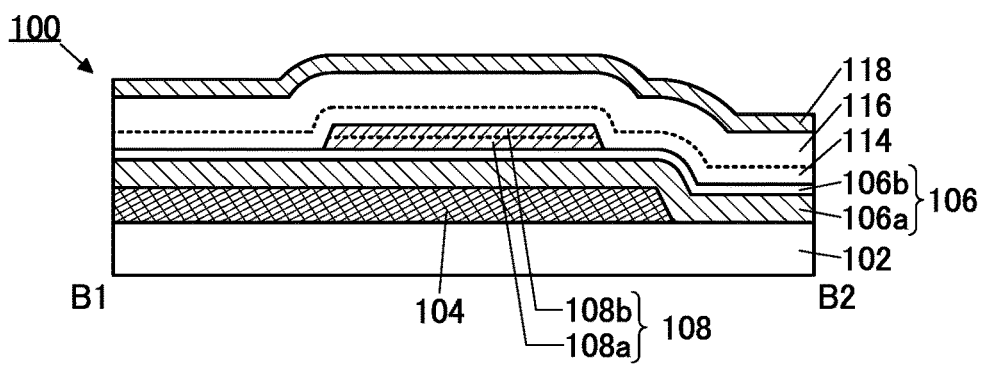
Figure 9A:
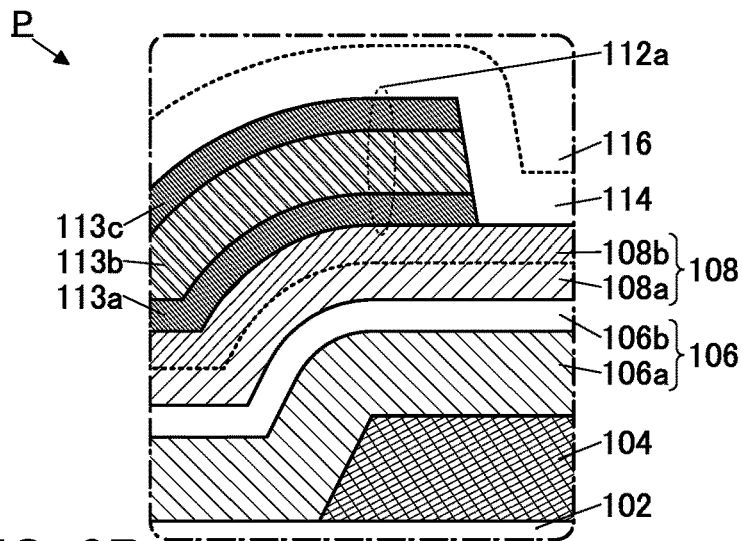
FIG. 9A, FIG. 9B, and FIG. 9C are cross-sectional views showing structure examples of transistors.

FIG. 8A is a top view of a transistor 100, FIG. 8B corresponds to a cross-sectional view of a cut plane along the dashed-dotted line A1-A2 shown in FIG. 8A, and FIG. 8C corresponds to a cross-sectional view of a cut plane along the dashed-dotted line B1-B2 shown in FIG. 8A. The direction of the dashed-dotted line A1-A2 corresponds to a channel length direction, and the direction of the dashed-dotted line B1-B2 corresponds to a channel width direction. Note that in FIG. 8A, some components (e.g., a gate insulating layer) of the transistor 100 are not illustrated. Some components are not illustrated in top views of transistors in the following drawings, as in FIG. 8A. FIG. 9A shows an enlarged cross-sectional view of a region P surrounded by a dashed-dotted line in FIG. 8B.

The transistor 100 is provided over a substrate 102 and includes the conductive layer 104, the insulating layer 106, the semiconductor layer 108, the conductive layer 112a, the conductive layer 112b, and the like. The insulating layer 106 is provided to cover the conductive layer 104. The semiconductor layer 108 has an island-like shape and is provided over the insulating layer 106. The conductive layer 112a and the conductive layer 112b are each in contact with a top surface of the semiconductor layer 108 and are apart from each other over the semiconductor layer 108. In addition, the insulating layer 114 is provided to cover the insulating layer 106, the conductive layer 112a, the conductive layer 112b, and the semiconductor layer 108, and the insulating layer 116 is provided over the insulating layer 114.

The conductive layer 104 functions as a gate electrode. Part of the insulating layer 106 functions as a gate insulating layer. The conductive layer 112a functions as one of a source electrode or a drain electrode, and the conductive layer 112b functions as the other of the source electrode or the drain electrode. A region of the semiconductor layer 108 that overlaps with the conductive layer 104 functions as a channel formation region. The transistor 100 is what is called a bottom-gate transistor, in which the gate electrode is provided more on the formation surface side than the semiconductor layer 108. Here, a side of the semiconductor layer 108 opposite to the conductive layer 104 side is sometimes referred to as a back channel side. The transistor 100 has what is called a channel-etched structure in which no protective layer is provided between the back channel side of the semiconductor layer 108 and the source and drain electrodes.

The semiconductor layer 108 has a stacked-layer structure in which a semiconductor layer 108a and a semiconductor layer 108b are stacked in this order from the formation surface side (substrate 102 side). Each of the semiconductor layer 108a and the semiconductor layer 108b preferably contains a metal oxide. The semiconductor layer 108b, which is positioned on the back channel side, preferably has higher crystallinity than the semiconductor layer 108a, which is positioned on the conductive layer 104 side. With this structure, the semiconductor layer 108 can be inhibited from being partly etched and lost at the time of processing of the conductive layer 112a and the conductive layer 112b.

The metal oxide having a composition described in Embodiment 1 is preferably used for the semiconductor layer 108, for example. The use of the metal oxide in a channel formation region allows the transistor to have high reliability and high field-effect mobility.

The metal oxide film described in Embodiment 1 is preferably used for each of the semiconductor layer 108a and the semiconductor layer 108b.

The semiconductor layer 108a and the semiconductor layer 108b may have the same composition or substantially the same compositions. When the semiconductor layer 108a and the semiconductor layer 108b have the same composition or substantially the same compositions, the semiconductor layer 108a and the semiconductor layer 108b can be formed using the same sputtering target, reducing the manufacturing cost.

As the semiconductor layer 108a and the semiconductor layer 108b, layers with different compositions, layers with different crystallinities, or layers with different impurity concentrations may be used. A stacked-layer structure of three or more layers may also be employed.

The conductive layer 112a and the conductive layer 112b each have a stacked-layer structure in which the conductive layer 113a, the conductive layer 113b, and the conductive layer 113c are stacked in this order from the formation surface side.

The conductive layer 113b is preferably formed using a low-resistance conductive material containing copper, silver, gold, aluminum, or the like. It is particularly preferable that the conductive layer 113b contain copper or aluminum. For the conductive layer 113b, a conductive material having lower resistance than the conductive layer 113a and the conductive layer 113c is preferably used. In that case, the conductive layer 112a and the conductive layer 112b can have extremely low resistance.

The conductive layer 113a and the conductive layer 113c can be each independently formed using a conductive material different from that of the conductive layer 113b. For example, it is preferable that the conductive layer 113a and the conductive layer 113c be each independently formed using a conductive material containing titanium, tungsten, molybdenum, chromium, tantalum, zinc, indium, platinum, ruthenium, or the like.

When the conductive layer 113b containing copper, aluminum, or the like is sandwiched between the conductive layer 113a and the conductive layer 113c as described above, it is possible to inhibit oxidation of a surface of the conductive layer 113b and diffusion of an element contained in the conductive layer 113b into neighboring layers. Specifically, provision of the conductive layer 113a between the semiconductor layer 108 and the conductive layer 113b can prevent diffusion of a metal element contained in the conductive layer 113b into the semiconductor layer 108, thereby enabling the transistor 100 to have high reliability.

Here, the insulating layer 114 is provided in contact with an end portion of the conductive layer 113b. According to one embodiment of the present invention, even when a conductive material that is easily oxidized is used for the conductive layer 113b and the insulating layer 114 that includes an oxide film is formed over the conductive layer 113b, a surface of the conductive layer 113b can be inhibited from being oxidized, as described later. Thus, another layer that contains an oxide or the like is not observed at the interface between the conductive layer 113b and the insulating layer 114, which is one of the features of one embodiment of the present invention.

Note that the structure of the conductive layer 112a and the conductive layer 112b is not limited to a three-layer structure and may be a two-layer structure or a four-layer structure including a conductive layer containing copper, silver, gold, or aluminum. For example, the conductive layer 112a and the conductive layer 112b may each have a two-layer structure in which the conductive layer 113a and the conductive layer 113b are stacked or a two-layer structure in which the conductive layer 113b and the conductive layer 113c are stacked.

Figure 9B:
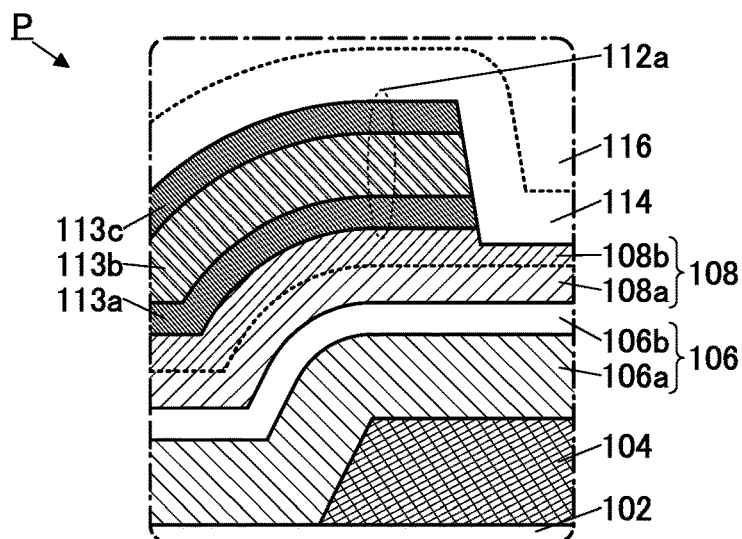

The surface of the semiconductor layer 108 might be damaged at the time of forming the conductive layer 112a and the conductive layer 112b. The damaged layer is preferably removed because $V_O$ is formed in the damaged semiconductor layer 108 and hydrogen in the semiconductor layer 108 enters $V_O$ to form $V_OH$ in some cases. Removing the damaged layer allows the transistor to have favorable electrical characteristics and high reliability. FIG. 9B shows an example of a structure in which the damaged layer is removed. FIG. 9B is an enlarged cross-sectional view of the region P surrounded by the dashed-dotted line in FIG. 8B. FIG. 9B shows an example in which the thickness of a region of the semiconductor layer 108b that overlaps with neither the conductive layer 112a nor the conductive layer 112b is smaller than the thickness of a region that overlaps with either the conductive layer 112a or the conductive layer 112b.

Although FIG. 9A and FIG. 9B show an example in which the end portions of the conductive layer 113a, the conductive layer 113b, and the conductive layer 113c are aligned with one another or substantially aligned with one another, one embodiment of the present invention is not limited thereto. It is not necessary that any of the end portions of the conductive layer 113a, the conductive layer 113b, and the conductive layer 113c is aligned with the others or substantially aligned with the others.

Figure 9C:
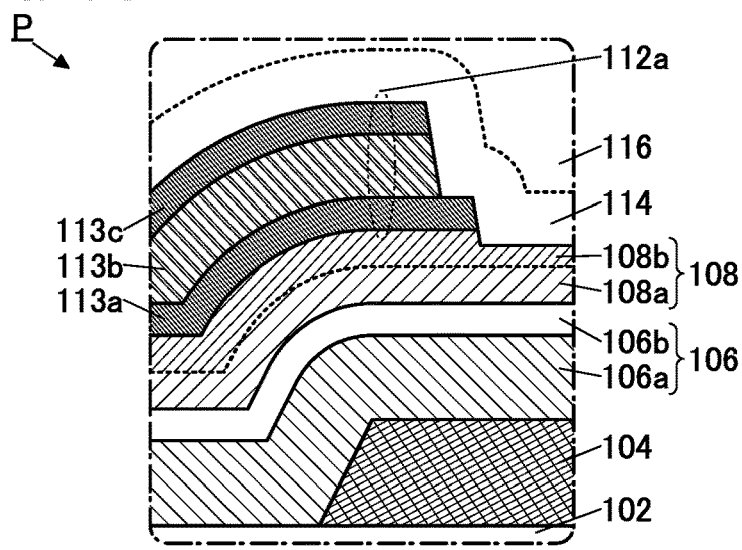

As shown in FIG. 9C, the end portions of the conductive layer 113b and the conductive layer 113c are preferably located inward from the end portion of the conductive layer 113a. The end portion of the conductive layer 113c is further preferably aligned with or substantially aligned with the end portion of the conductive layer 113b. With such a structure, the step coverage with the layers (e.g., the insulating layer 114) formed over the conductive layer 113a, the conductive layer 113b, the conductive layer 113c, and the semiconductor layer 108 is improved, which can inhibit generation of defects such as disconnection and voids in the layers.

FIG. 9C shows an example in which the end portion of the conductive layer 113b is located inward from that of the conductive layer 113a and the end portion of the conductive layer 113c is aligned with the end portion of the conductive layer 113b. FIG. 9C is an enlarged cross-sectional view of the region P surrounded by the dashed-dotted line in FIG. 8B. With the structure shown in FIG. 9C, steps in the conductive layer 112a and the conductive layer 112b become small and the step coverage with the layers (e.g., the insulating layer 118) formed over the conductive layer 112a, the conductive layer 112b, and the semiconductor layer 108a is improved, which can inhibit generation of defects such as disconnection and voids in the layers.

Although FIG. 9C shows an example in which the end portions of the conductive layer 113b and the conductive layer 113c are aligned with or substantially aligned with each other, one embodiment of the present invention is not limited thereto. It is not necessary that the end portions of the conductive layer 113b and the conductive layer 113c are aligned with or substantially aligned with each other. Note that in the case where the end portion of the conductive layer 113b is located inward from the end portion of the conductive layer 113c, the step coverage with the layers (e.g., the insulating layer 118) formed over the conductive layer 112a, the conductive layer 112b, and the semiconductor layer 108a might be poor, which might generate defects such as disconnection and voids in the layers. Thus, the end portion of the conductive layer 113c is preferably located inward from the end portion of the conductive layer 113b.

For the conductive layer 104, any of the above conductive materials that can be used for the conductive layer 113a and the conductive layer 113b can be used as appropriate. The use of a conductive material containing copper is particularly preferable.

For the insulating layer 106 and the insulating layer 114 that are in contact with the semiconductor layer 108, an insulating material containing an oxide is preferably used. In the case where the insulating layer 106 or the insulating layer 114 has a stacked-layer structure, an insulating material containing an oxide is used for a layer in contact with the semiconductor layer 108.

For the insulating layer 106, a nitride film of silicon nitride, aluminum nitride, or the like may be used. In the case where an insulating material containing no oxide is used, treatment for adding oxygen to an upper portion of the insulating layer 106 is preferably performed to form an oxygen-containing region. Examples of the treatment for adding oxygen include heat treatment or plasma treatment in an oxygen-containing atmosphere, and ion doping treatment.

The insulating layer 116 functions as a protective layer protecting the transistor 100. For the insulating layer 116, an inorganic insulating material such as silicon nitride, silicon nitride oxide, silicon oxide, silicon oxynitride, aluminum oxide, or aluminum nitride can be used. It is particularly preferable that a material less likely to diffuse oxygen, such as silicon nitride or aluminum oxide, be used for the insulating layer 116, in which case release of oxygen from the semiconductor layer 108 or the insulating layer 114 to the outside through the insulating layer 116 due to heat applied during the fabrication process or the like can be prevented.

For the insulating layer 116, an organic insulating material functioning as a planarization film may be used. Alternatively, a stacked-layer film that includes a film containing an inorganic insulating material and a film containing an organic insulating material may be used as the insulating layer 116.

In the semiconductor layer 108, a pair of low-resistance regions, which are positioned in portions in contact with the conductive layer 112a and the conductive layer 112b and in the vicinity thereof and function as a source region and a drain region, may be formed. The regions are part of the semiconductor layer 108 and have lower resistance than the channel formation region. The low-resistance regions can also be referred to as regions with high carrier concentrations, n-type regions, or the like. In the semiconductor layer 108, a region that is sandwiched between the pair of low-resistance regions and overlaps with the conductive layer 104 functions as a channel formation region.

The above is the description of Structure example 2-1.

Structure Example 2-2

A structure example of a transistor whose structure is partly different from that of Structure example 2-1 shown above is described below. Note that description of the same portions as those in Structure example 2-1 shown above is omitted below in some cases. Furthermore, in drawings that are referred to later, the same hatching pattern is applied to portions having functions similar to those in Structure example 2-1 shown above, and the portions are not denoted by reference numerals in some cases.

Figure 10A:
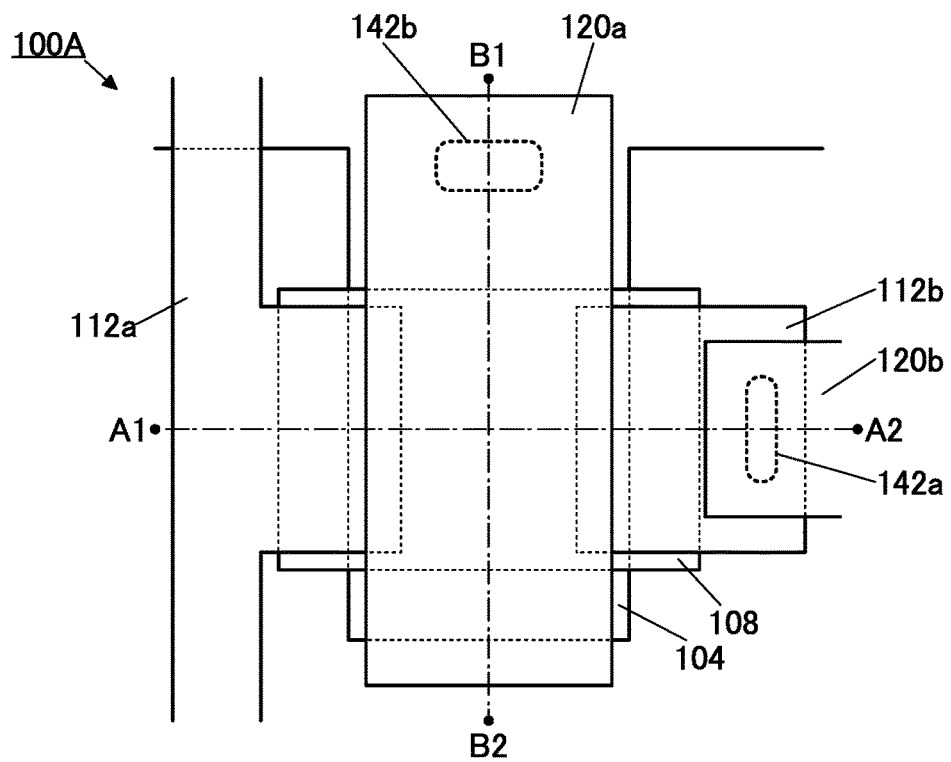
FIG. 10A is a top view showing a structure example of a transistor.
Figure 10B:
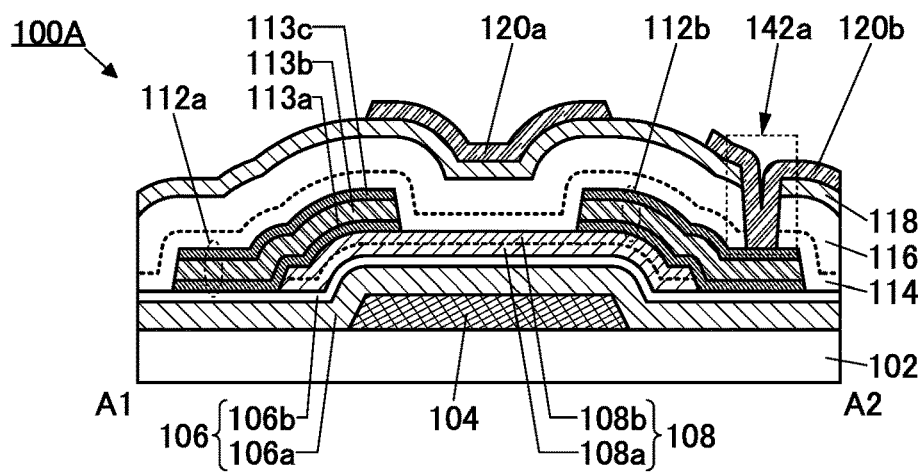
FIG. 10B and FIG. 10C are cross-sectional views showing the structure example of the transistor.
Figure 10C:
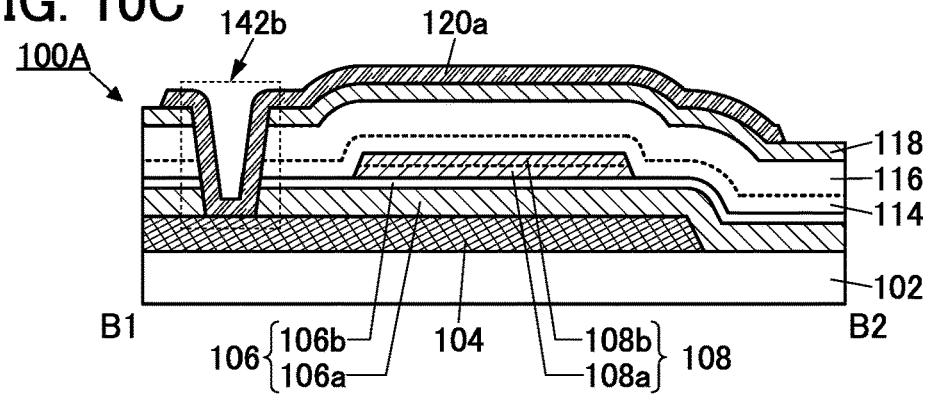

FIG. 10A is a top view of a transistor 100A, FIG. 10B is a cross-sectional view of a transistor 100B in the channel length direction, and FIG. 10C is a cross-sectional view in the channel width direction.

The transistor 100A is different from the transistor 100 in Structure example 2-1 mainly in that a conductive layer 120a and a conductive layer 120b are provided over the insulating layer 116.

The conductive layer 120a includes a region overlapping with the semiconductor layer 108 with the insulating layer 116 and the insulating layer 114 therebetween.

In the transistor 100A, the conductive layer 104 has a function of a first gate electrode (also referred to as a bottom gate electrode), and the conductive layer 120a has a function of a second gate electrode (also referred to as a top gate electrode). A portion of the insulating layer 116 and insulating layer 114 functions as a second gate insulating layer.

As shown in FIG. 10C, the conductive layer 120a may be electrically connected to the conductive layer 104 through an opening 142b provided in the insulating layer 116, the insulating layer 114, and the insulating layer 106. Accordingly, the same potential can be supplied to the conductive layer 120a and the conductive layer 104, which enables a transistor having high on-state current to be provided.

As shown in FIG. 10A and FIG. 10C, the conductive layer 104 and the conductive layer 120a preferably extend beyond the end portion of the semiconductor layer 108 in the channel width direction. In that case, as shown in FIG. 10C, the semiconductor layer 108 in the channel width direction is entirely surrounded by the conductive layer 104 and the conductive layer 120a.

With such a structure, the semiconductor layer 108 can be electrically surrounded by electric fields generated by the pair of gate electrodes. In that case, it is particularly preferable that the same potential be supplied to the conductive layer 104 and the conductive layer 120a. In that case, electric fields for inducing a channel can be effectively applied to the semiconductor layer 108, whereby the on-state current of the transistor 100A can be increased. Thus, the transistor 100A can also be miniaturized.

Note that a structure in which the conductive layer 104 and the conductive layer 120a are not connected to each other may be employed. In that case, a constant potential may be supplied to one of the pair of gate electrodes, and a signal for driving the transistor 100A may be supplied to the other. In that case, the potential supplied to one of the electrodes enables control of the threshold voltage at the time of driving the transistor 100A with the other electrode.

The conductive layer 120b is electrically connected to the conductive layer 112b through an opening 142a provided in the insulating layer 116 and the insulating layer 114. The conductive layer 120b can be used as a wiring or an electrode. When used in a display device, for example, the conductive layer 120b can function as a pixel electrode or a wiring for connection to a pixel electrode.

The above is the description of Structure example 2-2.

Structure Example 2-3

Figure 11A:
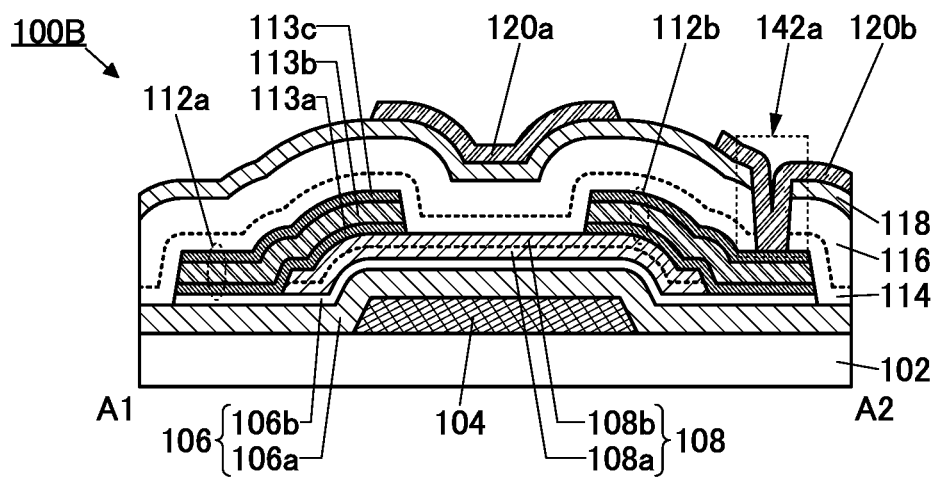
FIG. 11A and FIG. 11B are cross-sectional views showing a structure example of a transistor.
Figure 11B:
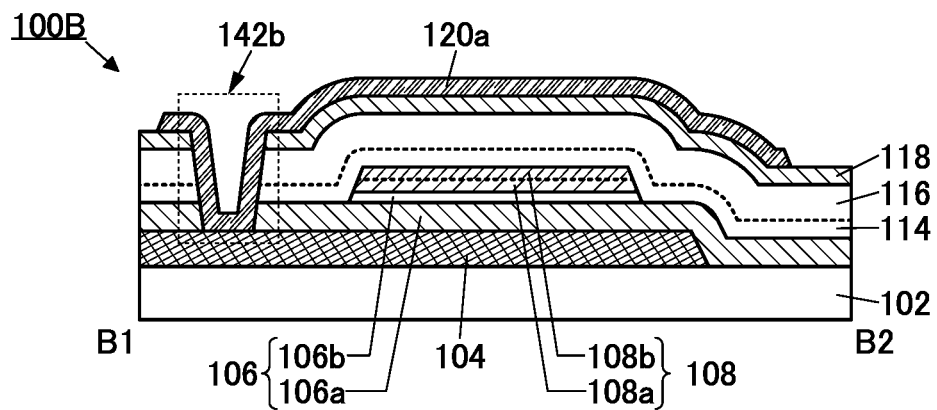

A transistor 100B shown in FIG. 11A and FIG. 11B is different from the transistor 100A in Structure example 2-2 above mainly in that the end portion of the insulating layer 106b is substantially aligned with the end portion of the conductive layer 112a or the end portion of the conductive layer 112b in a cross-sectional view in the channel length direction. In a cross-sectional view of the transistor 100B in the channel width direction, the end portion of the insulating layer 106b is substantially aligned with the end portion of the semiconductor layer 108.

The insulating layer 106a includes a region in contact with the insulating layer 106b in a region overlapping with the semiconductor layer 108, the conductive layer 112a, or the conductive layer 112b. In addition, the insulating layer 106a includes a region in contact with the insulating layer 114 in a region overlapping with neither the semiconductor layer 108, the conductive layer 112a, nor the conductive layer 112b.

The insulating layer 106a preferably functions as an etching stopper at the time of forming the conductive layer 112a and the conductive layer 112b. For example, in the case where an oxide film of silicon oxide, silicon oxynitride, or the like is used as the insulating layer 106b, an oxide film of aluminum oxide, aluminum oxynitride, hafnium oxide, hafnium oxynitride, gallium oxide, gallium oxynitride, yttrium oxide, yttrium oxynitride, or the like or a nitride film of silicon nitride, silicon nitride oxide, aluminum nitride, aluminum nitride oxide, or the like can be suitably used as the insulating layer 106a.

With the insulating layer 106a functioning as an etching stopper, steps in the end portions of the conductive layer 112a and the conductive layer 112b become small and the step coverage with the layers (e.g., the insulating layer 114) formed over the conductive layer 112a and the conductive layer 112b is improved, which can inhibit generation of defects such as disconnection and voids in the layers.

Although an example is shown in which the thickness of the insulating layer 106a in the region overlapping with none of the semiconductor layer 108, the conductive layer 112a, and the conductive layer 112b is substantially equal to the thickness of the insulating layer 106a in the region overlapping with the semiconductor layer 108, the conductive layer 112a, or the conductive layer 112b in FIG. 11A and FIG. 11B, one embodiment of the present invention is not limited thereto. The thickness of the insulating layer 106a in the region overlapping with neither the semiconductor layer 108, the conductive layer 112a, nor the conductive layer 112b may be smaller than the thickness of the insulating layer 106a in the region overlapping with the semiconductor layer 108, the conductive layer 112a, or the conductive layer 112b.

The above is the description of Structure example 2-3.

Structure Example 2-4

Figure 12A:
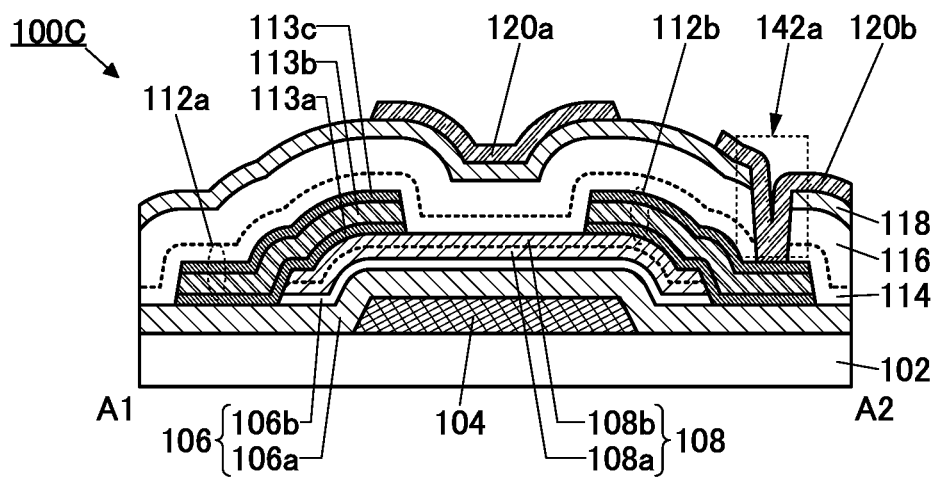
FIG. 12A and FIG. 12B are cross-sectional views showing a structure example of a transistor.
Figure 12B:
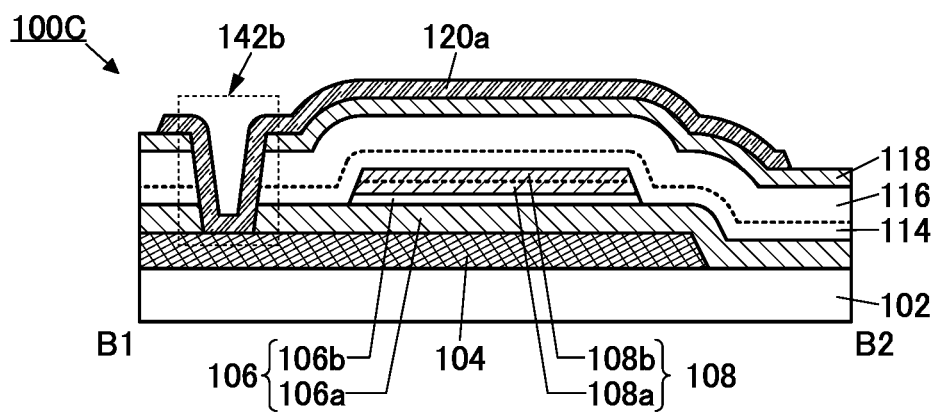
Figure 17:
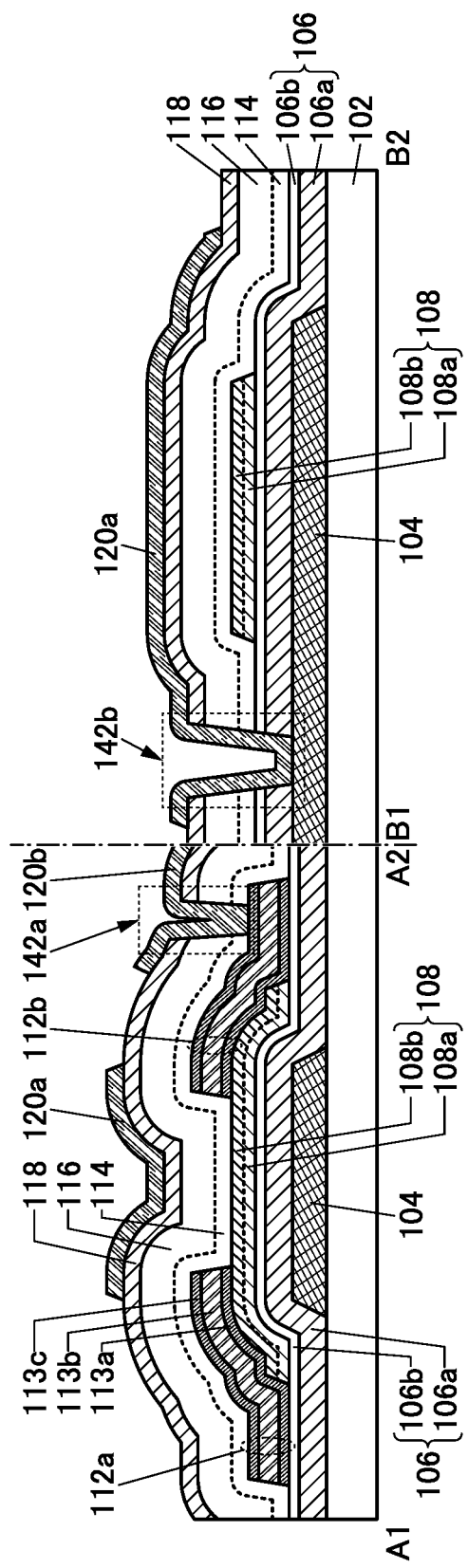
FIG. 17 is a cross-sectional view showing a method for fabricating a transistor.

A transistor 100C shown in FIG. 12A and FIG. 12B is different from the transistor 100A in Structure example 2-2 above mainly in that the end portion of the insulating layer 106b is substantially aligned with the end portion of the semiconductor layer 108 in a cross-sectional view in the channel length direction. In a cross-sectional view of the transistor 100B in the channel width direction, the end portion of the insulating layer 106b is substantially aligned with the end portion of the semiconductor layer 108.

The insulating layer 106a includes a region in contact with the insulating layer 106b in a region overlapping with the semiconductor layer 108. In addition, the insulating layer 106a includes a region in contact with the insulating layer 114 in a region overlapping with neither the semiconductor layer 108, the conductive layer 112a, nor the conductive layer 112b.

The insulating layer 106a preferably functions as an etching stopper at the time of forming the semiconductor layer 108. With the insulating layer 106a functioning as an etching stopper, a step in the end portion of the semiconductor layer 108 becomes small and the step coverage with the layers (e.g., the conductive layer 112a and the conductive layer 112b) formed over the semiconductor layer 108 is improved, which can inhibit generation of defects such as disconnection and voids in the layers.

Although an example is shown in which the thickness of the insulating layer 106a in the region not overlapping with the semiconductor layer 108 is substantially the same as the thickness of the insulating layer 106a in the region overlapping with the semiconductor layer 108 in FIG. 12A and FIG. 12B, one embodiment of the present invention is not limited thereto. The thickness of the insulating layer 106a in the region not overlapping with the semiconductor layer 108 may be smaller than the thickness of the insulating layer 106a in the region overlapping with the semiconductor layer 108.

The above is the description of Structure example 2-4.

Fabrication Method Example 1

A method for fabricating the semiconductor device of one embodiment of the present invention is described below with reference to drawings. Here, description is made giving, as an example, the transistor 100A described above in Structure example 2-2.

Note that thin films that form the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by spin coating, dipping, spray coating, ink-jetting, dispensing, screen printing, offset printing, a doctor knife, a slit coater, a roll coater, a curtain coater, a knife coater, or the like.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

FIG. 13 to FIG. 17 are drawings illustrating a method for fabricating the transistor 100A. In each drawing, a cross section in the channel length direction is shown on the left side, and a cross section in the channel width direction is shown on the right side.

[Formation of Conductive Layer 104]

A conductive film is formed over the substrate 102, a resist mask is formed by a lithography process over the conductive film, and then the conductive film is etched, whereby the conductive layer 104 functioning as a gate electrode is formed.

[Formation of Insulating Layer 106]

Next, the insulating layer 106 covering the conductive layer 104 and the substrate 102 is formed (FIG. 13A). The insulating layer 106 can be formed by a PECVD method or the like, for example.

Heat treatment may be performed after the formation of the insulating layer 106. By the heat treatment, water or hydrogen can be released from the surface and inside of the insulating layer 106.

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the insulating layer 106 can be prevented as much as possible. An oven, a rapid thermal annealing (RTA) apparatus, or the like can be used for the heat treatment. The use of the RTA apparatus can shorten the heat treatment time.

Next, treatment for supplying oxygen to the insulating layer 106 may be performed. As the oxygen supply treatment, an oxygen radical, an oxygen atom, an oxygen atomic ion, an oxygen molecular ion, or the like is supplied to the insulating layer 106 by an ion doping method, an ion implantation method, plasma treatment, or the like. Alternatively, a film that inhibits oxygen release may be formed over the insulating layer 106, and then oxygen may be added to the insulating layer 106 through the film. It is preferable to remove the film after addition of oxygen. As the above film that inhibits oxygen release, a conductive film or a semiconductor film containing one or more of indium, zinc, gallium, tin, aluminum, chromium, tantalum, titanium, molybdenum, nickel, iron, cobalt, and tungsten can be used.

[Formation of Semiconductor Layer 108]

Next, a metal oxide film 108af and a metal oxide film 108bf are formed to be stacked over the insulating layer 106 (FIG. 13B).

The metal oxide film 108af and the metal oxide film 108bf are each preferably formed by a sputtering method using a metal oxide target.

In forming the metal oxide film 108af and the metal oxide film 108bf, an oxygen gas and an inert gas (e.g., a helium gas, an argon gas, or a xenon gas) may be mixed. Note that the proportion of the oxygen gas in the whole deposition gas (hereinafter, also referred to as an oxygen flow rate ratio) in forming the metal oxide film can be in the range of 0% to 100% inclusive.

When a metal oxide film with relatively low crystallinity is formed with a low oxygen flow rate ratio, a metal oxide film having high conductivity can be obtained. By contrast, when a metal oxide film with relatively high crystallinity is formed with a high oxygen flow rate ratio, a metal oxide film having high etching resistance and electrical stability can be obtained.

Here, the metal oxide film 108af positioned on the conductive layer 104 (functioning as a gate electrode) side is a film with low crystallinity, whereas the metal oxide film 108bf positioned on the back channel side is a film with high crystallinity, which enables a transistor to have high reliability and high field-effect mobility.

The metal oxide film 108af and the metal oxide film 108bf are formed under the conditions where a substrate temperature is higher than or equal to room temperature and lower than or equal to 200° C., preferably higher than or equal to room temperature and lower than or equal to 140° C., for example. The substrate temperature during formation of the metal oxide film is preferably, for example, higher than or equal to room temperature and lower than 140° C. because the productivity is increased.

More specifically, the oxygen flow rate during formation of the metal oxide film 108af is preferably higher than or equal to 0% and lower than 50%, further preferably higher than or equal to 5% and lower than or equal to 30%, still further preferably higher than or equal to 5% and lower than or equal to 20%, typically 10%. The oxygen flow rate ratio during formation of the metal oxide film 108bf is preferably higher than or equal to 50% and lower than or equal to 100%, further preferably higher than or equal to 60% and lower than or equal to 100%, still further preferably higher than or equal to 70% and lower than or equal to 100%, yet still further preferably higher than or equal to 80% and lower than or equal to 100%, typically 100%.

The metal oxide film 108af and the metal oxide film 108bf can be films with the same composition or substantially the same compositions. The metal oxide film 108af and the metal oxide film 108bf can be formed using the same sputtering target; thus, the manufacturing cost can be reduced. When the same sputtering target is used, the metal oxide film 108af and the metal oxide film 108bf can be formed successively in the same deposition apparatus in a vacuum, which can inhibit entry of impurities into the interface between the semiconductor layer 108a and the semiconductor layer 108b. Although conditions during the formation, such as pressure, temperature, and power, may vary between the metal oxide film 108af and the metal oxide film 108bf, it is preferable to employ the same conditions except for the oxygen flow rate ratio because the time required for the formation steps can be shortened.

Note that the metal oxide film 108af and the metal oxide film 108bf may be films with different compositions from each other. In that case, when an In—Ga—Zn oxide is used for both the metal oxide film 108af and the metal oxide film 108bf, an oxide target in which the proportion of the contained In is higher than that in the metal oxide film 108af is preferably used for the metal oxide film 108bf.

After the formation of the metal oxide film 108af and the metal oxide film 108bf, a resist mask is formed over the metal oxide film 108bf, the metal oxide film 108af and the metal oxide film 108bf are processed by etching, and then the resist mask is removed, whereby the island-shaped semiconductor layer 108 in which the semiconductor layer 108a and the semiconductor layer 108b are stacked can be formed (FIG. 13C).

For processing of the metal oxide film 108af and the metal oxide film 108bf, one or both of a wet etching method and a dry etching method can be used.

At the time of forming the semiconductor layer 108, the thickness of the insulating layer 106 in a region not overlapping with the semiconductor layer 108 is sometimes smaller than the thickness of the insulating layer 106 in a region overlapping with the semiconductor layer 108.

Heat treatment may be performed after the metal oxide film 108af and the metal oxide film 108bf are formed or processed into the semiconductor layer 108. By the heat treatment, hydrogen or water can be removed from the surfaces and inside of the metal oxide films 108af and 108bf or the semiconductor layer 108. In addition, by the heat treatment, the etching rate of the metal oxide films 108af and 108bf or the semiconductor layer 108 is lowered, which can inhibit the semiconductor layer 108 from being lost in a later step (e.g., the formation of the conductive layer 112a and the conductive layer 112b).

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas and nitrogen. Alternatively, heating may be performed in the atmosphere, and then heating may further be performed in an oxygen-containing atmosphere. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the semiconductor layer 108 can be prevented as much as possible. An oven, a rapid thermal annealing (RTA) apparatus, or the like can be used for the heat treatment. The use of the RTA apparatus can shorten the heat treatment time.

[Formation of Conductive Layer 112a and Conductive Layer 112b]

Next, a conductive film 113af, a conductive film 113bf, and a conductive film 113cf covering the insulating layer 106 and the semiconductor layer 108 are formed to be stacked.

The conductive film 113bf is a film to be the conductive layer 113b later and preferably contains copper, silver, gold, or aluminum. The conductive film 113af and the conductive film 113cf are films to be the conductive layer 113a and the conductive layer 113b later, respectively, and each preferably independently contain titanium, tungsten, molybdenum, chromium, tantalum, zinc, indium, platinum, ruthenium, or the like.

The conductive film 113af, the conductive film 113bf, and the conductive film 113cf are preferably formed by a formation method such as a sputtering method, an evaporation method, or a plating method.

Then, a resist mask 140 is formed over the conductive film 113cf (FIG. 14A).

Next, the conductive film 113cf, the conductive film 113bf, and the conductive film 113af are etched using the resist mask 140 as a mask, whereby the conductive layer 112a and the conductive layer 112b each having a structure in which the conductive layer 113a, the conductive layer 113b, and the conductive layer 113c are stacked can be formed (FIG. 14B).

The conductive layer 112a and the conductive layer 112b are preferably processed to be apart from each other over a channel formation region of the semiconductor layer 108, as shown in FIG. 14B. In other words, the conductive layer 112a and the conductive layer 112b are preferably processed such that the end portions of them, which are opposite to each other, overlap with both the conductive layer 104 and the semiconductor layer 108. Accordingly, the on-state current of the transistor can be increased.

At the time of forming the conductive layer 112a and the conductive layer 112b, the thickness of the semiconductor layer 108 in a region overlapping with neither the conductive layer 112a nor the conductive layer 112b is sometimes smaller than the thickness of the semiconductor layer 108 in a region overlapping with the conductive layer 112a and the conductive layer 112b.

At the time of forming the conductive layer 112a and the conductive layer 112b, the thickness of the insulating layer 106 in the region overlapping with neither the conductive layer 112a nor the conductive layer 112b is sometimes smaller than the thickness of the insulating layer 106 in the region overlapping with the conductive layer 112a and the conductive layer 112b.

The conductive film 113cf, the conductive film 113bf, and the conductive film 113af can each be etched by wet etching, dry etching, or the like. The three layers can be etched at a time in one step, or each of the three layers may be sequentially etched in a different process.

[Cleaning Treatment 1]

Next, cleaning treatment is preferably performed. Examples of the cleaning treatment include wet cleaning using a cleaning solution or the like, plasma treatment using plasma, and cleaning by heat treatment, and any of these cleanings may be performed in combination as appropriate. As the cleaning treatment, wet cleaning using phosphoric acid can be particularly favorably used The surface of the semiconductor layer 108 might be damaged at the time of forming the conductive film 113cf, the conductive film 113bf, and the conductive film 113af and at the time of forming the conductive layer 112a and the conductive layer 112b. In some cases, $V_O$ is formed in the damaged semiconductor layer 108 and hydrogen in the semiconductor layer 108 enters $V_O$ to form $V_OH$. The damaged layer can be removed by performing the cleaning treatment after the formation of the conductive layer 112a and the conductive layer 112b.

By performing the cleaning treatment, metal, an organic substance, and the like attached on the surface of the semiconductor layer 108 at the time of forming the conductive layer 112a and the conductive layer 112b can be removed.

As shown in FIG. 14B, the cleaning treatment is preferably performed in the state where the top surfaces of the conductive layer 112a and the conductive layer 112b are covered with the resist mask 140. When the cleaning treatment is performed in the state where the top surfaces of the conductive layer 112a and the conductive layer 112b are covered with the resist mask 140, the conductive layer 113c can be inhibited from being lost, for example. In addition, when the cleaning treatment is performed in the state where the top surfaces of the conductive layer 112a and the conductive layer 112b are covered with the resist mask 140, the area of the conductive layer 112a and the conductive layer 112b exposed at the time of the cleaning treatment can be reduced, which can inhibit attachment of components of the conductive layer 112a and the conductive layer 112b to the semiconductor layer 108.

Next, the resist mask 140 is removed (FIG. 15A).

Note that the above cleaning treatment may be performed after the resist mask 140 is removed.

[Cleaning Treatment 2]

Next, cleaning treatment is preferably performed. Examples of the cleaning treatment include wet cleaning using a cleaning solution or the like, plasma treatment using plasma, and cleaning by heat treatment, and any of these cleanings may be performed in combination as appropriate.

As the cleaning treatment, plasma treatment can be suitably used. FIG. 15B schematically shows a state in which the surfaces of the semiconductor layer 108, the conductive layer 112a, the conductive layer 112b, and the insulating layer 106 are exposed to plasma 130.

A mixed gas including an oxidizing gas and a reducing gas is particularly preferably used for the plasma treatment. With the use of an oxidizing gas and a reducing gas for the plasma treatment, oxidation of the conductive layer 112a and the conductive layer 112b can be inhibited and water, hydrogen, a component of an organic substance, or the like adsorbed on the surface of the semiconductor layer 108 can be effectively removed. As the oxidizing gas, the above-described gas can be used. As the reducing gas, the above-described gas can be used.

The flow rate ratio of the oxidizing gas to the reducing gas in the plasma treatment can be set in accordance with how easily the conductive layer 113a, the conductive layer 113b, and the conductive layer 113c are oxidized, and the flow rate of the reducing gas is preferably at least lower than or equal to the flow rate of the oxidizing gas. When the flow rate of the reducing gas is much lower than the flow rate of the oxidizing gas, the oxidation reaction of the surface of the conductive layer 113b and the like becomes predominant, and an oxide is likely to be formed on the surface. By contrast, when the flow rate of the reducing gas is much higher than the flow rate of the oxidizing gas, the surface of the semiconductor layer 108 might be reduced, and the components of the reducing gas (e.g., hydrogen) might be supplied into the semiconductor layer 108.

In the plasma treatment, the flow rate of the reducing gas with respect to the flow rate of the oxidizing gas is preferably within the above range. Although the surfaces of the conductive layer 113c, the conductive layer 113b, and the conductive layer 113a are also exposed to the plasma 130 in the plasma treatment, the reducing gas included in the gas used for the plasma treatment immediately reduces the surfaces even when the surfaces are oxidized; thus, the formation of an oxide is inhibited. This can effectively remove water, hydrogen, a component of an organic substance, or the like adsorbed on the surface of the semiconductor layer 108 while inhibiting oxidation of the conductive layer 113b even when a material that is easily oxidized, such as copper or aluminum, is used for the conductive layer 113b, for example.

Here, the case where the reducing gas is not included in the gas used for the plasma treatment is described. In the case where the reducing gas is not included and the conductive layer 113b is exposed to plasma, an oxide might be formed in part of the conductive layer 113b. In the case where a material that is easily oxidized is used also for the conductive layer 113a and the conductive layer 113c, an oxide is formed also on their surfaces. The oxidation of at least one of the conductive layer 113a, the conductive layer 113b, and the conductive layer 113c increases resistance, which might adversely affect the electrical characteristics or reliability of the transistor. An oxide formed on the surface of the conductive layer 113a, the conductive layer 113b, or the conductive layer 113c might contaminate the surface of the semiconductor layer 108b when a portion thereof is scattered during the plasma treatment or in the later formation of the insulating layer 114. An oxide attached to the semiconductor layer 108b can function as a donor or an acceptor, which might adversely affect the electrical characteristics or reliability of the transistor. In the case where a copper element diffuses into the semiconductor layer 108, for example, the copper element functions as a carrier trap and might degrade the electrical characteristics or reliability of the transistor.

By contrast, in the case where the reducing gas is included in the gas used for the plasma treatment, even when the surfaces of the conductive layer 113c, the conductive layer 113b, and the conductive layer 113a, especially the side surface of the conductive layer 113b, are exposed, the oxidation of the surfaces can be inhibited. Thus, the oxidation of the conductive layer 112a and the conductive layer 112b can be inhibited and water, hydrogen, a component of an organic substance, or the like adsorbed on the surface of the semiconductor layer 108 can be effectively removed, which allows the transistor to have high reliability.

The treatment time of the plasma treatment is preferably adjusted. In the case where the time of the plasma treatment is long, the oxidation reaction due to the oxidizing gas proceeds, and the conductive layer 113a, the conductive layer 113b, and the conductive layer 113c might be oxidized. In addition, in the case where the time of the plasma treatment is long, the reduction reaction due to a second gas proceeds, and the surface of the semiconductor layer 108 might be reduced. Thus, the time of the plasma treatment is preferably adjusted such that the oxidation of the conductive layer 113a, the conductive layer 113b, and the conductive layer 113c and the reduction of the surface of the semiconductor layer 108 can be inhibited. The time of the plasma treatment is preferably longer than or equal to 5 sec and shorter than or equal to 180 sec, further preferably longer than or equal to 10 sec and shorter than or equal to 120 sec, still further preferably longer than or equal to 15 sec and shorter than or equal to 60 sec, for example. The treatment time in the above range enables the transistor to have favorable electrical characteristics and high reliability.

[Formation of Insulating Layer 114]

Next, the insulating layer 114 is formed to cover the conductive layer 112a, the conductive layer 112b, the semiconductor layer 108, and the insulating layer 106.

The insulating layer 114 is preferably formed in, for example, an oxygen-containing atmosphere. It is particularly preferable that the insulating layer 114 be formed by a plasma CVD method in an oxygen-containing atmosphere. Thus, the insulating layer 114 with few defects can be formed. It is preferable that the amount of ammonia released from the insulating layer 114 be large and the amount of nitrogen oxide released from the insulating layer 114 be small. When the insulating layer 114 from which a large amount of ammonia is released and a small amount of nitrogen oxide is released is used, a change in the threshold voltage of the transistor can be inhibited, which can reduce a change in the electrical characteristics of the transistor.

As the insulating layer 114, for example, an oxide film such as a silicon oxide film or a silicon oxynitride film is preferably formed with a plasma-enhanced chemical vapor deposition apparatus (a PECVD apparatus or simply referred to as a plasma CVD apparatus). In that case, a mixed gas including a deposition gas containing silicon and an oxidizing gas is preferably used as a source gas. It is preferable that the source gas further contain ammonia. The insulating layer 114 formed using a mixed gas containing ammonia can be the insulating layer 114 from which a large amount of ammonia is released. As the deposition gas containing silicon, the above-described gas can be used. As the oxidizing gas, the above-described gas can be used.

In the case where silicon oxynitride is used for the insulating layer 114, for example, the insulating layer 114 can be formed using a mixed gas containing monosilane, dinitrogen monoxide, and ammonia.

In the formation of the insulating layer 114, the flow rate of the oxidizing gas with respect to the flow rate of the deposition gas is preferably within the above range. In addition, the flow rate of the ammonia gas with respect to the flow rate of the oxidizing gas is preferably within the above range. With the flow rates in the above ranges, the insulating layer 114 from which a large amount of ammonia is released can be obtained. Since the amount of nitrogen oxide released from the insulating layer 114 is reduced, a transistor with a small change in the threshold voltage can be obtained. In addition, with the above-described flow rates of the gases, the insulating layer 114 with few defects can be formed even when the pressure in the treatment chamber is relatively high.

The pressure in the treatment chamber at the time of forming the insulating layer 114 is preferably within the above range. With the pressure in the above range, the insulating layer 114 from which a small amount of nitrogen oxide is released and in which the amount of defects is small can be formed.

The insulating layer 114 may be formed by a PECVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and power can be used for dissociation and ionization of more molecules; thus, plasma with a high density (high-density plasma) can be excited. Thus, little plasma damage to the formation surface and a deposit is caused, so that the insulating layer 114 with few defects can be formed.

After the plasma treatment is performed, the formation of the insulating layer 114 is preferably performed successively without exposure of the substrate 102 to the air. The plasma treatment is preferably performed in the deposition apparatus for the insulating layer 114, for example. In that case, the plasma treatment is preferably performed in the treatment chamber where the insulating layer 114 is formed. Alternatively, a structure may be employed in which the plasma treatment is performed in a treatment chamber connected to the above treatment chamber via a gate valve or the like and then transportation to the treatment chamber for the insulating layer 114 is performed without exposure to the air and under reduced pressure. In the case where the plasma treatment and the formation of the insulating layer 114 are successively performed in the same treatment chamber of the same apparatus, the plasma treatment and the formation of the insulating layer 114 are preferably performed at the same temperature.

A case where the plasma treatment and the formation of the insulating layer 114 are performed using a plasma-enhanced chemical vapor deposition apparatus is described as an example. Here, the insulating layer 114 is silicon oxynitride.

In the plasma treatment, a mixed gas including an oxidizing gas of dinitrogen monoxide ($N_2O$) and a reducing gas of ammonia can be used, and in the formation of the insulating layer 114, a mixed gas including a deposition gas of monosilane, an oxidizing gas of dinitrogen monoxide ($N_2O$), and ammonia can be used. Here, in the plasma treatment and the formation of the insulating layer 114, dinitrogen monoxide ($N_2O$) and ammonia can be used in common. That is, the plasma treatment is performed using dinitrogen monoxide ($N_2O$) and ammonia; and then, a monosilane gas is supplied, whereby the insulating layer 114 can be formed. Since the plasma treatment and the formation of the insulating layer 114 can be performed successively in the same treatment chamber in this manner, impurities at the interface between the semiconductor layer 108 and the insulating layer 114 can be reduced; thus, the interface can be favorable.

After the formation of the insulating layer 114, treatment for supplying oxygen to the insulating layer 114 may be performed. As the treatment for supplying oxygen, a method similar to that for the insulating layer 106 can be used.

[Formation of Insulating Layer 116]

Next, the insulating layer 116 is formed to cover the insulating layer 114 (FIG. 16A).

For the insulating layer 116, an insulating film that is less likely to diffuse oxygen, hydrogen, water, or the like than the insulating layer 114 is preferably used. With the insulating layer 116 that is less likely to diffuse oxygen, oxygen in the semiconductor layer 108 can be prevented from being released to the outside through the insulating layer 114. Furthermore, with the insulating layer 116 that is less likely to diffuse hydrogen, hydrogen, water, or the like can be prevented from diffusing to the semiconductor layer 108 or the like from the outside.

After the insulating layer 116 is formed, heat treatment is preferably performed. By the heat treatment, oxygen contained in the insulating layer 114 and the insulating layer 116 is diffused into the semiconductor layer 108, and the oxygen can reduce oxygen vacancies ($V_O$) and $V_OH$ in the semiconductor layer 108 (oxygen addition). Specifically, oxygen diffusing into the semiconductor layer 108 fills oxygen vacancies ($V_O$). Oxygen diffusing into the semiconductor layer 108 deprives $V_OH$ of hydrogen to be released as a water molecule ($H_2O$), and $V_OH$ that is deprived of hydrogen becomes oxygen vacancies ($V_O$). Furthermore, the oxygen vacancies ($V_O$) generated by depriving $V_OH$ of hydrogen are filled with another oxygen reaching the semiconductor layer 108. Reductions in the oxygen vacancies ($V_O$) and $V_OH$ in the semiconductor layer 108 result in a highly reliable transistor.

Oxygen diffusing into the semiconductor layer 108 reacts with hydrogen remaining in the semiconductor layer 108 to be released as a water molecule ($H_2O$). That is, hydrogen can be removed from the semiconductor layer 108 (dehydration or dehydrogenation). This can inhibit generation of $V_OH$ caused by bonding of hydrogen remaining in the semiconductor layer 108 to the oxygen vacancies ($V_O$).

The heat treatment can remove hydrogen and water contained in the insulating layer 116 and the insulating layer 114. In addition, the heat treatment can reduce defects contained in the insulating layer 116 and the insulating layer 114.

Moreover, by the heat treatment, nitrogen oxide contained in the insulating layer 114 and the insulating layer 116 reacts with ammonia contained in the insulating layer 114, so that the amount of nitrogen oxide contained in the insulating layer 114 and the insulating layer 116 is reduced. A reduction in the amount of nitrogen oxide can inhibit a change in the threshold voltage of the transistor, which can reduce a change in the electrical characteristics of the transistor.

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the insulating layer 116 or the like can be prevented as much as possible. An oven, a rapid thermal annealing (RTA) apparatus, or the like can be used for the heat treatment. The use of the RTA apparatus can shorten the heat treatment time.

[Formation of Insulating Layer 118]

Next, the insulating layer 118 is formed to cover the insulating layer 116 (FIG. 16B).

As the insulating layer 118, an insulating film that is less likely to diffuse oxygen, hydrogen, water, or the like than the insulating layer 114 and the insulating layer 116 is preferably used. The insulating layer 118 that is less likely to diffuse oxygen can inhibit release of oxygen in the insulating layer 116, the insulating layer 114, and the semiconductor layer 108 to the outside. Furthermore, the insulating layer 118 that is less likely to diffuse hydrogen can inhibit diffusion of hydrogen, water, or the like to the semiconductor layer 108 or the like from the outside. It is particularly suitable to use silicon nitride for the insulating layer 118.

[Formation of Conductive Layer 120a and Conductive Layer 120b]

Next, the insulating layer 118, the insulating layer 116, and the insulating layer 114 are partly etched, whereby the opening 142a reaching the conductive layer 112b and the opening 142b reaching the conductive layer 104 are formed.

Then, after a conductive film is formed to cover the opening 142a and the opening 142b, the conductive film is processed, whereby the conductive layer 120a and the conductive layer 120b can be formed (FIG. 17A).

Through the above process, the transistor 100A can be fabricated.

Fabrication Method Example 2

A fabrication method of the transistor 100A that is different from the fabrication method in <Fabrication method example 1> shown above is described. Note that description of the same portions as the above is omitted and different portions are described.

First, as in <Fabrication method example 1>, the steps up to the formation of the insulating layer 116 are performed. The description of FIG. 13A to FIG. 16A can be referred to for the steps up to the formation of the insulating layer 116; thus, the detailed description thereof is omitted. After the formation of the insulating layer 116, heat treatment is preferably performed. The above description in <Fabrication method example 1> can be referred to for the heat treatment; thus, the detailed description thereof is omitted.

Next, a metal oxide layer 150 is formed to cover the insulating layer 116 (FIG. 18A).

The metal oxide layer 150 is formed using a material that does not easily transmit oxygen and hydrogen. The metal oxide layer 150 has a function of inhibiting diffusion of oxygen contained in the insulating layer 114 and the insulating layer 116 to the side opposite to the semiconductor layer 108. In addition, the metal oxide layer 150 has a function of inhibiting diffusion of hydrogen and water from the outside to the side of the insulating layer 114 and the insulating layer 116. The metal oxide layer 150 is preferably formed using a material that is less likely to transmit oxygen and hydrogen than at least the insulating layer 114 and the insulating layer 116.

The metal oxide layer 150 may be an insulating layer or a conductive layer.

The metal oxide layer 150 is preferably formed using an insulating material with a higher dielectric constant than silicon oxide. For example, an aluminum oxide film, a hafnium oxide film, a hafnium aluminate film, or the like can be used.

For the metal oxide layer 150, for example, a conductive oxide such as indium oxide, indium tin oxide (ITO), or indium tin oxide containing silicon (ITSO) can also be used.

For the metal oxide layer 150, an oxide material containing one or more elements that are the same as those of the semiconductor layer 108 is preferably used. It is particularly preferable to use an oxide semiconductor material that can be used for the semiconductor layer 108. In a sputtering target used for forming the metal oxide layer 150, the atomic proportion of In is preferably greater than or equal to the atomic proportion of the element M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5.

[Semiconductor Layer 108]

An In—Ga—Zn oxide (IGZO) can be particularly favorably used as the metal oxide layer 150. In the case where the semiconductor layer 108 is an In—Ga—Zn oxide, a sputtering target used for forming the In—Ga—Zn oxide preferably has the atomic ratio of In higher than or equal to the atomic ratio of the element M. Examples of the atomic ratio of the metal elements in such a sputtering target include In—Ga—Zn=1:1:1, In—Ga—Zn=1:1:1.2, In—Ga—Zn=2:1:3, In—Ga—Zn=3:1:2, In—Ga—Zn=4:2:3, In—Ga—Zn=4:2:4.1, In—Ga—Zn=5:1:3, In—Ga—Zn=5:1:6, In—Ga—Zn=5:1:7, In—Ga—Zn=5:1:8, In—Ga—Zn=6:1:6, and In—Ga—Zn=5:2:5.

A metal oxide film formed using a sputtering target having the same composition as the semiconductor layer 108 can be used as the metal oxide layer 150. The sputtering target having the same composition as the semiconductor layer 108 is preferably used, in which case the same manufacturing apparatus and the same sputtering target can be used.

When a metal oxide material containing indium and gallium is used for both the semiconductor layer 108 and the metal oxide layer 150, a material whose composition (content ratio) of gallium is higher than that in the semiconductor layer 108 can be used for the metal oxide layer 150. It is preferable to use a material whose composition (content ratio) of gallium is high for the metal oxide layer 150, in which case an oxygen blocking property can be further increased. In that case, the use of a material whose composition of indium is higher than that in the metal oxide layer 150 for the semiconductor layer 108 enables the field-effect mobility of the transistor 100 to be increased.

The metal oxide layer 150 is preferably formed using a sputtering apparatus. For example, in the case where an oxide film is formed using a sputtering apparatus, forming the oxide film in an atmosphere containing an oxygen gas can suitably supply oxygen into the insulating layer 116, the insulating layer 114, or the semiconductor layer 108.

The metal oxide layer 150 is preferably formed in, for example, an oxygen-containing atmosphere. It is particularly preferable to form the metal oxide layer 150 by a sputtering method in an oxygen-containing atmosphere.

Thus, oxygen can be supplied to the insulating layer 116, the insulating layer 114, or the semiconductor layer 108 at the time of forming the metal oxide layer 150.

In the case where the metal oxide layer 150 is formed by a sputtering method using an oxide target containing a metal oxide similar to that in the case of the semiconductor layer 108, reference can be made to the above description.

For example, the metal oxide layer 150 may be formed by a reactive sputtering method using oxygen as a deposition gas and a metal target. When aluminum is used for the metal target, for instance, an aluminum oxide film can be formed.

At the time of forming the metal oxide layer 150, the amount of oxygen supplied into the insulating layer 116 can be increased with a higher proportion of the oxygen flow rate to the total flow rate of the deposition gas introduced into a treatment chamber of a deposition apparatus (a higher oxygen flow rate ratio) or with a higher oxygen partial pressure in the treatment chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide layer 150 is formed by a sputtering method in an oxygen-containing atmosphere in the above manner, oxygen can be supplied to the insulating layer 116 and release of oxygen from the insulating layer 116 can be prevented during the formation of the metal oxide layer 150. As a result, an extremely large amount of oxygen can be enclosed in the insulating layer 116. Moreover, a large amount of oxygen can be supplied to the semiconductor layer 108 by heat treatment performed later. Thus, the oxygen vacancies in the semiconductor layer 108 can be reduced, leading to a highly reliable transistor.

Next, heat treatment is preferably performed to supply oxygen from the insulating layer 116 to the semiconductor layer 108. The heat treatment can be performed at a temperature higher than or equal to 200° C. and lower than or equal to 400° C. in an atmosphere containing one or more of nitrogen, oxygen, and a rare gas.

By the heat treatment performed after the formation of the metal oxide layer 150 and before the formation of the insulating layer 118, oxygen can be effectively supplied from the insulating layer 116 to the semiconductor layer 108.

Next, the metal oxide layer 150 is removed (FIG. 18B). Note that the steps after removal of the metal oxide layer 150 are each preferably performed at a temperature lower than or equal to the temperature of the above heat treatment. In this manner, release of oxygen in the semiconductor layer 108 can be inhibited, which can inhibit formation of oxygen vacancies in the semiconductor layer 108. As a result, the reliability of the transistor can be increased.

There is no particular limitation on a method for removing the metal oxide layer 150, and wet etching can be suitably used. With the use of wet etching, the insulating layer 116 can be inhibited from being etched at the same time as the metal oxide layer 150. This can inhibit a reduction in the thickness of the insulating layer 116 and the thickness of the insulating layer 116 can be uniform.

Next, the insulating layer 118 is formed. The above description in <Fabrication method example 1> can be referred to for the steps after the formation of the insulating layer 118; thus, the detailed description thereof is omitted.

Through the above process, the transistor 100A can be fabricated.

Fabrication Method Example 3

A method for fabricating the transistor 100B described above in Structural example 2-3 is described below. Note that description of the same portions as the above is omitted and different portions are described.

First, as in <Fabrication method example 1>, the steps up to the formation of the resist mask 140 are performed. The description of FIG. 13A to FIG. 14A can be referred to for the steps up to the formation of the resist mask 140; thus, the detailed description thereof is omitted.

Figure 19A:
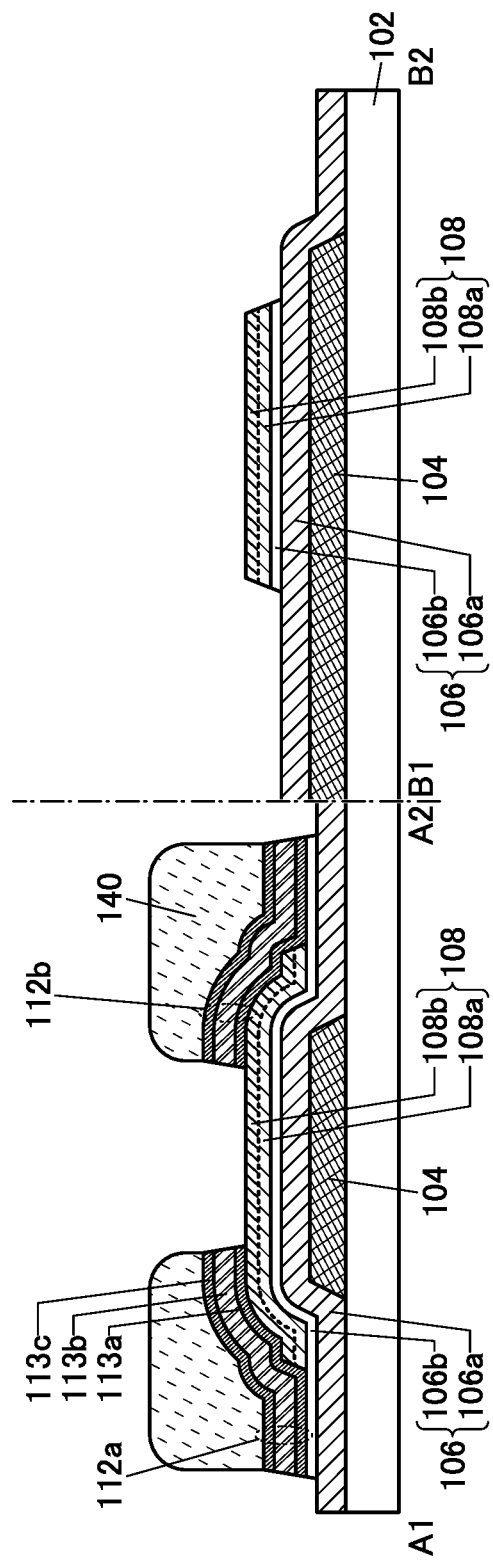
FIG. 19A and FIG. 19B are cross-sectional views showing a method for fabricating a transistor.

Then, the conductive film 113cf, the conductive film 113bf, and the conductive film 113af are etched using the resist mask 140 as a mask. At the time of the etching, the insulating layer 106b in a region overlapping with neither the resist mask 140 nor the semiconductor layer 108 is also removed (FIG. 19A).

Next, the cleaning treatment is preferably performed. The above description in <Fabrication method example 1> can be referred to for the steps after the cleaning treatment; thus, the detailed description thereof is omitted.

Figure 19B:
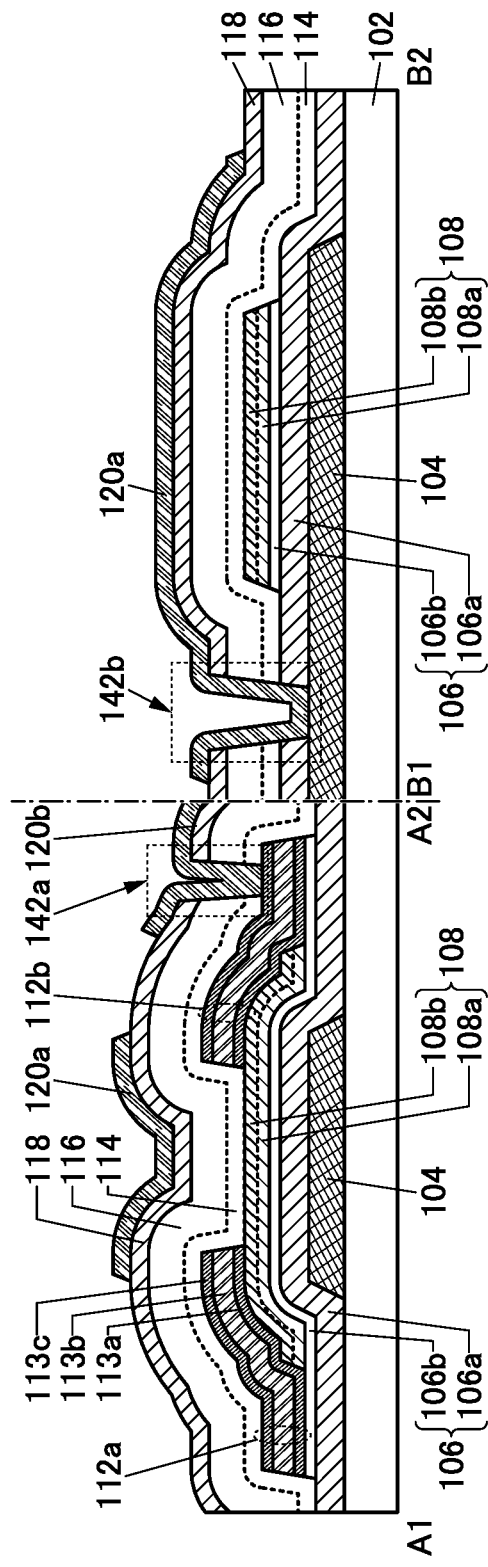

Through the above process, the transistor 100B can be fabricated (FIG. 19B).

Fabrication Method Example 4

A method for fabricating the transistor 100C described above in Structural example 2-4 is described below. Note that description of the same portions as the above is omitted and different portions are described.

First, as in <Fabrication method example 1>, the steps up to the formation of the metal oxide film 108af and the metal oxide film 108bf are performed. The description of FIG. 13A and FIG. 13B can be referred to for the steps up to the formation of the metal oxide film 108af and the metal oxide film 108bf; thus, the detailed description thereof is omitted.

Figure 20A:
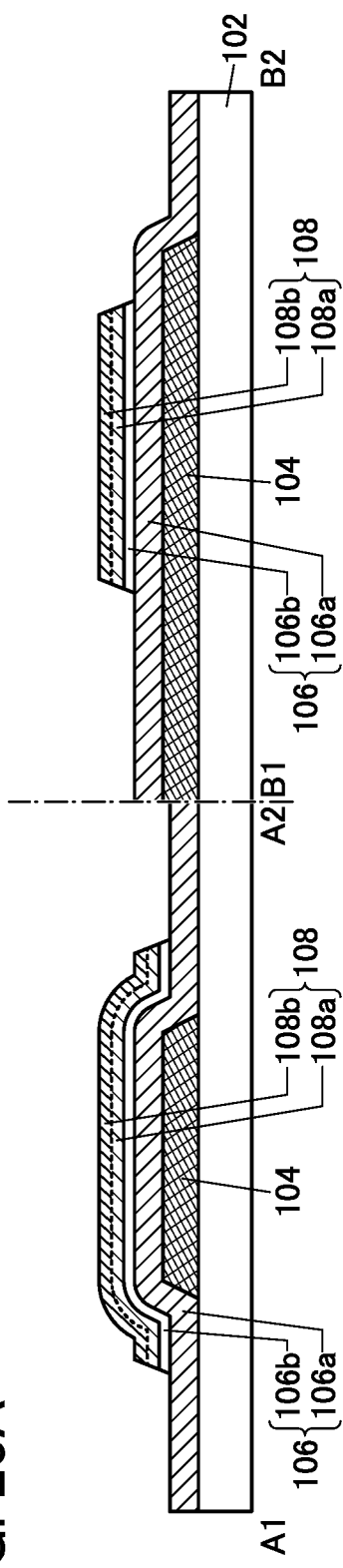
FIG. 20A and FIG. 20B are cross-sectional views showing a method for fabricating a transistor.

Next, after the formation of the metal oxide film 108af and the metal oxide film 108bf, a resist mask is formed over the metal oxide film 108bf, and the metal oxide film 108af and the metal oxide film 108bf are etched using the resist mask as a mask, whereby the semiconductor layer 108 is formed. At the time of the etching, the insulating layer 106b in a region not overlapping with the resist mask is also removed (FIG. 20A). After that, the resist mask is removed.

Heat treatment may be performed after the metal oxide film 108af and the metal oxide film 108bf are formed or processed into the semiconductor layer 108. The above description in <Fabrication method example 1> can be referred to for the steps after the heat treatment; thus, the detailed description thereof is omitted.

Figure 20B:
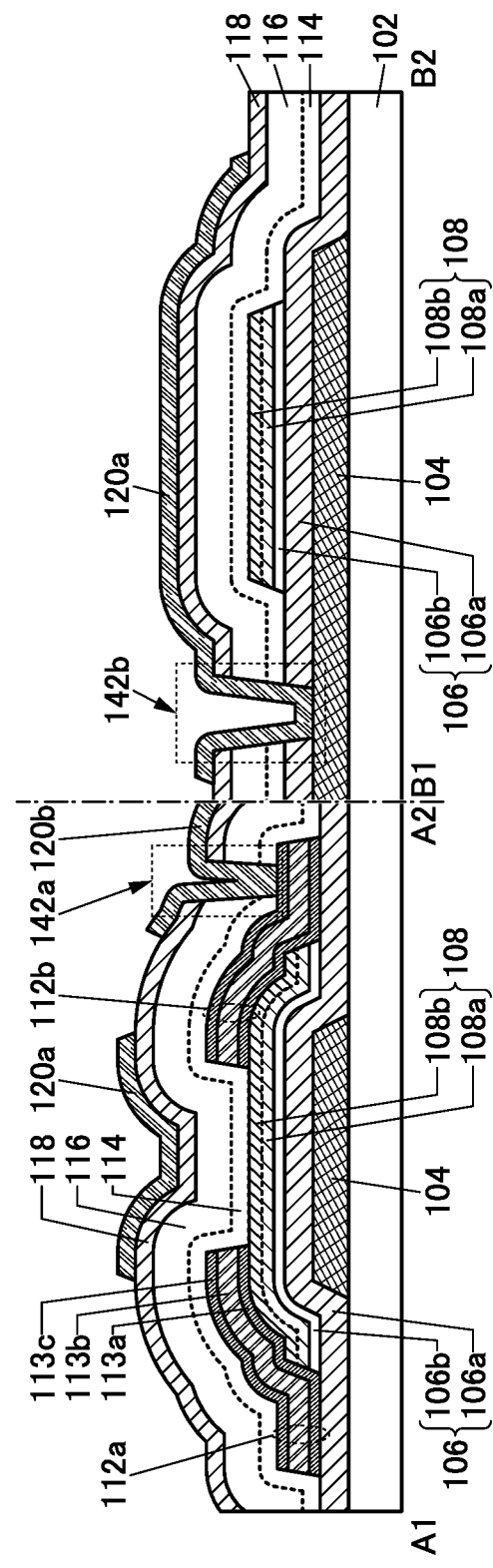

Through the above process, the transistor 100C can be fabricated (FIG. 20B).

According to the fabrication method of a transistor described here, a change in the threshold voltage of the transistor can be inhibited with the use of a film from which a large amount of ammonia is released and a small amount of nitrogen oxide is released as the insulating layer 114 in contact with the semiconductor layer 108, which enables the transistor with favorable electrical characteristics and high reliability to be fabricated.

The above is the description of the fabrication method examples of the transistor.

Modification Example of Structure Example

Modification examples of the structure example of the transistor described above are described below.

Modification Example 1

Figure 21A:
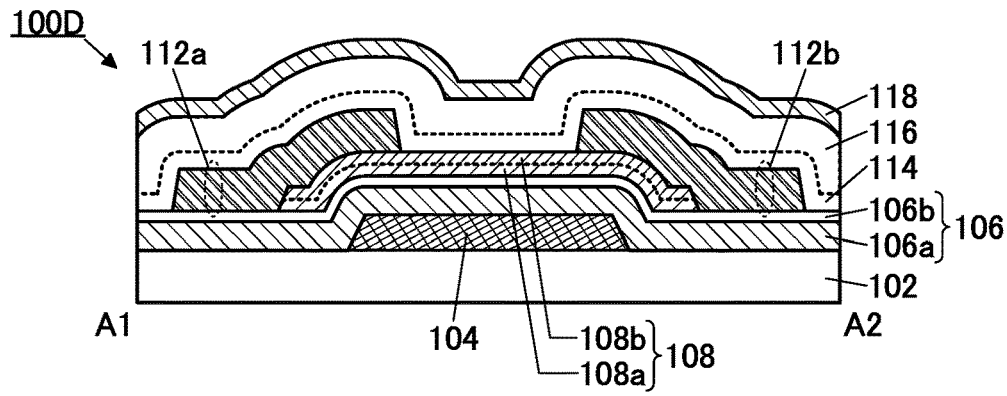
FIG. 21A, FIG. 21B, FIG. 21C, and FIG. 21D are cross-sectional views showing structure examples of transistors.
Figure 21B:
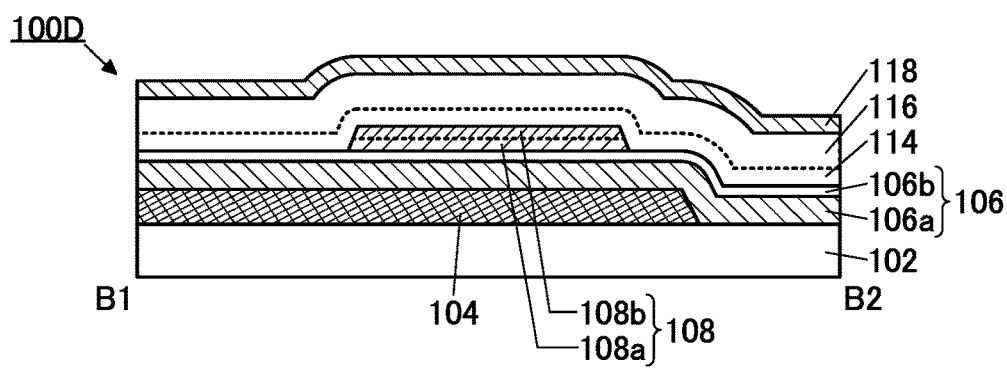

A transistor 100D shown in FIG. 21A and FIG. 21B is different from the transistor 100 described in Structure example 2-1 above mainly in that each of the conductive layer 112a and the conductive layer 112b does not have a stacked-layer structure but has a single-layer structure.

With the conductive layer 112a and the conductive layer 112b each having a single-layer structure, the fabrication process can be simplified and the productivity can be increased. For the conductive layer 112a and the conductive layer 112b, a conductive material containing copper, silver, gold, or aluminum is preferably used.

Modification Example 2

Figure 21C:
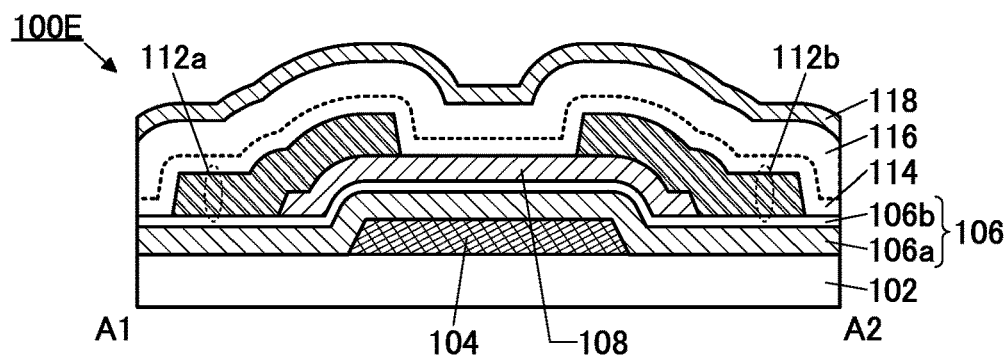
Figure 21D:
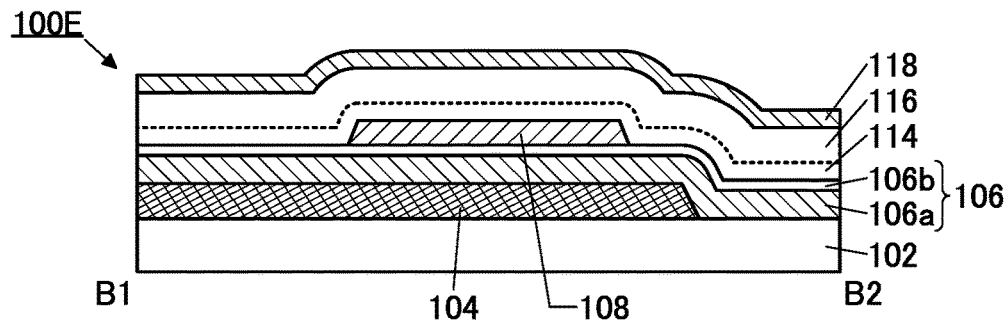

A transistor 100E shown in FIG. 21C and FIG. 21D is different from the transistor 100 described in Structure example 2-1 above mainly in that the semiconductor layer 108 as well as the conductive layer 112a and the conductive layer 112b does not have a stacked-layer structure but has a single-layer structure.

When the conductive layer 112a, the conductive layer 112b, and the semiconductor layer 108 each have a single-layer structure, the productivity can be further increased. In that case, it is preferable to use a metal oxide film having crystallinity as the semiconductor layer 108.

Modification Example 3

Figure 22A:
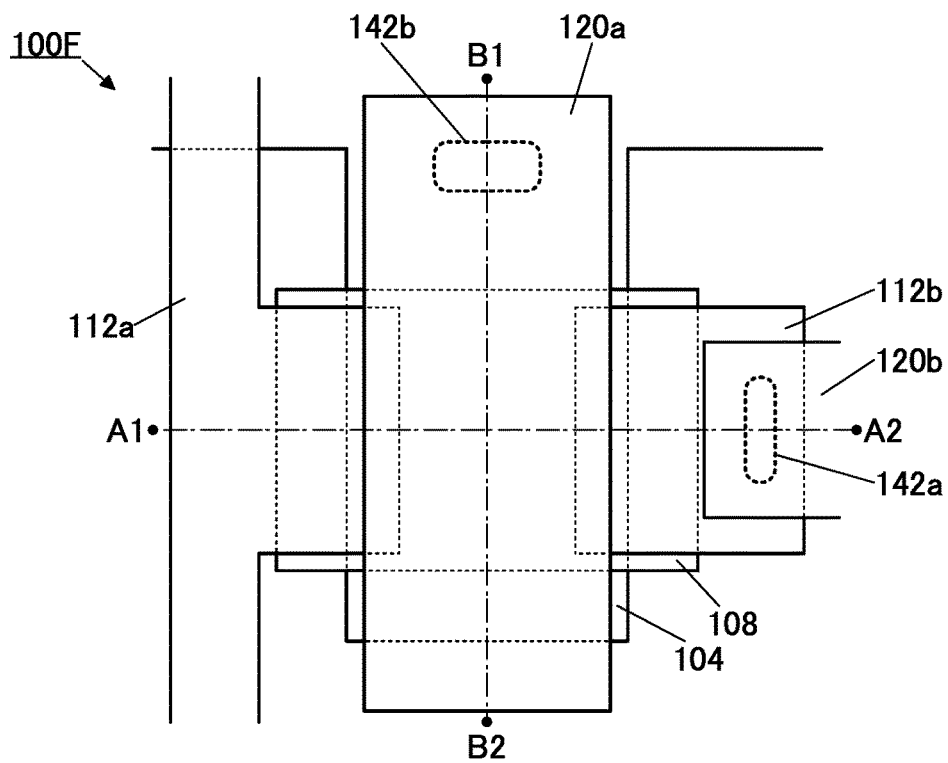
FIG. 22A is a top view showing a structure example of a transistor.
Figure 22B:
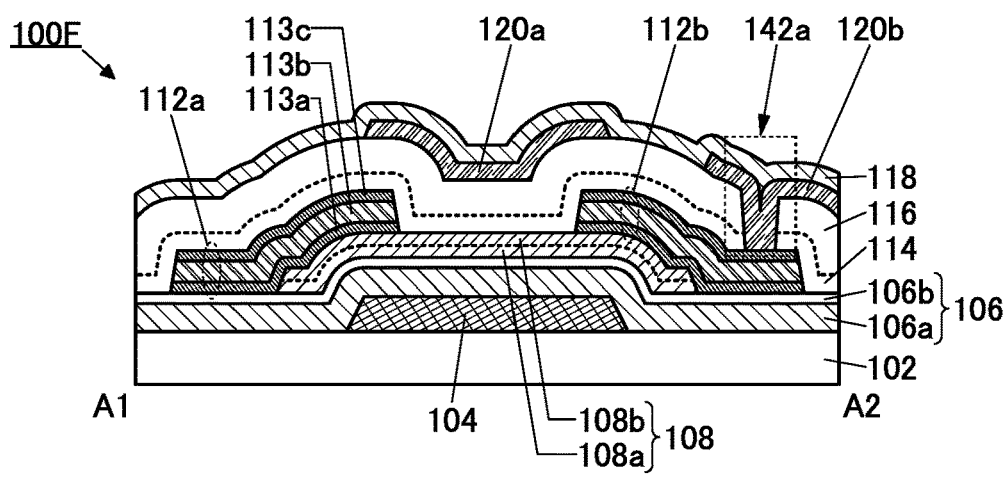
FIG. 22B and FIG. 22C are cross-sectional views showing the structure example of the transistor.
Figure 22C:
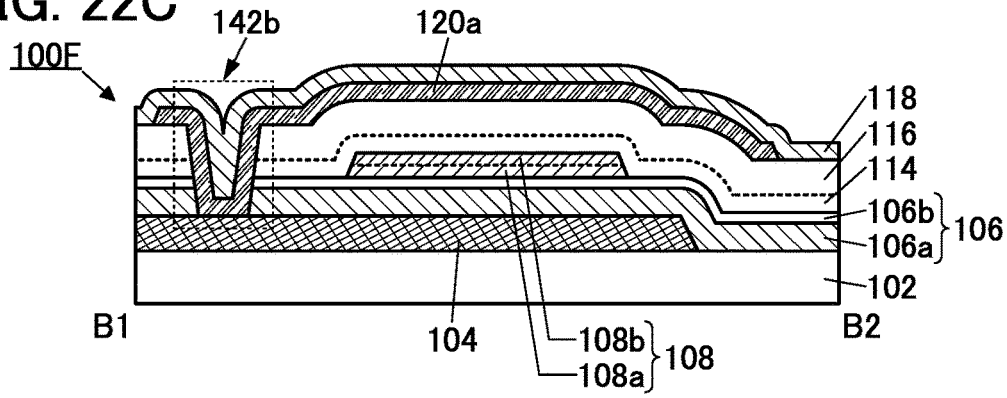

A transistor 100F shown in FIG. 22A, FIG. 22B, and FIG. 22C is different from the transistor 100A described in Structure example 2-2 above mainly in the positions of the conductive layer 120a and the conductive layer 120b.

The conductive layer 120a and the conductive layer 120b are positioned between the insulating layer 116 and the insulating layer 118. The conductive layer 120b is electrically connected to the conductive layer 112b through the opening 142a provided in the insulating layer 114 and the insulating layer 116.

With such a structure, the distance between the conductive layer 120a and the semiconductor layer 108 can be shortened, and thus the electrical characteristics of the transistor 100F can be improved.

Modification Example 4

Figure 23A:
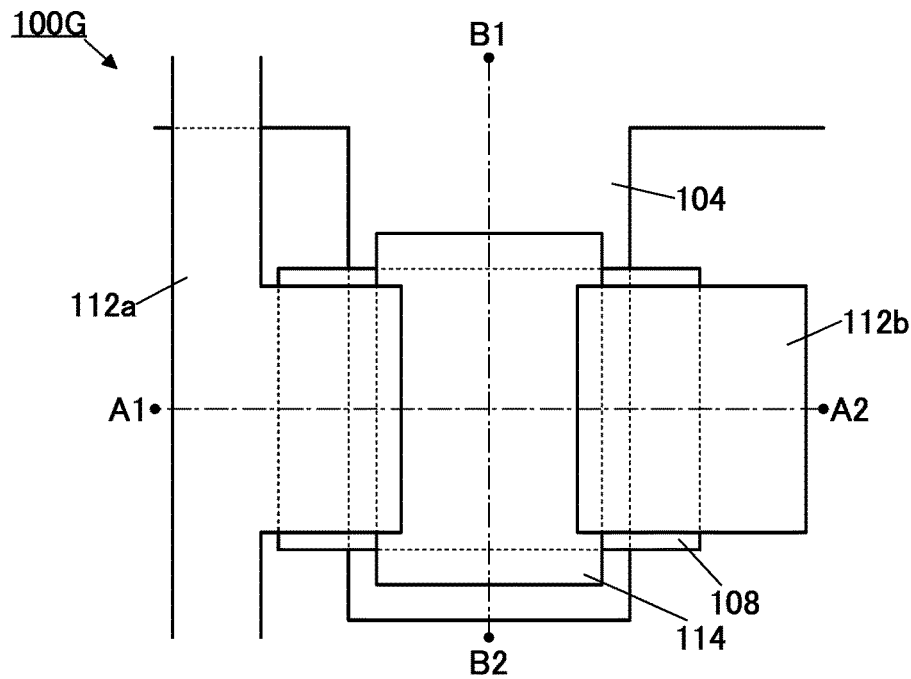
FIG. 23A is a top view showing a structure example of a transistor.
Figure 23B:
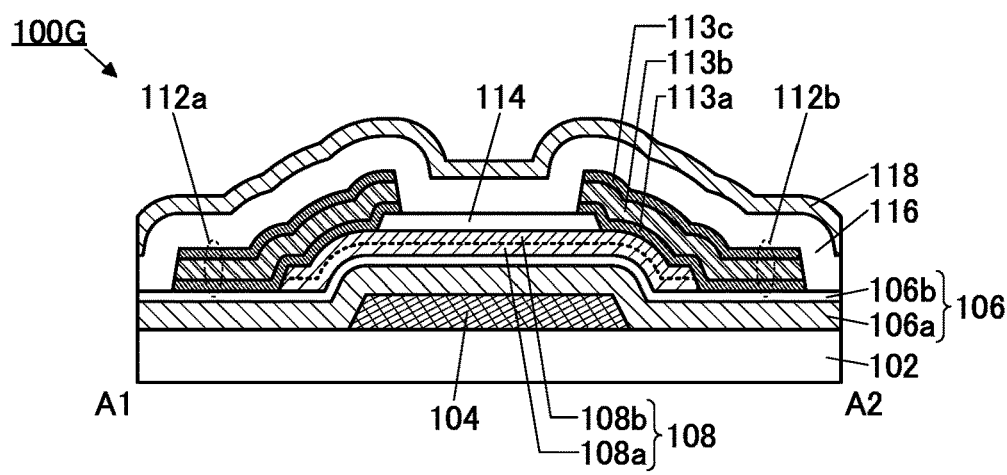
FIG. 23B and FIG. 23C are cross-sectional views showing the structure example of the transistor.
Figure 23C:
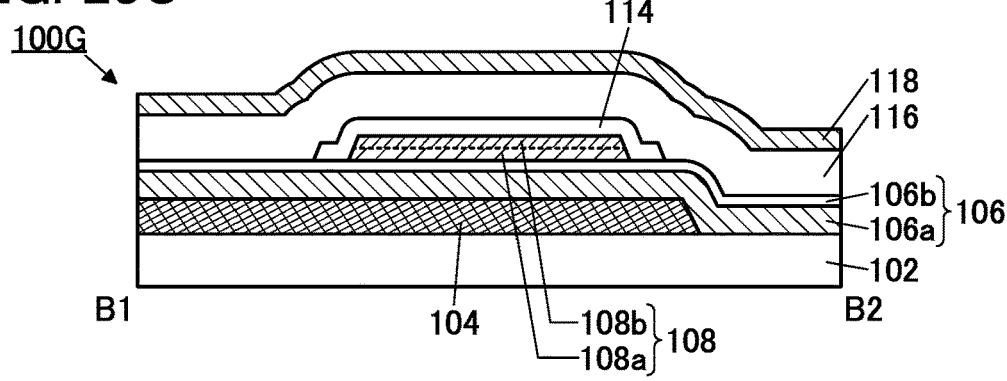

A transistor 100G shown in FIG. 23A, FIG. 23B, and FIG. 23C is different from the transistor 100 described in Structure example 2-1 above mainly in the structure of the insulating layer 114.

The insulating layer 114 is processed into an island shape that covers a channel formation region of the semiconductor layer 108. Furthermore, the end portions of the conductive layer 112a and the conductive layer 112b, which are positioned over the semiconductor layer 108, are positioned over the insulating layer 114. Thus, the insulating layer 114 functions as what is called a channel protective layer, and can protect the back channel side of the semiconductor layer 108 when the conductive layer 112a and the conductive layer 112b are etched.

In this case, by performing plasma treatment by the above-described method after the conductive layer 112a and the conductive layer 112b are etched, oxygen can be supplied into the insulating layer 114 and the semiconductor layer 108 through the insulating layer 114 while oxidation of the conductive layer 112a and the conductive layer 112b is inhibited. In addition, oxygen in the insulating layer 114 may be supplied to the semiconductor layer 108 by performing heat treatment after the plasma treatment.

Modification Example 5

Figure 24A:
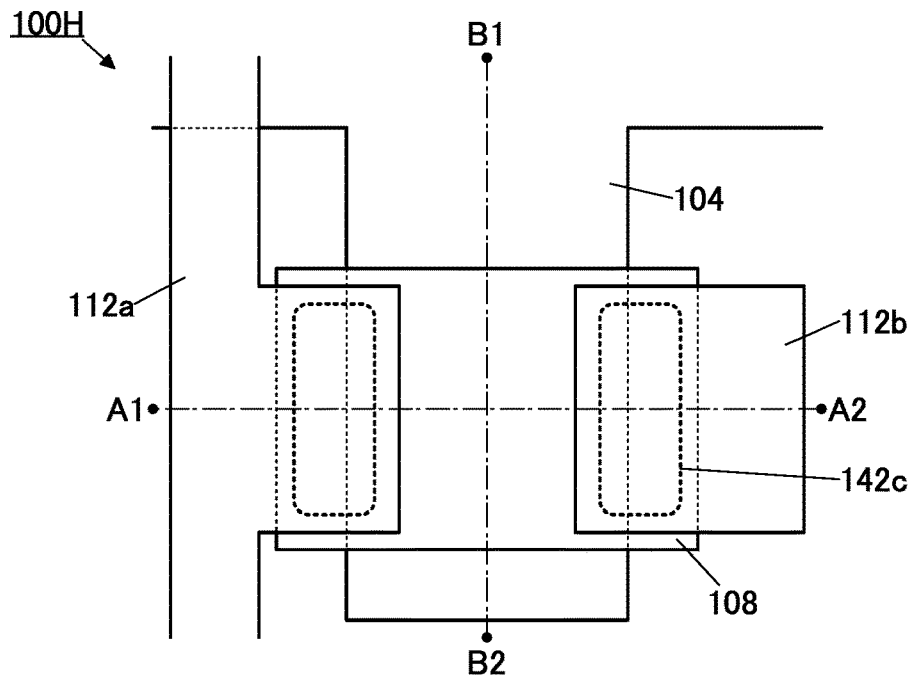
FIG. 24A is a top view showing a structure example of a transistor.
Figure 24B:
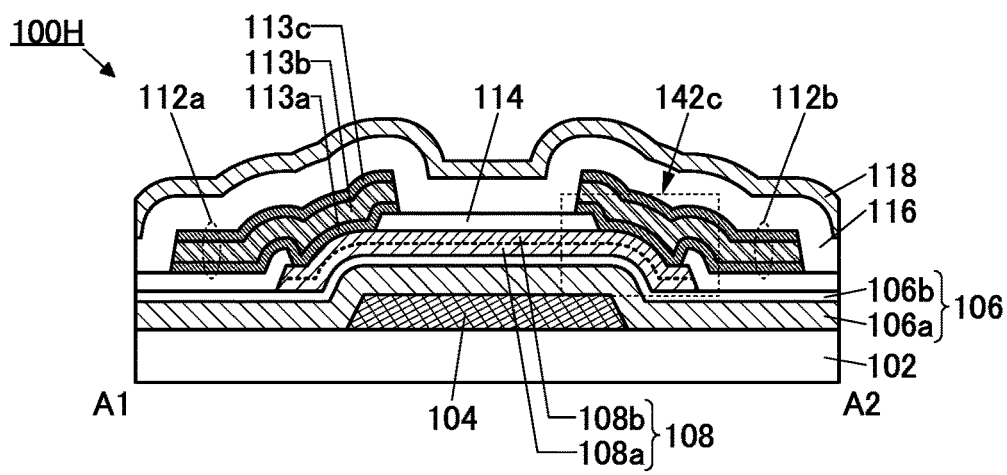
FIG. 24B and FIG. 24C are cross-sectional views showing the structure example of the transistor.
Figure 24C:
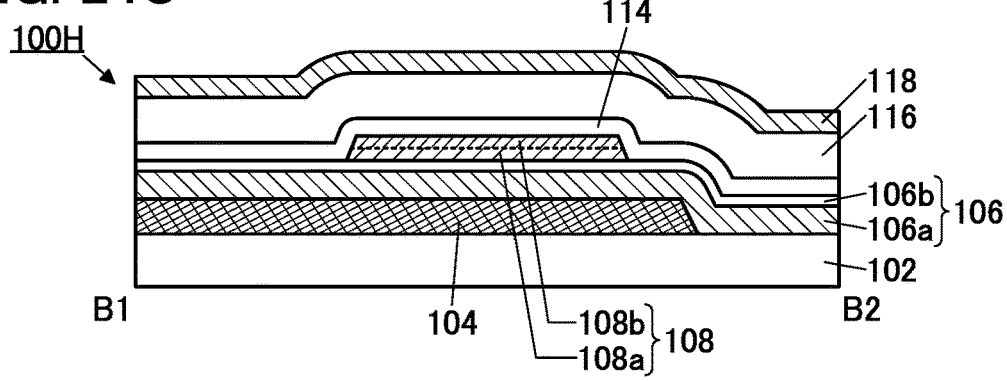

A transistor 100H shown in FIG. 24A, FIG. 24B, and FIG. 24C is different from the transistor 100G described in Modification example 4 above mainly in the structure of the insulating layer 114.

The insulating layer 114 is provided to cover the semiconductor layer 108, the insulating layer 106, and the like. In addition, in the insulating layer 114, an opening 142c is provided in a portion where the semiconductor layer 108 is connected to the conductive layer 112a or the conductive layer 112b.

With such a structure, a smaller transistor than that where the insulating layer 114 is processed into an island shape can be provided.

According to the fabrication method of one embodiment of the present invention, a change in the threshold voltage of the transistor can be inhibited with the use of a film from which a large amount of ammonia is released and a small amount of nitrogen oxide is released as the insulating layer 114 in contact with the semiconductor layer 108, which enables the transistor with favorable electrical characteristics and high reliability to be fabricated.

The above is the description of the modification examples.

Application Example

An example of the case where the above-described transistor is used for pixels of a display device is described below.

Each diagram in FIG. 25 is a schematic top view showing a portion of subpixels of the display device. One subpixel includes at least one transistor and a conductive layer (here, the conductive layer 120b) functioning as a pixel electrode. Note that a structure example of a portion of subpixels is shown here in order to simplify the description; however, another transistor, a capacitor, or the like can be provided as appropriate depending on the kind of display elements used in the subpixels, the function to be added to the pixels, and the like.

Figure 25A:
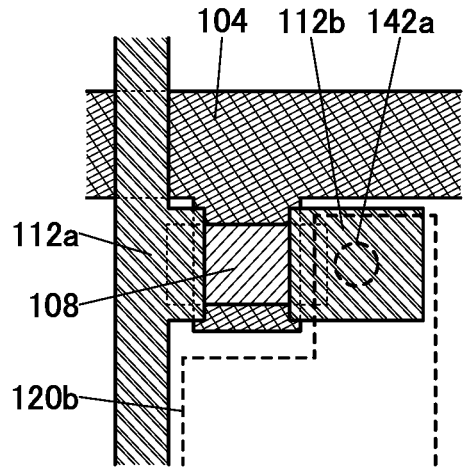
FIG. 25A, FIG. 25B, FIG. 25C, FIG. 25D, and FIG. 25E are structure examples of transistors.

In FIG. 25A, a portion of the conductive layer 104 functions as a gate line (also referred to as a scan line), a portion of the conductive layer 112a functions as a source line (also referred to as a video signal line), and a portion of the conductive layer 112b functions as a wiring that electrically connects the transistor and the conductive layer 120b.

In FIG. 25A, the conductive layer 104 has a top-view shape with a sticking-out portion, and the semiconductor layer 108 is provided over this sticking-out portion to constitute a transistor.

Figure 25B:
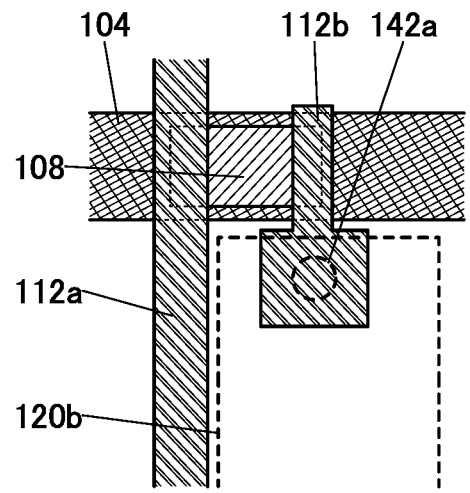
Figure 25C:
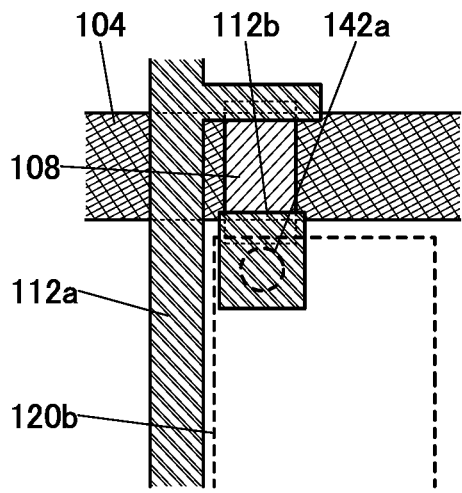

FIG. 25B and FIG. 25C each show an example in which the conductive layer 104 does not have the sticking-out portion. FIG. 25B is an example in which the channel length direction of the semiconductor layer 108 is parallel to the extending direction of the conductive layer 104, and FIG. 25C is an example in which these directions are orthogonal.

Figure 25D:
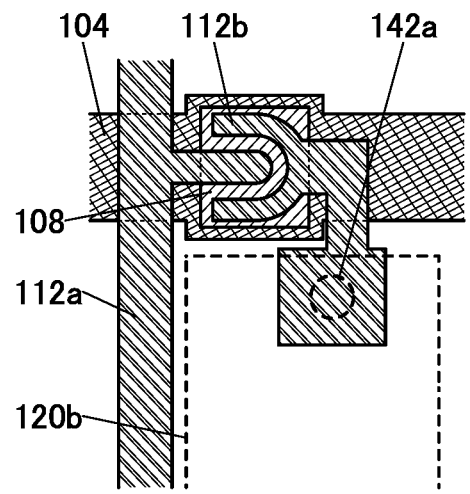
Figure 25E:
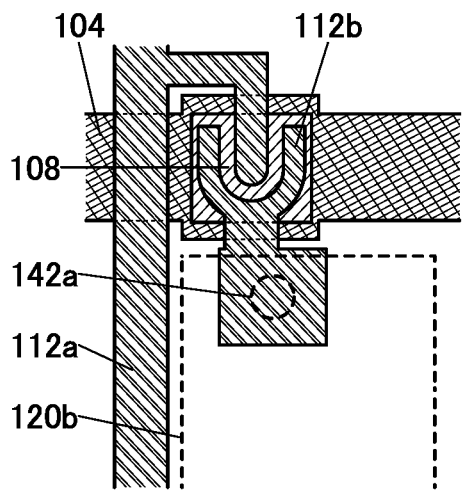

In FIG. 25D and FIG. 25E, the conductive layer 112b has a U-shaped top-view shape with an arc-like or substantially arc-like portion. In addition, the conductive layer 112a and the conductive layer 112b are placed such that the distance between the two is constant over the semiconductor layer 108. With such a structure, the transistor can have a larger channel width and make a larger amount of current flow.

Note that the transistor of one embodiment of the present invention can be used not only in a display device but also in a variety of circuits and devices. For example, the transistor of one embodiment of the present invention can be suitably used in various circuits in an IC chip mounted on an electronic device or the like, such as an arithmetic circuit, a memory circuit, a driver circuit, and an interface circuit; or driver circuits for a display device in which a liquid crystal element, an organic EL element, or the like is used or for various sensor devices such as a touch sensor, an optical sensor, and a biosensor.

The above is the description of the application example.

<Components of Semiconductor Device>

Components included in the semiconductor device of this embodiment are described below in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 106]

The insulating layer 106 can be formed of a single layer or a stacked layer of an oxide insulating film or a nitride insulating film, for example. To improve the properties of the interface with the semiconductor layer 108, at least a region in the insulating layer 106 that is in contact with the semiconductor layer 108 is preferably formed of an oxide insulating film. Moreover, a film from which oxygen is released by heating is preferably used as the insulating layer 106.

For example, a single layer or a stacked layer using silicon oxide, silicon oxynitride, silicon nitride oxide, silicon nitride, aluminum oxide, hafnium oxide, gallium oxide, a Ga—Zn oxide, or the like can be provided as the insulating layer 106.

In the case where a film other than an oxide film, such as a silicon nitride film, is used for the side of the insulating layer 106 that is in contact with the semiconductor layer 108, pretreatment such as oxygen plasma treatment is preferably performed on a surface in contact with the semiconductor layer 108 to oxidize the surface or the vicinity of the surface.

[Conductive Film]

Conductive films that constitute the semiconductor device, such as the conductive layer 104 and the conductive layer 120a that function as gate electrodes, 120b that functions as a wiring, the conductive layer 112a that functions as one of a source electrode and a drain electrode, and the conductive layer 112b that functions as the other of the source electrode and the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the conductive layer 112a that functions as one of the source electrode and the drain electrode and the conductive layer 112b that functions as the other of the source electrode and the drain electrode, in particular, a low-resistance conductive material containing copper, silver, gold, aluminum, or the like is preferably used. Copper or aluminum is particularly preferable because of its high mass-productivity.

For the conductive films that constitute the semiconductor device, an oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive films that constitute the semiconductor device may each have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating layer.

A Cu—X alloy film (X is Mn, Ni, Cr, Fe, Co, Mo, Ta, or Ti) may be used for the conductive layer 104, the conductive layer 112a, and the conductive layer 112b. The use of a Cu—X alloy film enables the manufacturing cost to be reduced because wet etching process can be used in the processing.

[Insulating Layer 114 and Insulating Layer 116]

As the insulating layer 114 provided over the semiconductor layer 108, insulating layers containing one or more kinds of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like formed by a PECVD method, a sputtering method, an ALD method, or the like can be used. It is particularly preferable to use a silicon oxide film or a silicon oxynitride film formed by a plasma CVD method. Note that the insulating layer 114 may have a stacked-layer structure of two or more layers.

As the insulating layer 116 functioning as a protective layer, an insulating layer containing one or more kinds of a silicon nitride oxide film, a silicon nitride film, an aluminum nitride film, an aluminum nitride oxide film, and the like formed by a PECVD method, a sputtering method, an ALD method, or the like can be used. Note that the insulating layer 116 may have a stacked-layer structure of two or more layers.

[Semiconductor Layer]

In the case where the semiconductor layer 108 is an In-M-Zn oxide, the favorable atomic ratio of metal elements in a sputtering target used for depositing the In-M-Zn oxide is In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, In:M:Zn=10:1:15, or a neighborhood thereof, for example.

In the case where the semiconductor layer 108 is indium oxide, indium oxide can be used as a sputtering target used for depositing indium oxide.

In the case where the semiconductor layer 108 is an In-M oxide, the favorable atomic ratio of metal elements in a sputtering target used for depositing the In-M oxide is In:M=2:1, In:M=7:2, In:M=5:1, In:M=7:1, In:M=10:1, or a neighborhood thereof, for example.

In the case where the semiconductor layer 108 is an In—Zn oxide, the favorable atomic ratio of metal elements in a sputtering target used for depositing the In—Zn oxide is In:Zn=2:3, In:Zn=3:2, In:Zn=7:2, In:Zn=4:1, In:Zn=11:2, In:Zn=7:1, In:Zn=14:1, or a neighborhood thereof, for example.

A target containing a polycrystalline oxide is preferably used as the sputtering target, which facilitates formation of the semiconductor layer 108 having crystallinity. Note that the atomic ratio in the deposited semiconductor layer 108 to be formed may vary in the range of ±40% from any of the above atomic ratios of the metal elements contained in the sputtering target. For example, in the case where the composition of a sputtering target used for the semiconductor layer 108 is In:Ga:Zn=5:1.3<atomic ratio>, the composition of the deposited semiconductor layer 108 is sometimes in the neighborhood of In:Ga:Zn=5:1:2.4<atomic ratio> or in the neighborhood thereof.

A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature is likely to have the nc structure.

The energy gap of the semiconductor layer 108 is 2 eV or more, preferably 2.5 eV or more. With the use of such a metal oxide having a wider energy gap than silicon, the off-state current of the transistor can be reduced.

The above is the description of the components.

At least part of this embodiment can be implemented in combination with any of the other embodiments described in this specification as appropriate.

Embodiment 3

In this embodiment, an example of a display device that includes the transistor exemplified in the above embodiment is described.

Structure Example

Figure 26A:
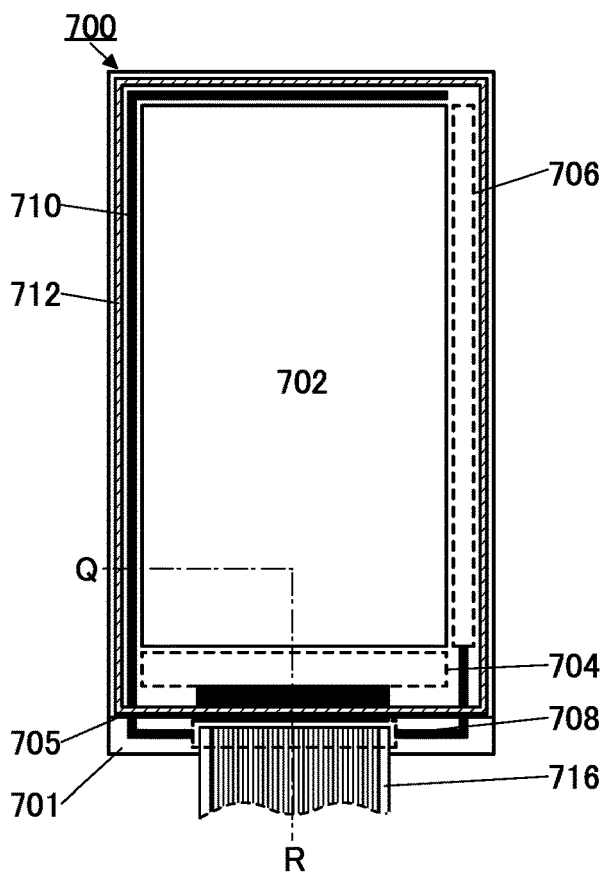
FIG. 26A, FIG. 26B, and FIG. 26C are top views of display devices.

FIG. 26A is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 26B:
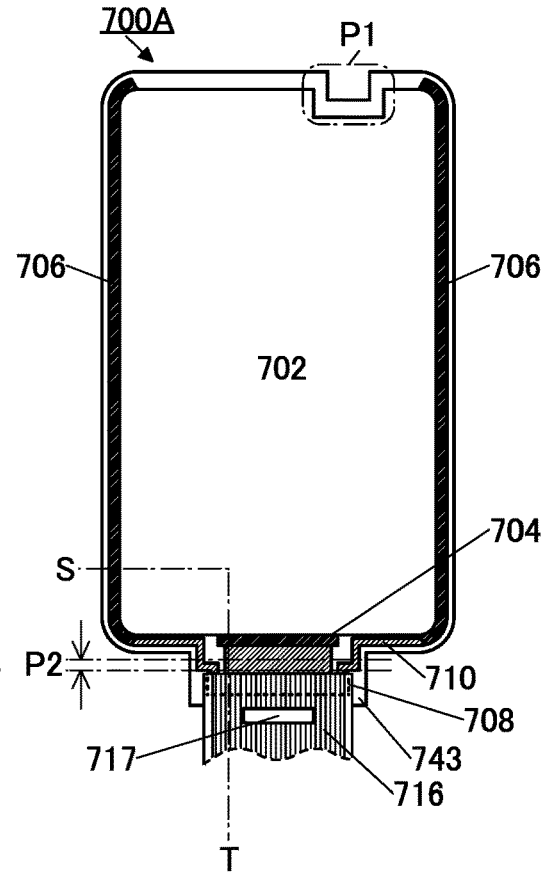

A display device 700A shown in FIG. 26B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as shown in a region P1 in FIG. 26B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 26B. When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700B can include at least one of a protection circuit, a buffer circuit, a demultiplexer circuit, and the like.

Figure 26C:
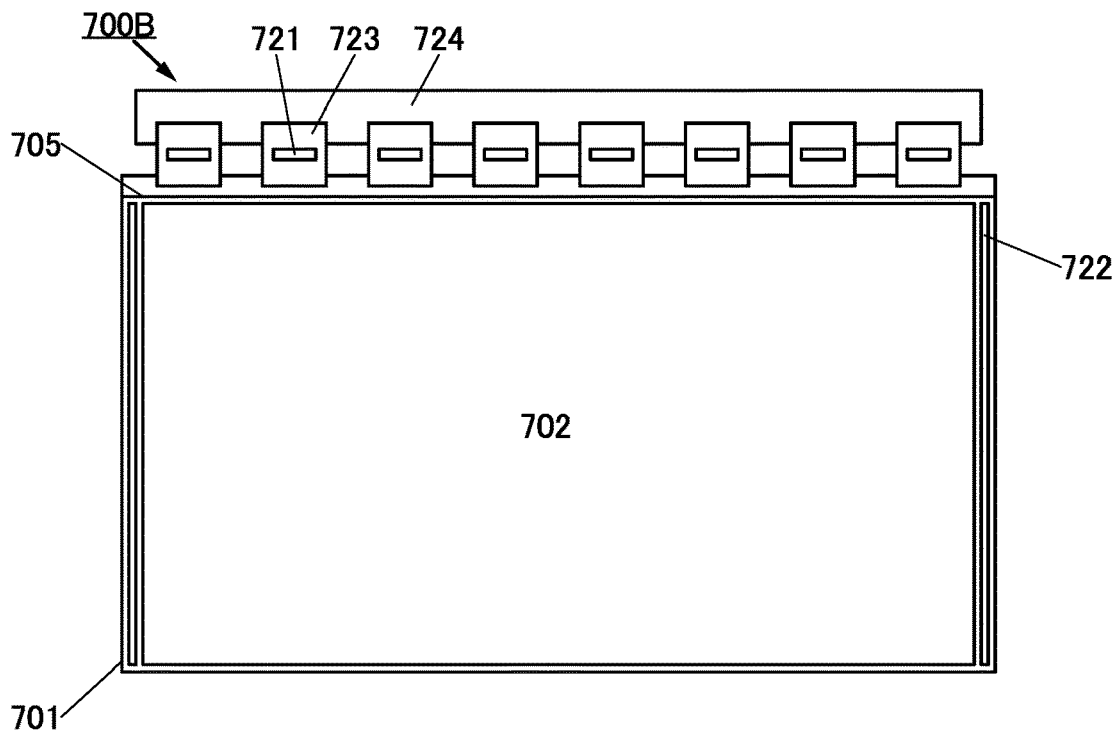

A display device 700B shown in FIG. 26C is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

Meanwhile, the gate driver circuit portions 722 are provided over the first substrate 701. Thus, an electronic device with a narrow bezel can be provided.

With such a structure, a large-size and high-resolution display device can be provided. For example, application to a display device with a diagonal screen size of 30 inches or more, 40 inches or more, 50 inches or more, or 60 inches or more is also possible. Furthermore, a display device with extremely high resolution such as 4K2K or 8K4K can be provided.

Cross-Sectional Structure Example

Figure 27:
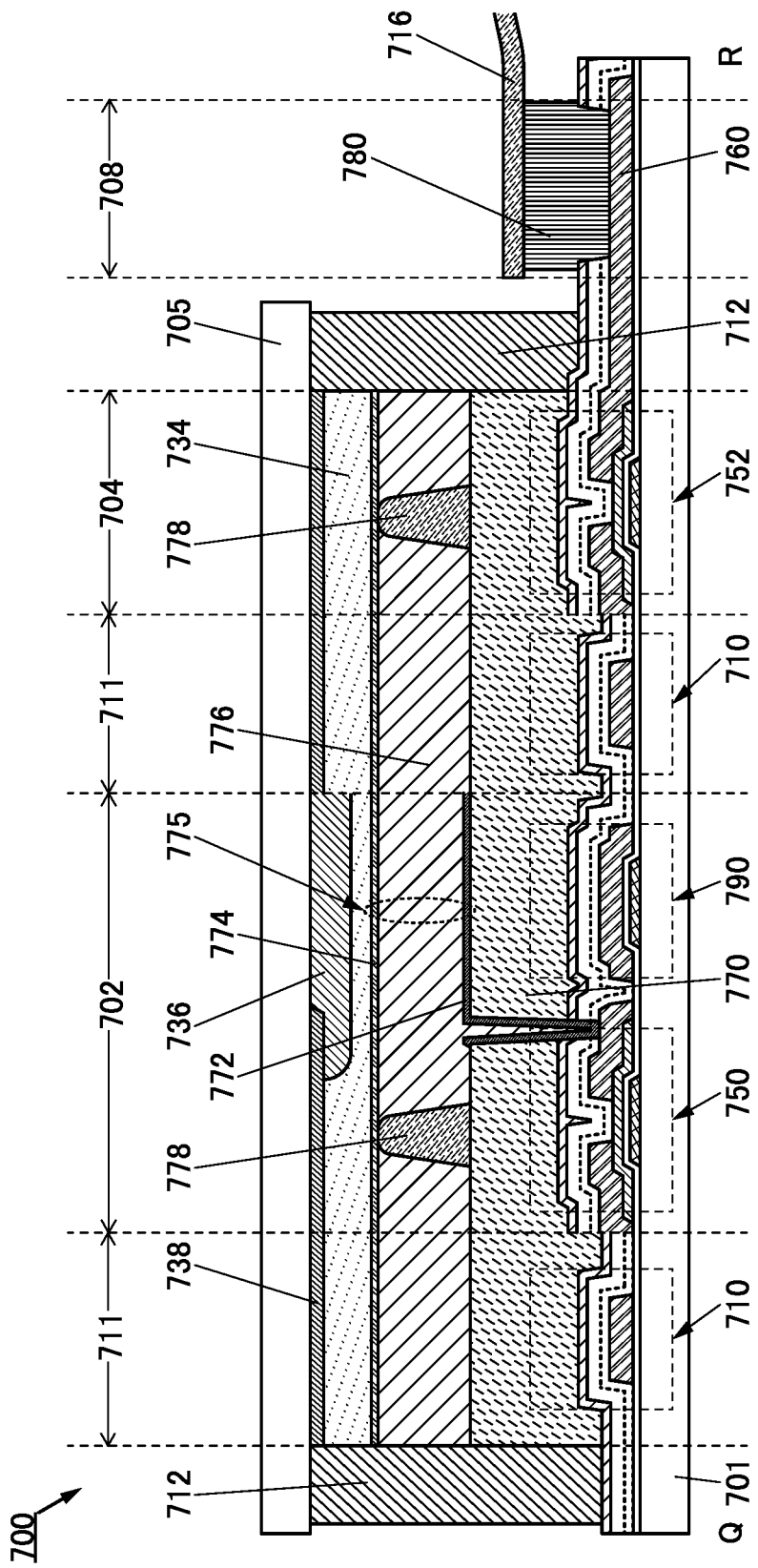
FIG. 27 is a cross-sectional view of a display device.
Figure 28:
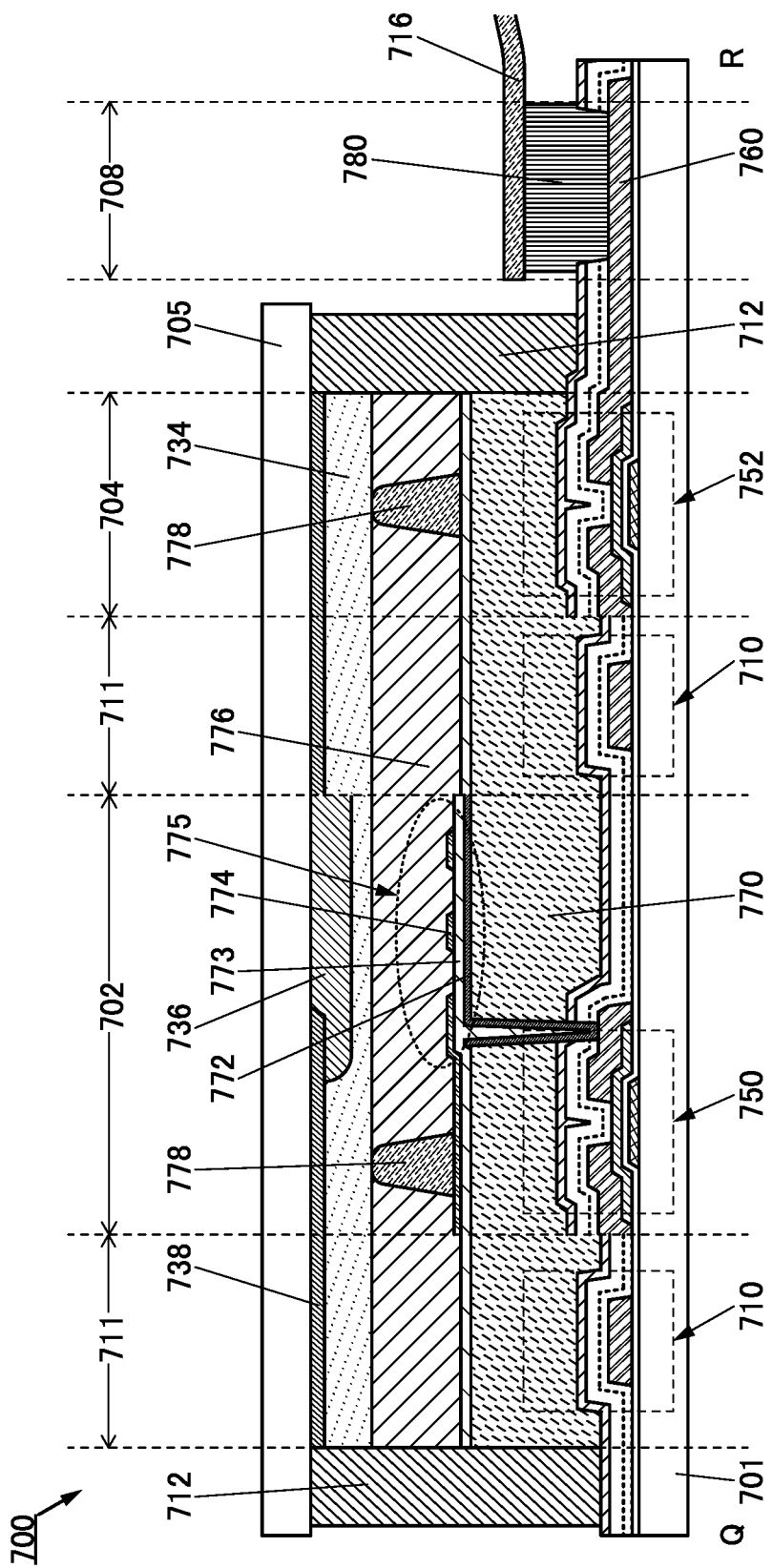
FIG. 28 is a cross-sectional view of a display device.
Figure 29:
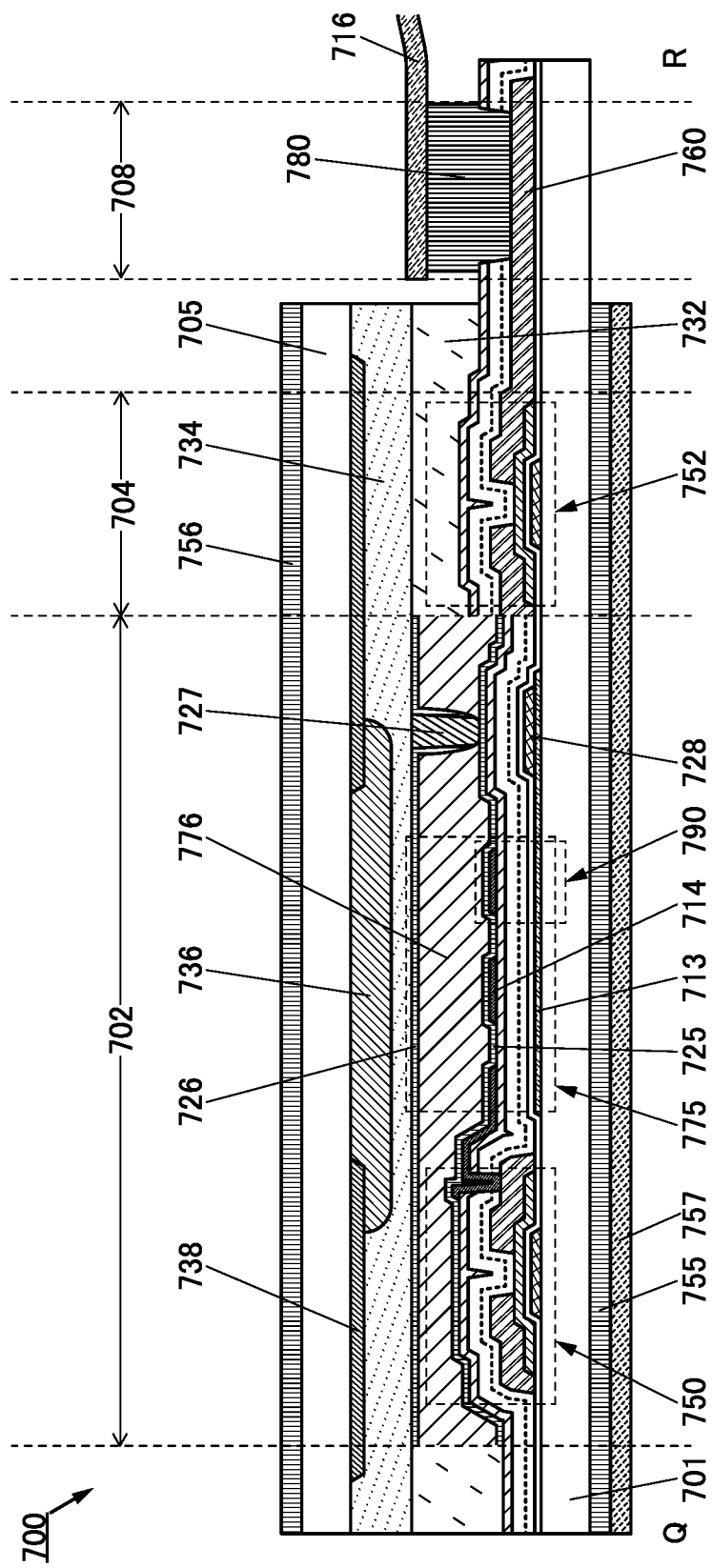
FIG. 29 is a cross-sectional view of a display device.

Structures using a liquid crystal element and an EL element as display elements are described below with reference to FIG. 27 to FIG. 31. Note that FIG. 27 to FIG. 30 are cross-sectional views along the dashed-dotted line Q-R in FIG. 26A. FIG. 31 is a cross-sectional view along the dashed-dotted line S-T in the display device 700A shown in FIG. 26B. FIG. 27 to FIG. 29 each show a structure using a liquid crystal element as a display element, and FIG. 30 and FIG. 31 each show a structure using an EL element.

[Description of Common Portions in Display Devices]

Display devices in FIG. 27 to FIG. 31 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 28 shows a case where the capacitor 790 is not provided.

As the transistor 750 and the transistor 752, any of the transistors described in Embodiment 2 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal can be set longer. Thus, the frequency of refresh operation can be reduced, which leads to lower power consumption.

The transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

Figure 30:
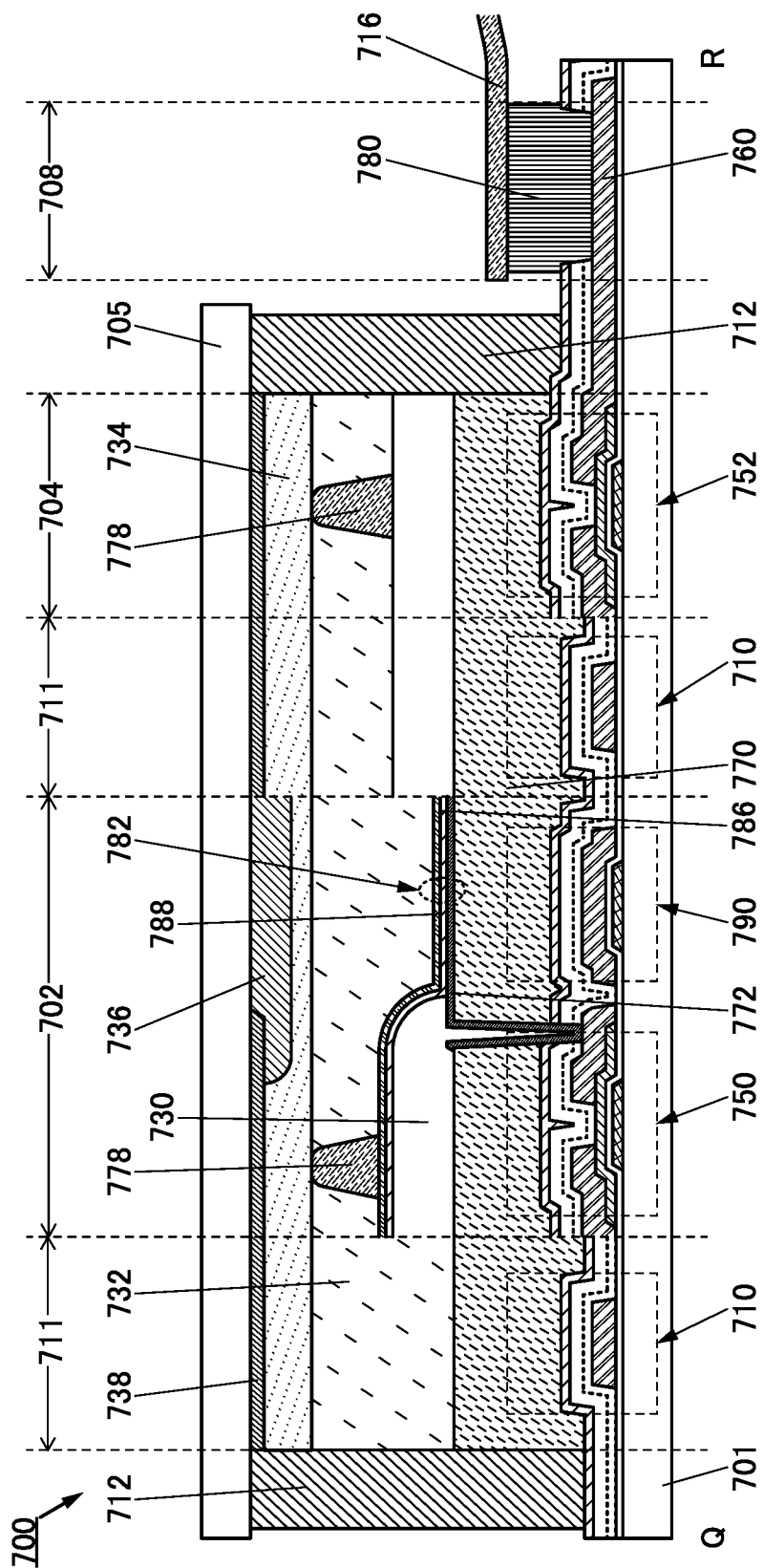
FIG. 30 is a cross-sectional view of a display device.
Figure 31:
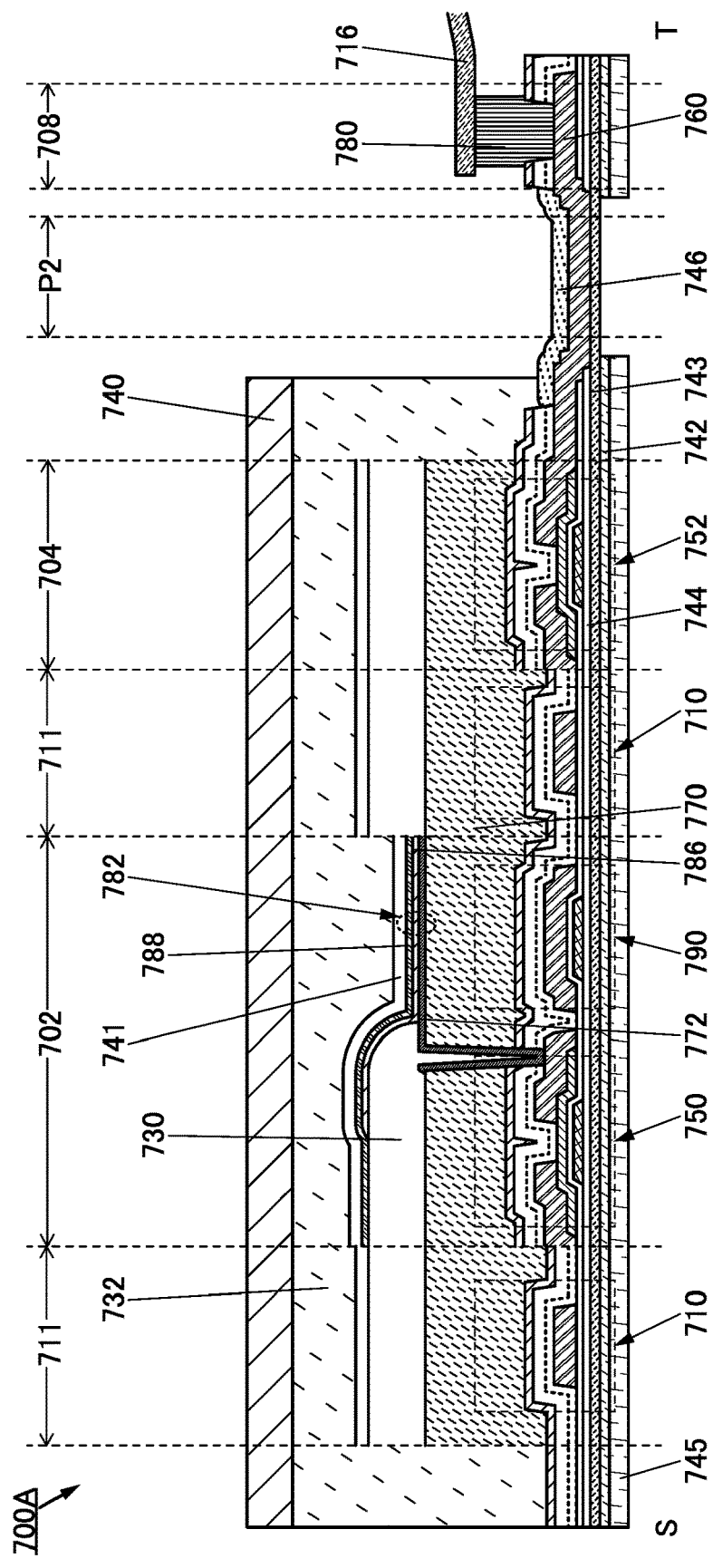
FIG. 31 is a cross-sectional view of a display device.

The capacitor 790 shown in FIG. 27, FIG. 30, and FIG. 31 includes a lower electrode formed by processing the same film as the gate electrode of the transistor 750 and an upper electrode formed by processing the same conductive film as the source electrode or the drain electrode. Part of an insulating film functioning as a gate insulating layer of the transistor 750 is provided between the lower electrode and the upper electrode. That is, the capacitor 790 has a stacked-layer structure in which an insulating film functioning as a dielectric film is positioned between a pair of electrodes.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a connection electrode 760, an anisotropic conductive film 780, and the FPC 716. The connection electrode 760 is electrically connected to a terminal included in the FPC 716 through the anisotropic conductive film 780. Here, the connection electrode 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking layer 738, a coloring layer 736, and an insulating layer 734 in contact with these layers are provided on the second substrate 705 side.

Structure Example of Display Device Using Liquid Crystal Element

The display device 700 shown in FIG. 27 includes a liquid crystal element 775 and a spacer 778. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. Meanwhile, when a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided such that the liquid crystal element is placed therebetween.

The display device 700 in FIG. 28 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 28, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 27 and FIG. 28, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. At this time, monochrome image display may be performed without the coloring layer 736, or color display may be performed using the coloring layer 736.

As a method for driving the liquid crystal element, a time-division display method (also referred to as a field-sequential driving method) in which color display is performed on the basis of a successive additive color mixing method may be employed. In that case, a structure in which the coloring layer 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

FIG. 29 shows an example of employing the liquid crystal element 775 of a horizontal electric field mode (e.g., an FFS mode), which is different from that in the display device 700 in FIG. 28.

The display device 700 shown in FIG. 29 includes the transistor 750, the transistor 752, the liquid crystal element 775, and the like between the first substrate 701 and the second substrate 705. The first substrate 701 and the second substrate 705 are attached to each other with a sealing layer 732.

The liquid crystal element 775 includes a conductive layer 714, the liquid crystal layer 776, and a conductive layer 713. The conductive layer 713 is provided over the first substrate 701. One or more insulating layers are provided over the conductive layer 713, and the conductive layer 714 is provided over the insulating layer(s). Furthermore, the liquid crystal layer 776 is positioned between the conductive layer 714 and the second substrate 705. The conductive layer 713 is electrically connected to a wiring 728 and functions as a common electrode. The conductive layer 714 is electrically connected to the transistor 750 and serves as a pixel electrode. A common potential is applied to the wiring 728.

The conductive layer 714 has a comb-like top surface shape or a top surface shape including a slit. In the liquid crystal element 775, the alignment state of the liquid crystal layer 776 is controlled by an electric field generated between the conductive layer 714 and the conductive layer 713.

The capacitor 790 functioning as a storage capacitor is formed of a stacked-layer structure of the conductive layer 714, the conductive layer 713, and one or more insulating layers sandwiched therebetween. Thus, another capacitor need not be provided, and thus the aperture ratio can be increased.

A material that transmits visible light or a material that reflects visible light can be used for the conductive layer 714 and the conductive layer 713. As a light-transmitting material, for example, an oxide material containing indium, zinc, tin, or the like is preferably used. As a reflective material, for example, a material containing aluminum, silver, or the like is preferably used.

When a reflective material is used for one or both of the conductive layer 714 and the conductive layer 713, the display device 700 is a reflective liquid crystal display device. Meanwhile, when a light-transmitting material is used for both of the conductive layer 714 and the conductive layer 713, the display device 700 is a transmissive liquid crystal display device. For a reflective liquid crystal display device, a polarizing plate is provided on the viewer side. By contrast, for a transmissive liquid crystal display device, a pair of polarizing plates is provided such that the liquid crystal element is placed therebetween.

FIG. 29 shows an example of a transmissive liquid crystal display device. A polarizing plate 755 and a light source 757 are provided on the outer side of the first substrate 701, and a polarizing plate 756 is provided on the outer side of the second substrate 705. The light source 757 functions as a backlight.

The light-blocking layer 738 and the coloring layer 736 are provided on a surface of the second substrate 705 that is on the first substrate 701 side. The insulating layer 734 functioning as a planarization layer is provided to cover the light-blocking layer 738 and the coloring layer 736. A spacer 727 is provided on a surface of the insulating layer 734 that is on the first substrate 701 side.

The liquid crystal layer 776 is positioned between an alignment film 725 covering the conductive layer 714 and an alignment film 726 covering the insulating layer 734. Note that the alignment film 725 and the alignment film 726 are not necessarily provided when not needed.

Although not illustrated in FIG. 29, an optical member (optical film) such as a retardation film or an anti-reflection film, a protective film, an antifouling film, or the like can be provided on the outer side of the second substrate 705 as appropriate. Examples of the anti-reflection film include an AG (Anti Glare) film and an AR (Anti Reflection) film.

The display device 700 shown in FIG. 29 has a structure in which an organic insulating film functioning as a planarization layer is not provided on a surface on which the conductive layer 714 functioning as a pixel electrode or the conductive layer 713 functioning as a common electrode is formed. Furthermore, bottom-gate transistors, which have a relatively small number of fabrication steps, are used as the transistor 750 and the like included in the display device 700. With such a structure, the manufacturing cost can be reduced and the manufacturing yield can be increased, so that a display device having high reliability can be provided at low cost.

Structure Example of Display Device Using Light-Emitting Element

The display device 700 shown in FIG. 30 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 shown in FIG. 30, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring layer 736 is provided in a position overlapping with the light-emitting element 782, and the light-blocking layer 738 is provided in the lead wiring portion 711, the source driver circuit portion 704, and a position overlapping with the insulating film 730. The coloring layer 736 and the light-blocking layer 738 are covered with the insulating layer 734. A space between the light-emitting element 782 and the insulating layer 734 is filled with the sealing layer 732. Note that a structure in which the coloring layer 736 is not provided may be employed when the EL layer 786 is formed into an island shape for each pixel or into a stripe shape for each pixel column, i.e., the EL layer 786 is formed by separate coloring.

FIG. 31 shows a structure of a display device suitably applicable to a flexible display. FIG. 31 is a cross-sectional view along the dashed-dotted line S-T in the display device 700A in FIG. 26B.

The display device 700A in FIG. 31 has a structure in which a support substrate 745, a bonding layer 742, the resin layer 743, and an insulating layer 744 are stacked instead of the first substrate 701 in FIG. 30. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 31 includes a protective layer 740 instead of the second substrate 705 in FIG. 30. The protective layer 740 is attached to the sealing layer 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided in an island shape over the insulating film 730 and the conductive layer 772. The EL layers 786 are formed separately so that respective subpixels emit light of different colors, whereby color display can be performed without use of the coloring layer 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 31 shows the region P2 that can be bent. The region P2 includes a portion where the support substrate 745, the bonding layer 742, and the inorganic insulating film such as the insulating layer 744 are not provided. In the region P2, a resin layer 746 is provided to cover the connection electrode 760. When a structure is employed in which an inorganic insulating film is not provided in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

Structure Example of Display Device Provided with Input Device

An input device may be provided in the display device 700 shown in FIG. 27 to FIG. 30 or the display device 700A shown in FIG. 31. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is provided on an inner side than a pair of substrates, what is called an on-cell touch panel in which an input device is formed over the display device 700, and what is called an out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 4

In this embodiment, a display device that includes the semiconductor device of one embodiment of the present invention is described with reference to FIG. 32A to FIG. 32C.

Figure 32A:
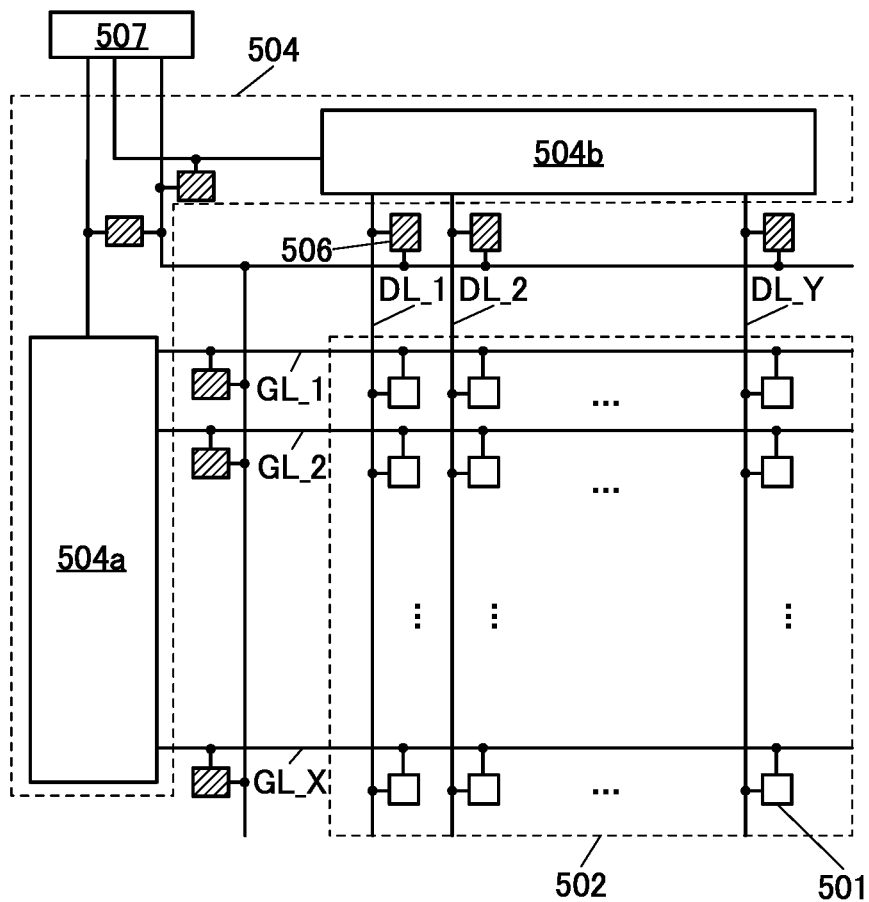
FIG. 32A is a block diagram of a display device.

A display device shown in FIG. 32A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 arranged in X rows and Y columns (X and Y each independently represent a natural number of 2 or more). Each of the pixel circuits 501 includes a circuit for driving a display element.

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 shown in FIG. 32A is connected to a variety of wirings such as the gate lines GL_1 to GL_X that are wirings between the gate driver 504a and the pixel circuits 501 and the data lines DL_1 to DL_Y that are wirings between the source driver 504b and the pixel circuits 501, for example. Note that the protection circuits 506 are hatched in FIG. 32A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 32B:
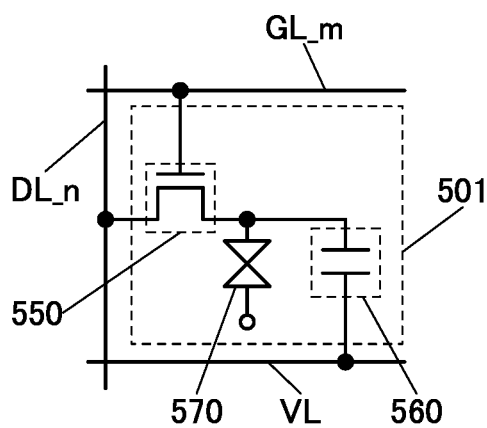
FIG. 32B and FIG. 32C are circuit diagrams of the display device.
Figure 32C:
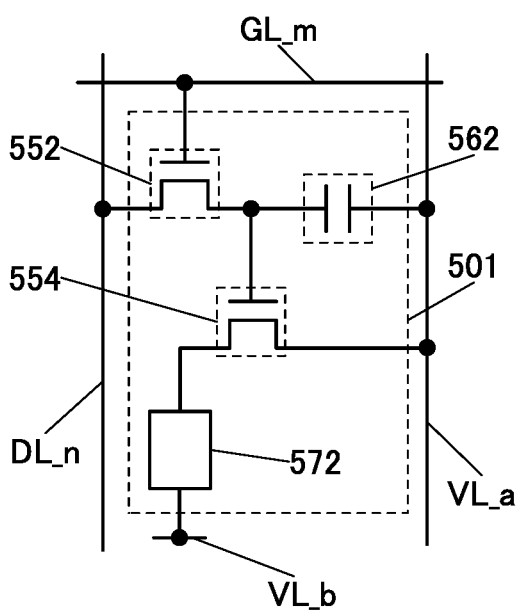

The plurality of pixel circuits 501 shown in FIG. 32A can have a structure shown in FIG. 32B or FIG. 32C, for example.

The pixel circuit 501 shown in FIG. 32B includes a liquid crystal element 570, a transistor 550, and a capacitor 560.

The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 shown in FIG. 32C includes transistors 552 and 554, a capacitor 562, and a light-emitting element 572. The data line DL_n, the gate line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 5

A pixel circuit including a memory for correcting gray levels displayed by pixels and a display device including the pixel circuit are described below. The transistor described in Embodiment 2 can be applied to transistors used in the pixel circuit shown below.

<Circuit Structure>

Figure 33A:
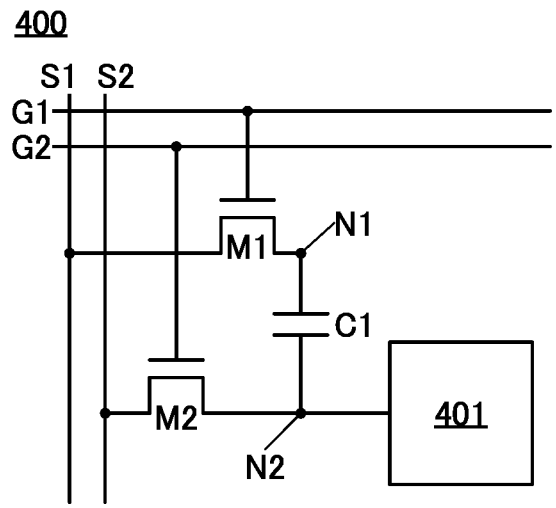
FIG. 33A, FIG. 33C, and FIG. 33D are circuit diagrams of a display device.

FIG. 33A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 2, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

<Driving Method Example>

Figure 33B:
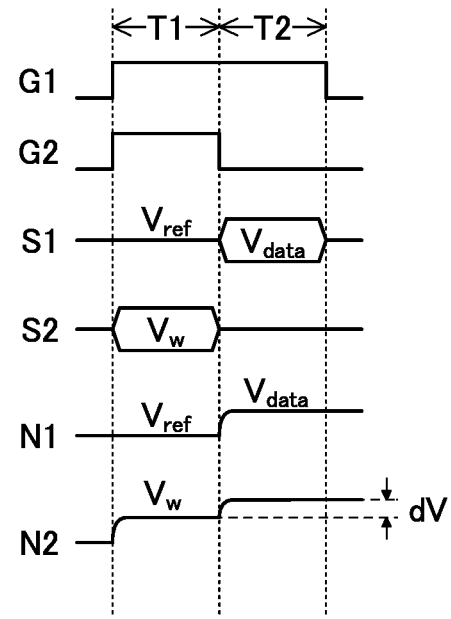
FIG. 33B is a timing chart of the display device.

Next, an example of a method of operating the pixel circuit 400 is described with reference to FIG. 33B. FIG. 33B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 33B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into floating.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 33B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

[Example Using Liquid Crystal Element]

Figure 33C:
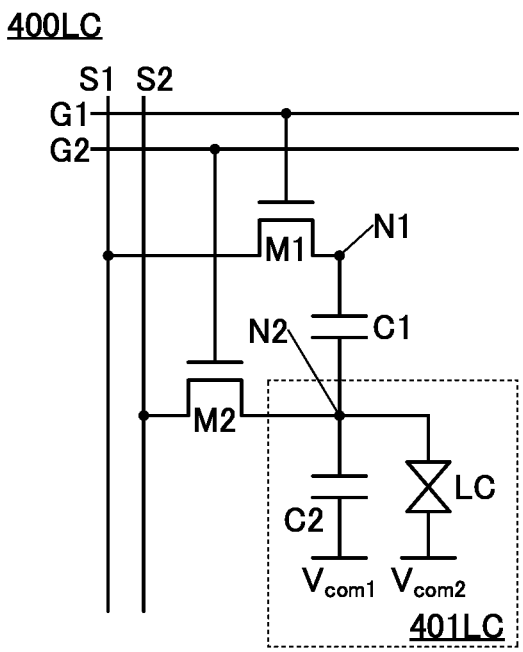

A pixel circuit 400LC shown in FIG. 33C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

Figure 33D:
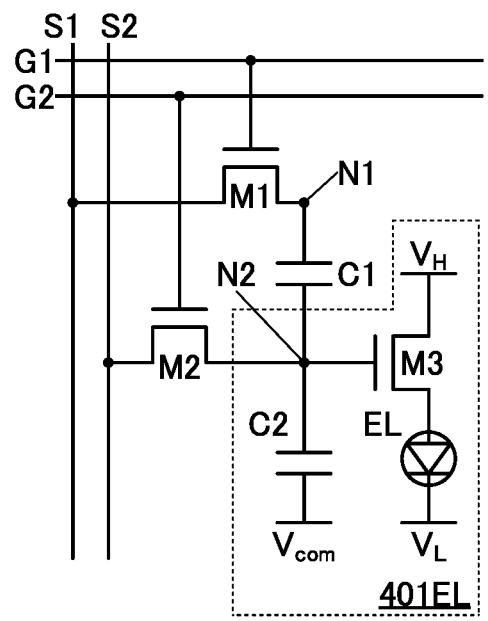

A pixel circuit 400EL shown in FIG. 33D includes a circuit 401EL. The circuit 401EL includes a light-emitting element EL, a transistor M3, and the capacitor C2.

In the transistor M3, a gate is connected to the node N2 and the one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential VH and the potential $V_L$ can be appropriately changed.

In the pixel circuit 400EL, a large amount of current can flow through the light-emitting element EL when a high potential is applied to the gate of the transistor M3, which enables HDR display, for example. Moreover, variation in the electrical characteristics of the transistor M3 and the light-emitting element EL can be corrected by supply of a correction signal to the wiring S1 or the wiring S2.

Note that the structure is not limited to the circuits shown in FIG. 33C and FIG. 33D, and a structure to which a transistor, a capacitor, or the like is further added may be employed.

At least part of this embodiment can be implemented in combination with any of the other embodiments described in this specification as appropriate.

Embodiment 6

In this embodiment, a display module that can be fabricated using one embodiment of the present invention is described.

Figure 34A:
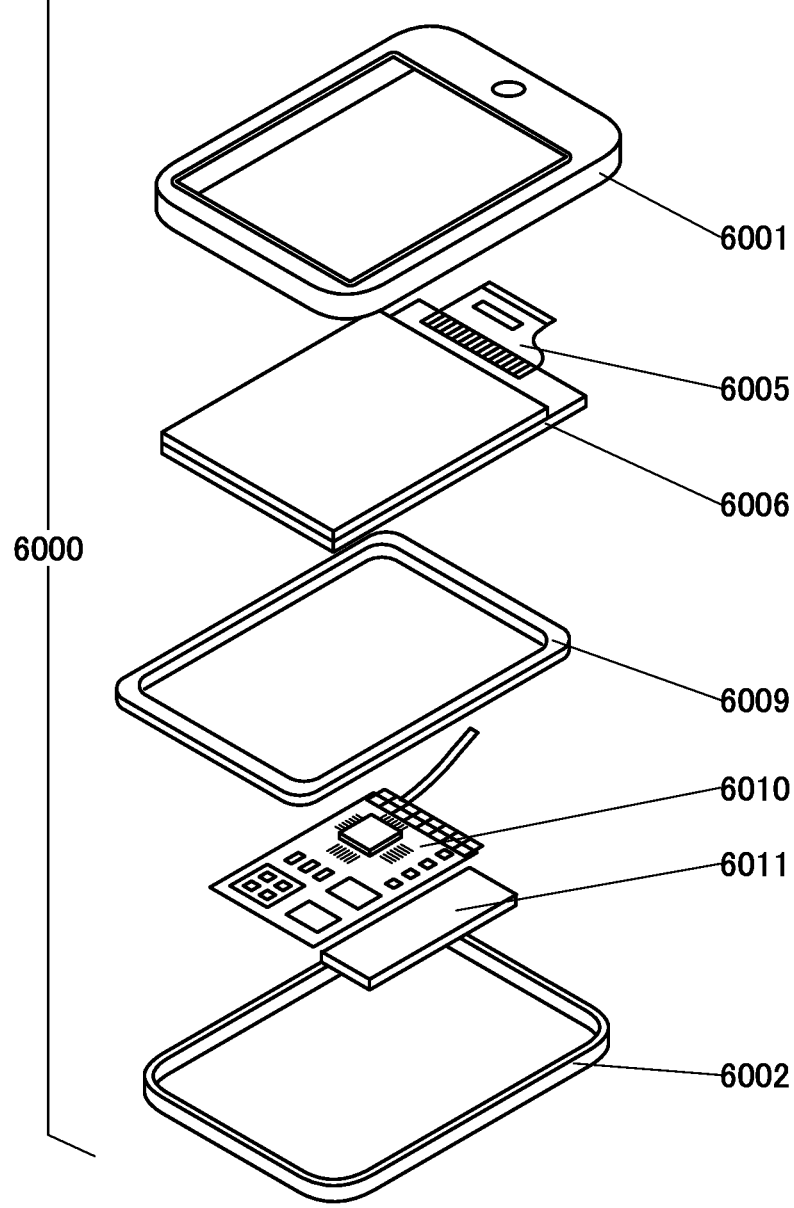
FIG. 34A and FIG. 34B show a structure example of a display module.

In a display module 6000 shown in FIG. 34A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The power supply may be from the battery 6011.

Figure 34B:
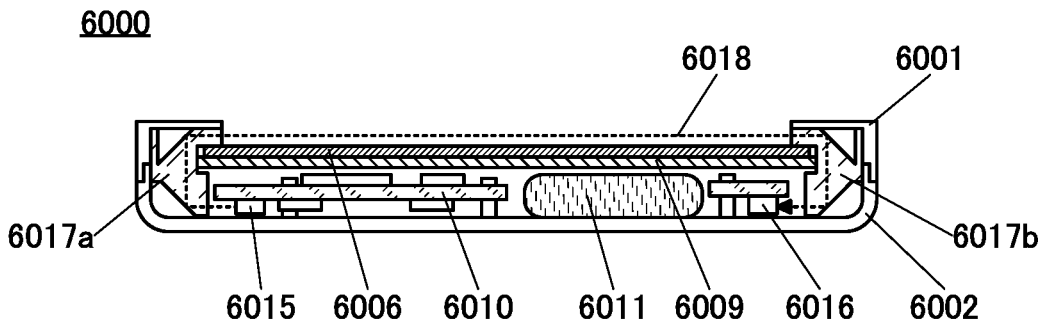

FIG. 34B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 7

In this embodiment, examples of an electronic device for which the display device of one embodiment of the present invention can be used are described.

Figure 35A:
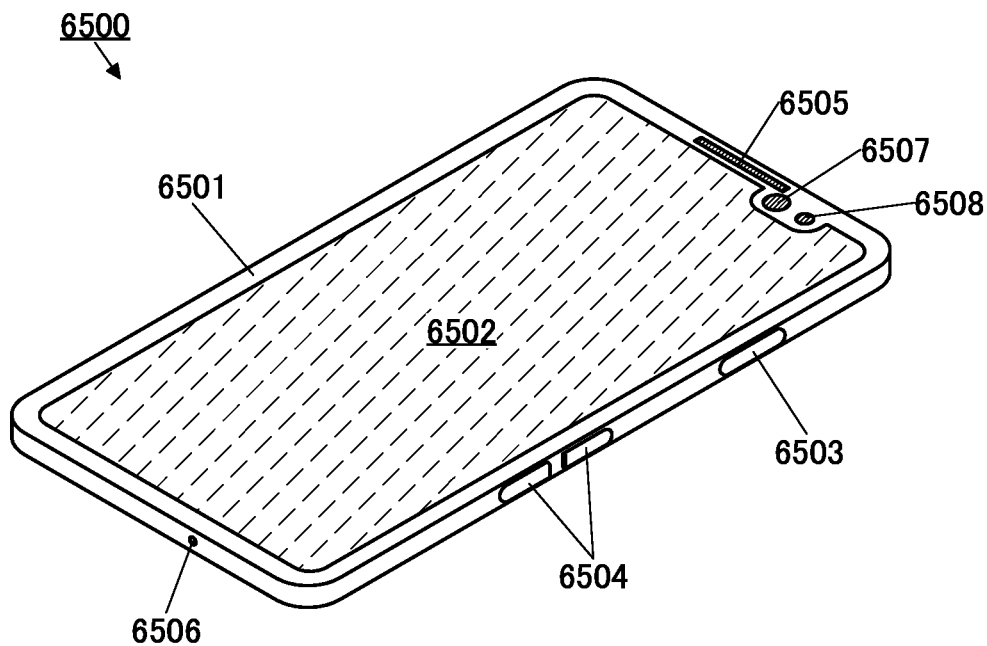
FIG. 35A and FIG. 35B show a structure example of an electronic device.

An electronic device 6500 shown in FIG. 35A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 35B:
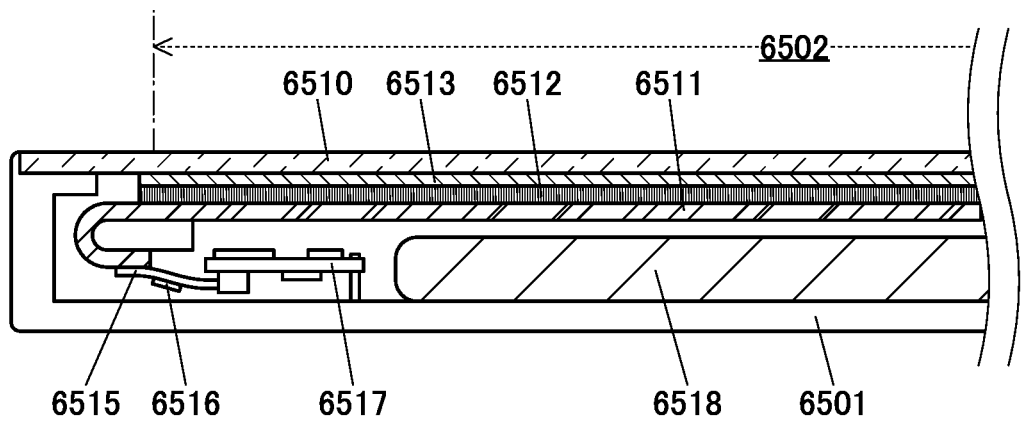

FIG. 35B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 8

In this embodiment, electronic devices each including a display device fabricated using one embodiment of the present invention are described.

Electronic devices exemplified below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

Figure 36A:
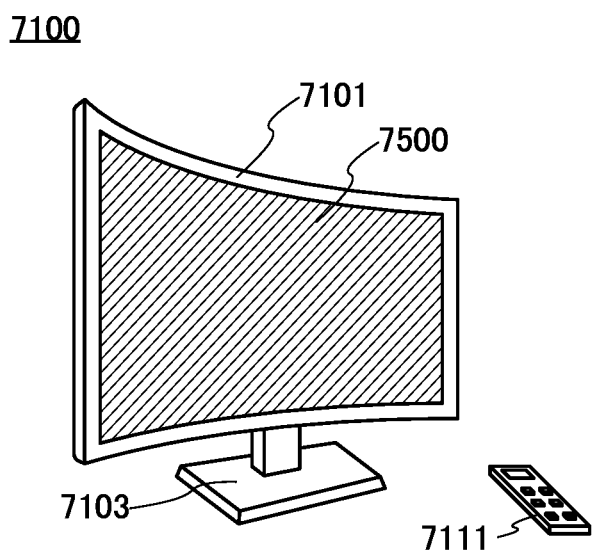
FIG. 36A, FIG. 36B, FIG. 36C, and FIG. 36D show structure examples of electronic devices.

FIG. 36A shows an example of a television device. In a television device 7100, a display portion 7500 is incorporated in a housing 7101. Here, a structure in which the housing 7101 is supported by a stand 7103 is shown.

Operation of the television device 7100 shown in FIG. 36A can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 36B:
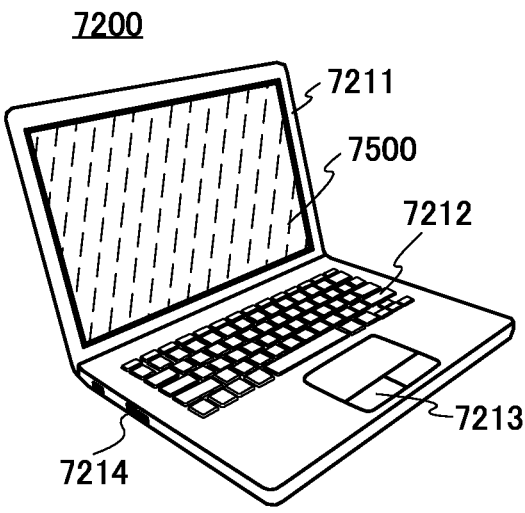

FIG. 36B shows a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 36C:
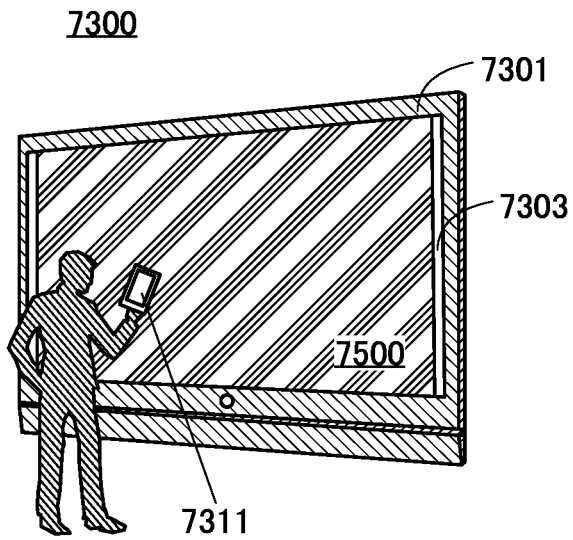
Figure 36D:
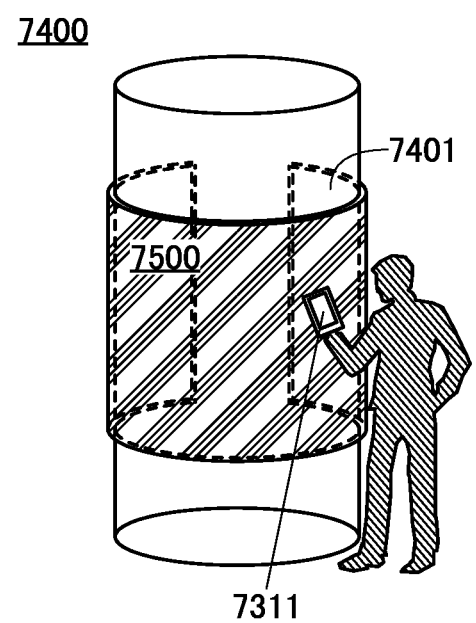

FIG. 36C and FIG. 36D show examples of digital signage.

Digital signage 7300 shown in FIG. 36C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 36D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, and guidance information on a commercial facility.

As shown in FIG. 36C and FIG. 36D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with use of the information terminal 7311 as an operation means (controller). Thus, an unspecified number of users can join in and enjoy the game concurrently.

The display device of one embodiment of the present invention can be used for the display portion 7500 in FIG. 36A to FIG. 36D.

The electronic devices of this embodiment each include a display portion; however, one embodiment of the present invention can also be used in an electronic device without a display portion.

At least part of this embodiment can be implemented in combination with the other embodiments described in this specification as appropriate.

REFERENCE NUMERALS 10, 10A, 10B, 10C: transistor, 11, 13, 15, 17: range, 100, 100A, 100B, 100C, 100D, 100E, 100F, 100G, 100H: transistor, 102: substrate, 104: conductive layer, 106, 106a, 106a1, 106a2, 106a3, 106b: insulating layer, 108, 108a, 108b: semiconductor layer, 108af, 108bf: metal oxide film, 112: gate electrode, 112a, 112b, 113, 113a, 113b, 113c: conductive layer, 113af, 113bf, 113cf: conductive film, 114, 116, 118: insulating layer, 120, 120a, 120b: conductive layer, 130: plasma, 140: resist mask, 142a, 142b, 142c: opening, 150: metal oxide layer

The invention claimed is:

1. A semiconductor device comprising:
a first conductive layer;
a first insulating layer;
a semiconductor layer;
a pair of second conductive layers; and
a second insulating layer,
wherein the first insulating layer is in contact with a top surface of the first conductive layer,
wherein the semiconductor layer is in contact with a top surface of the first insulating layer,
wherein the pair of second conductive layers are in contact with a top surface of the semiconductor layer,
wherein the pair of second conductive layers are apart from each other with a space therebetween,
wherein the space overlaps with the first conductive layer,
wherein the second conductive layer has a stacked-layer structure of a first conductive film, a second conductive film over the first conductive film, and a third conductive film over the second conductive film,
wherein the second insulating layer is in contact with a top surface of the semiconductor layer, a top surface of the first conductive film, a side surface of the first conductive film, a top surface of the third conductive film, and a side surface of the third conductive film,
wherein the semiconductor layer comprises indium and oxygen,
wherein the semiconductor layer has a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight line in a ternary diagram showing atomic ratios of indium to an element M and zinc, and
wherein the element M is one or more of gallium, aluminum, yttrium, and tin.

2. A semiconductor device comprising:
a first conductive layer;
a first insulating layer;
a semiconductor layer;
a pair of second conductive layers; and
a second insulating layer, wherein the first insulating layer is in contact with a top surface of the first conductive layer, wherein the semiconductor layer is in contact with a top surface of the first insulating layer, wherein the pair of second conductive layers are in contact with a top surface of the semiconductor layer, wherein the pair of second conductive layers are apart from each other with a space therebetween, wherein the space overlaps with the first conductive layer, wherein the second conductive layer has a stacked-layer structure of a first conductive film, a second conductive film over the first conductive film, and a third conductive film over the second conductive film, wherein the second insulating layer is in contact with a top surface of the semiconductor layer, a top surface of the first conductive film, a side surface of the first conductive film, a top surface of the third conductive film, and a side surface of the third conductive film, wherein the semiconductor layer comprises indium, zinc, and oxygen, wherein the semiconductor layer has a composition falling within a range obtained by connecting first coordinates (44:11:10), second coordinates (4:1:4), third coordinates (1:0:1), fourth coordinates (11:0:2), and the first coordinates in this order with a straight line in a ternary diagram showing atomic ratios of indium to an element M and zinc, and wherein the element M is one or more of gallium, aluminum, yttrium, and tin.

3. The semiconductor device according to claim 1,
wherein the semiconductor layer has a stacked-layer structure of a first metal oxide film and a second metal oxide film over the first metal oxide film, and
wherein the first metal oxide film has lower crystallinity than the second metal oxide film.

4. The semiconductor device according to claim 1,
wherein the second conductive film comprises copper, silver, gold, or aluminum,
wherein each of the first conductive film and the third conductive film comprises an element different from an element in the second conductive film, and
wherein the first conductive film and the third conductive film each independently comprise any of titanium, tungsten, molybdenum, chromium, tantalum, zinc, indium, platinum, and ruthenium.

5. The semiconductor device according to claim 1, further comprising:
wherein the second insulating layer comprises oxygen.

6. The semiconductor device according to claim 1, further comprising:
a third insulating layer,
wherein the third insulating layer is in contact with a top surface of the second insulating layer, and
wherein the third insulating layer comprises nitrogen.

7. The semiconductor device according to claim 2,
wherein the semiconductor layer has a stacked-layer structure of a first metal oxide film and a second metal oxide film over the first metal oxide film, and
wherein the first metal oxide film has lower crystallinity than the second metal oxide film.

8. The semiconductor device according to claim 2,
wherein the second conductive film comprises copper, silver, gold, or aluminum,
wherein each of the first conductive film and the third conductive film comprises an element different from an element in the second conductive film, and
wherein the first conductive film and the third conductive film each independently comprise any of titanium, tungsten, molybdenum, chromium, tantalum, zinc, indium, platinum, and ruthenium.

9. The semiconductor device according to claim 2, further comprising:
wherein the second insulating layer comprises oxygen.

10. The semiconductor device according to claim 2, further comprising:
a third insulating layer,
wherein the third insulating layer is in contact with a top surface of the second insulating layer, and
wherein the third insulating layer comprises nitrogen.

11. The semiconductor device according to claim 10,
wherein the second insulating layer comprises silicon oxide, and
wherein the third insulating layer comprises silicon nitride.

* * * * *

UNITED STATES PATENT AND TRADEMARK OFFICE
CERTIFICATE OF CORRECTION

| | | |
|---|---|---|
| PATENT NO. | : 12,136,674 B2 | Page 1 of 1 |
| APPLICATION NO. | : 17/433728 | |
| DATED | : November 5, 2024 | |
| INVENTOR(S) | : Shunpei Yamazaki et al. | |

It is certified that error appears in the above-identified patent and that said Letters Patent is hereby corrected as shown below:

In the Specification

Column 28, Lines 58-59, "insulating layer 114, a first deposition gas a mixed gas containing" should read --insulating layer 114, a mixed gas containing--

Signed and Sealed this
Twenty-fifth Day of February, 2025

Coke Morgan Stewart
*Acting Director of the United States Patent and Trademark Office*